United States Patent
Park et al.

(10) Patent No.: US 12,451,066 B2
(45) Date of Patent: Oct. 21, 2025

(54) DISPLAY DEVICE AND DISPLAY PANEL

(71) Applicant: LG DISPLAY CO., LTD., Seoul (KR)

(72) Inventors: Jaesung Park, Seoul (KR); SooHong Choi, Busan (KR)

(73) Assignee: LG Display Co., Ltd. (KR)

( * ) Notice: Subject to any disclaimer, the term of this patent is extended or adjusted under 35 U.S.C. 154(b) by 0 days.

(21) Appl. No.: 18/433,794

(22) Filed: Feb. 6, 2024

(65) Prior Publication Data
US 2024/0290264 A1   Aug. 29, 2024

(30) Foreign Application Priority Data

Feb. 28, 2023 (KR) ........................ 10-2023-0027326

(51) Int. Cl.
| | |
|---|---|
| *G09G 3/3233* | (2016.01) |
| *H10K 50/88* | (2023.01) |
| *H10K 59/122* | (2023.01) |
| *H10K 59/131* | (2023.01) |
| *H10K 59/80* | (2023.01) |

(52) U.S. Cl.
CPC .......... *G09G 3/3233* (2013.01); *H10K 50/88* (2023.02); *H10K 59/131* (2023.02); *H10K 59/80521* (2023.02); *G09G 2300/0426* (2013.01); *G09G 2310/062* (2013.01); *G09G 2310/08* (2013.01); *G09G 2330/04* (2013.01); *H10K 59/122* (2023.02)

(58) Field of Classification Search
None
See application file for complete search history.

(56) References Cited

U.S. PATENT DOCUMENTS

| | | | |
|---|---|---|---|
| 2010/0066383 A1* | 3/2010 | Chung | G09G 3/006 |
| | | | 324/760.01 |
| 2011/0102389 A1* | 5/2011 | Park | G06F 3/0412 |
| | | | 345/205 |
| 2017/0047018 A1* | 2/2017 | Park | G09G 3/3266 |
| 2021/0304660 A1* | 9/2021 | Maruyama | G09G 3/3266 |
| 2022/0208801 A1* | 6/2022 | Itoh | G09G 3/3648 |

FOREIGN PATENT DOCUMENTS

| | | | | |
|---|---|---|---|---|
| CN | 104332122 A | * | 2/2015 | ............... G09G 3/36 |
| CN | 104238224 B | * | 3/2017 | ........... G09G 3/2096 |
| CN | 113053288 A | * | 6/2021 | ............... G09G 3/32 |
| WO | WO-2017000390 A1 | * | 1/2017 | ............. G09G 3/006 |

* cited by examiner

*Primary Examiner* — Duane N Taylor, Jr.
(74) *Attorney, Agent, or Firm* — Fish & Richardson P.C.

(57) ABSTRACT

The present disclosure relates to a display panel and a display device that have a pad structure including a defect detection pad and configured to be suitable for a structure in which a gate driving panel circuit is disposed. The display panel and the display device provide advantages of detecting in advance a possibility that a defect accident may occur in the display panel and preventing such a defect accident in the display panel.

22 Claims, 41 Drawing Sheets

Vsen Wave

DISPLAY DEVICE AND DISPLAY PANEL

CROSS-REFERENCE TO RELATED APPLICATIONS

This application claims the priority benefit of Republic of Korea Patent Application No. 10-2023-0027326, filed on Feb. 28, 2023 in the Korean Intellectual Property Office, which is incorporated herein by reference in its entirety.

TECHNICAL FIELD

The present disclosure relates to electronic devices, and more specifically, to a display device and a display panel.

BACKGROUND

A display device may include a display panel in which a plurality of data lines and a plurality of gate lines are disposed, a data driving circuit for outputting data signals to the plurality of data lines, a gate driving circuit for outputting gate signals to the plurality of gate lines, and the like.

In order for images to be displayed normally on the display device, gate signals are supplied through the plurality of gate lines. That is, to present images normally, it is necessary for gate driving to be performed normally. However, abnormal gate driving may degrade image quality.

SUMMARY

One or more aspects of the present disclosure may provide a display panel in which a circuit for gate driving ("gate driving panel circuit") is disposed using a gate-in-panel (GIP) technique, and a display device including the display panel.

One or more aspects of the present disclosure may provide a display panel and a display device that are capable of detecting in advance a possibility that a defect accident may occur in the display panel and preventing such a defect accident in the display panel.

One or more aspects of the present disclosure may provide a display panel and a display device that have a pad structure including a defect detection pad and configured to be suitable for a structure in which a gate driving panel circuit is disposed on a substrate of the display panel.

One or more aspects of the present disclosure may provide a display panel and a display device that have a wiring structure for stably supplying various types of signals or power to a gate driving panel circuit disposed in the display panel.

According to aspects of the present disclosure, a display device may be provided that includes a substrate, a gate driving panel circuit, a plurality of clock signal lines, a defect detection line, a plurality of clock pads, and a first defect detection pad.

The substrate may include a display area in which images may be displayed and a non-display area different from the display area. The non-display area may include a first gate bezel area located on a first side of the display area and a first pad area adjacent to the first gate bezel area.

The gate driving panel circuit may be disposed on the substrate, and for example, disposed in a gate driving panel circuit area included in the first gate bezel area.

The plurality of clock signal lines may be disposed on the substrate. For example, the plurality of clock signal lines may be disposed in a clock signal line area located further outwardly than the gate driving panel circuit area in the first gate bezel area, and may deliver a plurality of clock signals to the gate driving panel circuit.

The defect detection line may be disposed in the non-display area of the substrate, and for example, be disposed further outwardly than an outmost clock signal line among the plurality of clock signal lines.

The plurality of clock pads may be disposed in the first pad area of the substrate and may be electrically connected to the plurality of clock signal lines.

The first defect detection pad may be disposed in the first pad area of the substrate. For example, the first defect detection pad may be disposed further outwardly than an outmost clock pad among the plurality of clock pads, and be electrically connected to a first end among both ends of the defect detection line.

According to aspects of the present disclosure, a display panel may be provided that includes a substrate including a display area in which images may be displayed, and a non-display area that is different from the display area and includes a first gate bezel area located on a first side of the display area and a first pad area adjacent to the first gate bezel area, a gate driving panel circuit disposed in a gate driving panel circuit area included in the first gate bezel area, a defect detection line located further outwardly than the gate driving panel circuit area in the first gate bezel area, and a first defect detection pad disposed in the first pad area and electrically connected to a first end among both ends of the defect detection line.

According to one or more aspects of the present disclosure, a display panel may be provided in which a gate driving panel circuit is disposed using the GIP technique, and a display device including the display panel may be provided.

According to one or more aspects of the present disclosure, a display panel and a display device may be provided to detect a possibility that a defect accident may occur in the display panel and prevent such a defect accident in the display panel.

According to one or more aspects of the present disclosure, a display panel and a display device may be provided that have a pad structure including a defect detection pad and configured to be suitable for a structure in which a gate driving panel circuit is disposed on a substrate of the display panel.

According to one or more aspects of the present disclosure, a display panel and a display device may be provided that have a wiring structure for stably supplying various types of signals or power to a gate driving panel circuit disposed in the display panel.

According to one or more aspects of the present disclosure, since the display panel and the display device are designed to include a gate driving panel circuit disposed on a substrate of the display panel and formed during the manufacturing process of the display panel or the display device, advantage of enabling process optimization of the display panel and the display device may be provided.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings.

DETAILED DESCRIPTION

Figure 1:
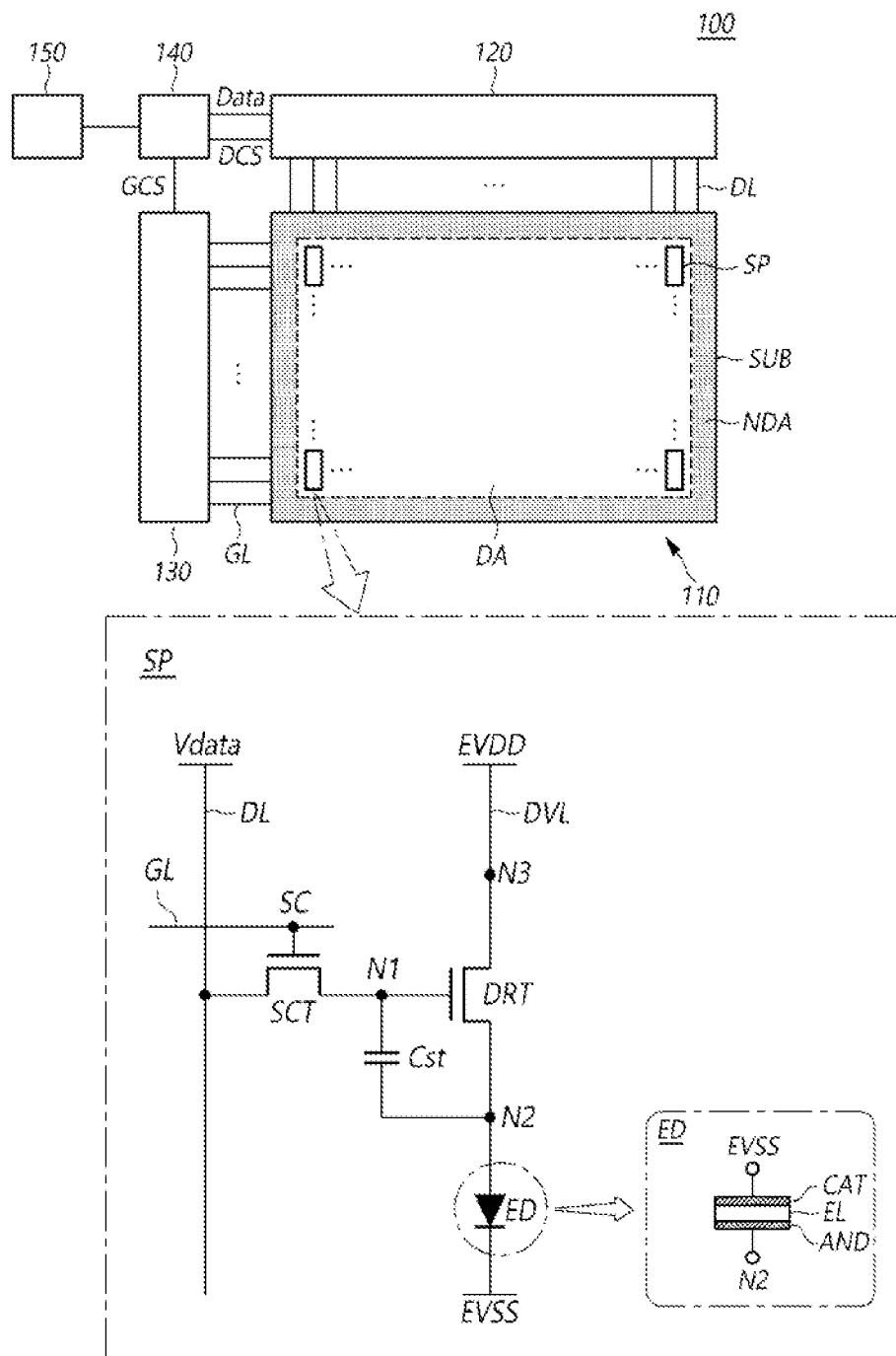
FIG. 1 illustrates an example system configuration of a display device according to aspects of the present disclosure.

Reference will now be made in detail to aspects of the present disclosure, examples of which may be illustrated in the accompanying drawings. In the following description, the structures, aspects, implementations, methods and operations described herein are not limited to the specific example or examples set forth herein and may be changed as is known in the art, unless otherwise specified. Like reference numerals designate like elements throughout, unless otherwise specified. Names of the respective elements used in the following explanations are selected only for convenience of writing the specification and may thus be different from those used in actual products. Advantages and features of the present disclosure, and implementation methods thereof will be clarified through following example aspects described with reference to the accompanying drawings. The present disclosure may, however, be embodied in different forms and should not be construed as limited to the example aspects set forth herein. Rather, these example aspects are provided so that this disclosure may be sufficiently thorough and complete to assist those skilled in the art to fully understand the scope of the present disclosure. Further, the protected scope of the present disclosure is defined by claims and their equivalents. In the following description, where the detailed description of the relevant known function or configuration may unnecessarily obscure aspects of the present disclosure, a detailed description of such known function or configuration may be omitted. The shapes, sizes, ratios, angles, numbers, and the like, which are illustrated in the drawings to describe various example aspects of the present disclosure, are merely given by way of example. Therefore, the present disclosure is not limited to the illustrations in the drawings. Where the terms "comprise," "have," "include," "contain," "constitute," "make up of," "formed of," and the like are used, one or more other elements may be added unless the term, such as "only," is used. An element described in the singular form is intended to include a plurality of elements, and vice versa, unless the context clearly indicates otherwise.

Although the terms "first," "second," "A", "B", "(a)", or "(b)", and the like may be used herein to describe various elements, these elements should not be interpreted to be limited by these terms as they are not used to define a particular order or precedence. These terms are used only to distinguish one element from another; thus, related elements should not be interpreted to be limited by these terms as they are not used to define a particular order or precedence. Further, the expression of a first element, a second elements "and/or" a third element should be understood as one of the first, second and third elements or as any or all combinations of the first, second and third elements. By way of example, A, B and/or C may refer to only A, only B, or only C; any or some combination of A, B, and C; or all of A, B, and C.

For the expression that an element or layer is "connected," "coupled," or "adhered" to another element or layer, the element or layer may not only be directly connected, coupled, or adhered to another element or layer, but also be indirectly connected, coupled, or adhered to another element or layer with one or more intervening elements or layers "disposed" or "interposed" between the elements or layers, unless otherwise specified. Further, the another element may be included in one or more of the two or more elements connected, combined, coupled, or contacted (to) one another.

For the expression that an element or layer "contacts," "overlaps," or the like with another element or layer, the element or layer may not only directly contact, overlap, or the like with another element or layer, but also indirectly contact, overlap, or the like with another element or layer with one or more intervening elements or layers "disposed" or "interposed" between the elements or layers, unless otherwise specified.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom," "downward," "upward," "upper," "lower," and the like refer to an arbitrary frame of reference. In describing a temporal relationship, when the temporal order is described as, for example, "after," "subsequent," "next," or "before," a case which is not continuous may be included unless a more limiting term, such as "just," "immediate(ly)," or "direct(ly)," is used. In construing an element, the element is to be construed as including an error or tolerance range even where no explicit description of such an error or tolerance range is provided. Further, the term "may" fully encompasses all the meanings of the term "can." The term "at least one" should be understood as including any or all combinations of one or more of the associated listed items. For example, the meaning of "at least one of a first element, a second element, and a third element" encompasses the combination of all three listed elements, combinations of any two of the three elements, as well as each individual element, the first element, the second element, and the third element. The expression of a first element, a second elements "and/or" a third element should be understood as one of the first, second and third elements or as any or all combinations of the first, second and third elements. By way of example, A, B and/or C may refer to only A, only B, or only C; any or some combination of A, B, and C; or all of A, B, and C. Hereinafter, various example aspects of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings.

Hereinafter, various aspects of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings.

FIG. 1 illustrates an example system configuration of a display device 100 according to aspects of the present disclosure.

Referring to FIG. 1, in one or more aspects, the display device 100 according to aspects of the present disclosure may include a display panel 110 including a plurality of subpixels SP and at least one driving circuit for driving the plurality of subpixels SP included in the display panel 110.

The at least one driving circuit may include a data driving circuit 120, a gate driving circuit 130, and the like, and further include a controller 140 for controlling the data driving circuit 120 and the gate driving circuit 130.

The display panel 110 may include a substrate SUB, and signal lines such as a plurality of data lines DL, a plurality of gate lines GL, and the like disposed over the substrate SUB. The plurality of data lines DL and the plurality of gate lines GL may be connected to the plurality of subpixels SP.

The display panel 110 may include a display area DA in which one or more images may be displayed and a non-display area NDA in which an image is not displayed. A plurality of subpixels SP for displaying images may be disposed in the display area DA of the display panel 110. Driving circuits (e.g., 120, 130, and 140) may be electrically connected to, or be mounted in, the non-display area NDA of the display panel 110. Further, a pad portion including one or more pads to which one or more integrated circuits or one or more printed circuits are connected may be disposed in the non-display area NDA.

The data driving circuit 120 may be a circuit for driving the plurality of data lines DL, and may supply data signals to the plurality of data lines DL.

The gate driving circuit 130 may be a circuit for driving the plurality of gate lines GL, and may supply gate signals to the plurality of gate lines GL.

The controller 140 may supply a data control signal DCS to the data driving circuit 120 to control operation timing of the data driving circuit 120. The controller 140 may supply a gate control signal GCS to the gate driving circuit 130 to control operation timing of the gate driving circuit 130.

The controller 140 may start to scan pixels according to respective timings set in each frame, convert image data inputted from external devices or external image providing sources (e.g. host systems) in a data signal form readable by the data driving circuit 120 and then supply image data Data resulting from the converting to the data driving circuit 120, and in line with the scan of at least one pixel (or at least one pixel array) among the pixels, control the loading of the image data to the at least one pixel at a time at which the illumination of at least one corresponding light emitting element of the at least one pixel is intended.

The controller 140 may receive, in addition to input image data, several types of timing signals including a vertical synchronous signal VSYNC, a horizontal synchronous signal HSYNC, an input data enable signal DE, a clock signal CLK, and the like from external devices, networks, or systems (e.g., a host system 150).

To control the data driving circuit 120 and the gate driving circuit 130, the controller 140 may receive one or more of the timing signals such as the vertical synchronization signal VSYNC, the horizontal synchronization signal HSYNC, the input data enable signal DE, the clock signal CLK, and the like, generate several types of control signals DCS and GCS, and output the generated signals to the data driving circuit 120 and the gate driving circuit 130.

For example, to control the gate driving circuit 130, the controller 140 may output several types of gate control signals GCS including a gate start pulse GSP, a gate shift clock GSC, a gate output enable signal GOE, and the like.

Further, to control the data driving circuit 120, the controller 140 may output several types of data control signals DCS including a source start pulse SSP, a source sampling clock SSC, a source output enable (SOE) signal, and the like.

The controller 140 may be implemented in a separate component from the data driving circuit 120, or integrated with the data driving circuit 120, so that the controller 140 and the data driving circuit 120 may be implemented in a single integrated circuit.

The data driving circuit 120 may drive a plurality of data lines DL by supplying data voltages corresponding to image data Data to the plurality of data lines DL. The data driving circuit 120 may also be referred to as a source driving circuit.

The data driving circuit 120 may include, for example, one or more source driver integrated circuits SDIC.

Each source driver integrated circuit SDIC may include a shift register, a latch circuit, a digital-to-analog converter DAC, an output buffer, and the like. In one or more aspects, each source driver integrated circuit SDIC may further include an analog-to-digital converter ADC.

In one or more aspects, each source driver integrated circuit SDIC may be connected to the display panel 110 using a tape-automated-bonding (TAB) technique, or connected to a conductive pad such as a bonding pad of the display panel 110 using a chip-on-glass (COG) technique or a chip-on-panel (COP) technique, or connected to the display panel 110 using a chip-on-film (COF) technique.

The gate driving circuit 130 may supply a gate signal of a turn-on level voltage or a gate signal of a turn-off level voltage according to the control of the controller 140. The gate driving circuit 130 may sequentially drive a plurality of gate lines GL by sequentially supplying gate signals of the turn-on level voltage to the plurality of gate lines GL.

In one or more aspects, the gate driving circuit 130 may be connected to the display panel 110 using the TAB technique, or connected to a conductive pad such as a bonding pad of the display panel 110 using the COG technique or the COP technique, or connected to the display panel 110 using the COF technique. In one or more aspects, the gate driving circuit 130 may be disposed in the non-display area NDA of the display panel 110 using the GIP technique. The gate driving circuit 130 may be disposed on a substrate SUB, or connected to the substrate SUB. In an example where the gate driving circuit 130 is implemented with the GIP technique, the gate driving circuit 130 may be disposed in the non-display area NDA of the substrate SUB. The gate driving circuit 130 may be connected to the substrate SUB in examples where the gate driving circuit 130 is implemented with the COG technique, the COF technique, or the like.

In an aspect, at least one of the data driving circuit 120 and the gate driving circuit 130 may be disposed in the display area DA. For example, at least one of the data driving circuit 120 and the gate driving circuit 130 may be disposed not to overlap with subpixels SP, or disposed to overlap with one or more, or all, of the subpixels SP.

When a specific gate line is selected and driven by the gate driving circuit 130, the data driving circuit 120 may convert image data Data into data voltages in an analog form and supply the data voltages resulting from the converting to a plurality of data lines DL.

The data driving circuit 120 may be located in, and/or electrically connected to, but not limited to, a single side or portion (e.g., an upper edge or a lower edge) of the display panel 110. In one or more aspects, the data driving circuit 120 may be located in, and/or electrically connected to, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 130 may be located in, and/or electrically connected to, but not limited to, a single side or portion (e.g., a left edge or a right edge) of the display panel 110. In one or more aspects, the gate driving circuit 130 may be located in, and/or electrically connected to, but not limited to, two sides or portions (e.g., a left edge and a right edge) of the display panel 110 or at least two of four sides or portions (e.g., an upper edge, a lower edge, the left edge, and the right edge) of the display panel 110 according to driving schemes, panel design schemes, or the like.

The controller 140 may be referred to as a timing controller and configured to other control functionalities in addition to the typical function of the timing controller. In one or more aspects, the controller 140 may be one or more other control circuits different from the timing controller, or a circuit or component in the control apparatus/device The controller 140 may be implemented using various circuits or electronic components such as an integrated circuit (IC), a field programmable gate array (FPGA), an application specific integrated circuit (ASIC), a processor, and/or the like.

The controller 140 may be mounted on a printed circuit board, a flexible printed circuit, or the like, and may be electrically connected to the data driving circuit 120 and the gate driving circuit 130 through the printed circuit board, the flexible printed circuit, or the like.

The controller 140 may transmit signals to, and receive signals from, the data driving circuit 120 via one or more predetermined interfaces. For example, such interfaces may include a low voltage differential signaling (LVDS) interface, an embedded clock point-point interface (EPI), a serial peripheral interface (SPI), and the like.

The controller 140 may include a storage medium such as one or more registers.

In one or more aspects, the display device 100 may be a display including a backlight unit such as a liquid crystal display device, or may be a self-emissive display such as an organic light emitting diode (OLED) display device, a quantum dot (QD) display device, a micro light emitting diode (LED) display device, a light emitting diode (LED) display device based on an inorganic material, or the like. In an aspect where the display device 100 is an organic light emitting display device, each subpixel SP may include, as a light emitting element, an OLED, which is a self-emissive element.

In an aspect where the display device 100 is a quantum dot display device, each subpixel SP may include a light emitting element configured with quantum dots, which are self-emissive semiconductor crystals.

In an aspect where the display device 100 is an inorganic light emitting display device, each subpixel SP may include, as a light emitting element, an inorganic light emitting diode, which is a self-emissive element and includes an inorganic material. In this aspect, the inorganic light emitting diode may be referred to as a micro light emitting diode (LED), and the inorganic light emitting display device may be referred to as a micro light emitting diode (LED) display device.

Referring to FIG. 1, in an aspect where the display device 100 according to aspects of the present disclosure is a self-emissive display, each of a plurality of subpixels SP disposed in the display panel 110 of the display device 100 may include a light emitting element ED, and a subpixel circuit SPC to drive the light emitting element ED.

Referring to FIG. 1, a respective subpixel circuit SPC of each subpixel SP may include, for example, a driving transistor DRT, a scan transistor SCT, and a storage capacitor Cst. In this example, as the subpixel circuit SPC is configured with two transistors (2T: DRT and SCT) and one capacitor (1C: Cst), this structure of subpixel circuit SPC may be referred to as a "2T1C structure".

The light emitting element ED may include an anode electrode AND and a cathode electrode CAT and include an emission layer EL located between the anode electrode AND and the cathode electrode CAT.

One of the anode electrode AND and the cathode electrode CAT may be a pixel electrode connected to a transistor such as the driving transistor DRT, and the other may be a common electrode to which a common voltage is applied. The pixel electrode may be an electrode disposed in each subpixel SP, and the common electrode may be an electrode commonly disposed in all or two or more of subpixels SP. For example, the common voltage may be a high voltage EVDD, which is a high level common voltage, or be a low voltage EVSS, which is a low level common voltage. In this example, the high voltage EVDD may be sometimes referred to as a driving voltage, and the low voltage EVSS may be sometimes referred to as a base voltage.

In an aspect, the anode electrode AND may be a pixel electrode connected to a transistor such as the driving transistor DRT, and the cathode electrode CAT may be a common electrode to which the low voltage EVSS is applied.

For example, the light emitting element ED may be an OLED, a LED based on an inorganic material, a quantum dot light emitting element, or the like.

The driving transistor DRT may be a transistor for driving the light emitting element ED, and may include a first node N1, a second node N2, and a third node N3.

The first node N1 of the driving transistor DRT may be the gate node of the driving transistor DRT and may be electrically connected to the source node or drain node of the scan transistor SCT. The second node N2 of the driving transistor DRT may be the source node or drain node of the driving transistor DRT, and may also be electrically connected to the anode electrode AND of the light emitting element ED. The third node N3 of the driving transistor DRT may be electrically connected to a high voltage line DVL for carrying the high voltage EVDD.

The scan transistor SCT may be controlled by a scan signal SC, which is a type of gate signal, and may be connected between the first node N1 of the driving transistor DRT and a data line DL. In other words, the scan transistor SCT may be turned on or turned off depending on the scan signal SC carried through a scan signal line SCL, which is a type of the gate line GL, and control an electrical connection between the data line DL and the first node N1 of the driving transistor DRT.

The scan transistor SCT may be turned on by the scan signal SC having a turn-on level voltage, and thereby, pass a data voltage Vdata carried through the data line DL to the first node N1 of the driving transistor DRT.

In an example where the scan transistor SCT is an n-type transistor, the turn-on level voltage of the scan signal SC may be a high level voltage. In another example where the scan transistor SCT is an p-type transistor, the turn-on level voltage of the scan signal SC may be a low level voltage.

Hereinafter, for simplicity, discussions are provided based on the example where the scan transistor SCT is the n-type transistor. Accordingly, in discussions that follow, the turn-on level voltage of the sensing transistor SENT may be the high level voltage.

The storage capacitor Cst may be connected between the first node N1 and the second node N2 of the driving transistor DRT. The storage capacitor Cst may store an amount of electric charge corresponding to a voltage difference between both terminals and maintain the voltage difference between both terminals for a predetermined frame time. As a result, the corresponding subpixel SP may emit light for the predetermined frame time.

Each of the driving transistor DRT and the scan transistor SCT may be an n-type transistor or a p-type transistor. Hereinafter, for convenience of description, discussions are provided based on an example where each of the driving transistor DRT and the scan transistor SCT is the n-type transistor.

The storage capacitor Cst may be an external capacitor intentionally designed to be located outside of the driving transistor DRT, other than an internal capacitor, such as a parasitic capacitor (e.g., a Cgs or a Cgd), that may be formed between the gate node and the source node (or the drain node) of the driving transistor DRT.

It should be noted that FIG. 1 illustrates just one example subpixel SP. For example, the subpixel SP may be modified in various ways by further including one or more transistors or one or more capacitors according to design requirements.

Figure 2:
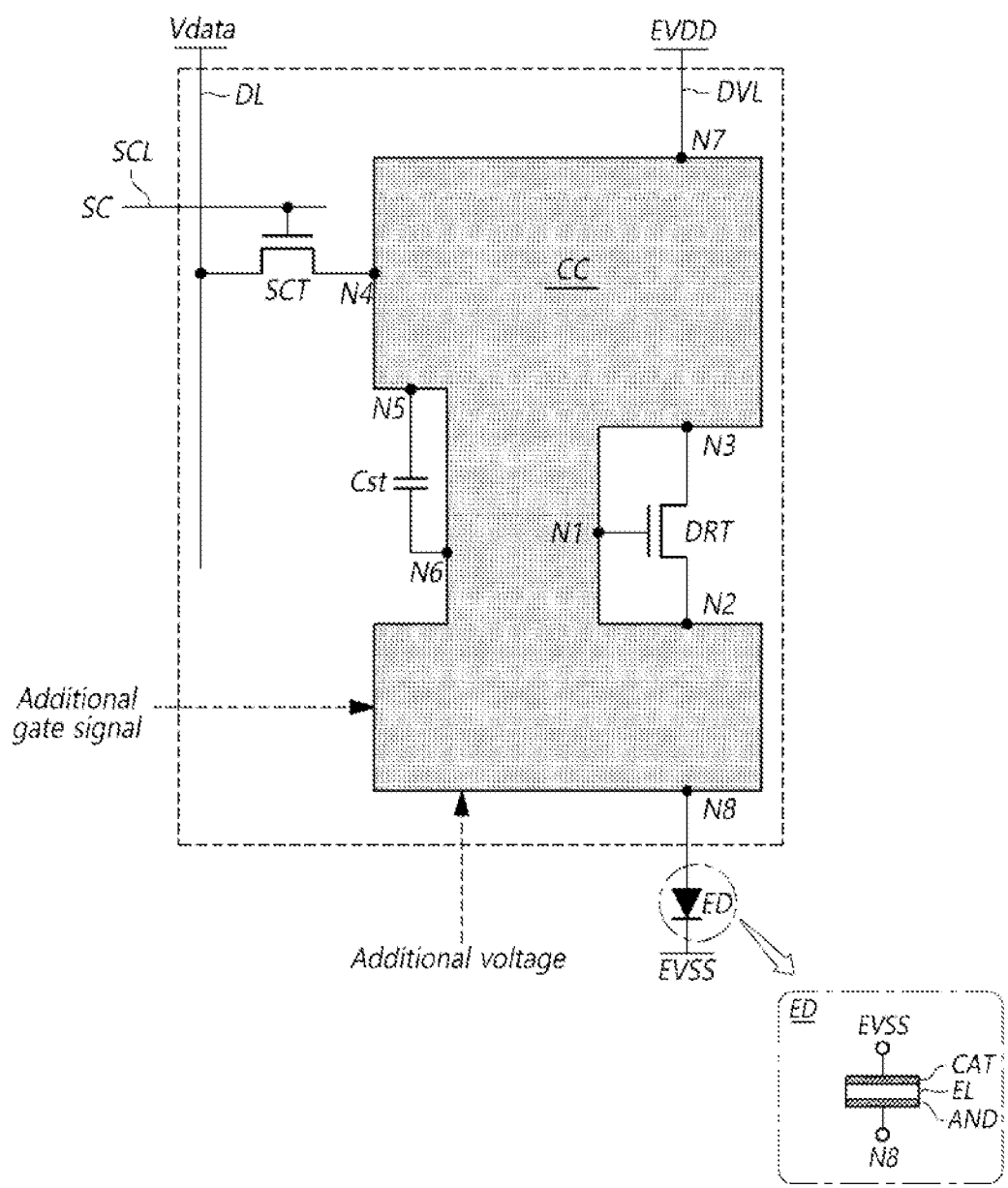
FIG. 2 illustrates an example structure of a subpixel that may be implemented in two or more different types in a display panel according to aspects of the present disclosure.

FIG. 2 illustrates an example structure of a subpixel that may be implemented in two or more different types in the display panel 110 according to aspects of the present disclosure. It should be understood that descriptions of structures or components that are the same, or nearly the same, as those of the subpixel SP illustrated in FIG. 1 may be omitted for convenience of description.

Referring to FIG. 2, in one or more aspects, each of a plurality of subpixels SP disposed in the display panel 110 of the display device 100 according to aspects of the present disclosure may include a light emitting element ED and a subpixel circuit SPC for driving the light emitting element ED. For example, the light emitting element ED may be any one of an OLED, a LED based on an inorganic material, a quantum dot light emitting element, and the like.

Referring to FIG. 2, the subpixel circuit SPC may include, as basic elements, a driving transistor DRT, a scan transistor SCT, and a storage capacitor Cst, and may further include a control circuit CC including one or more transistors and/or one or more capacitors.

The subpixel circuit SPC may be connected to a data line DL for carrying a data voltage Vdata and a scan signal line SCL for carrying a scan signal SC.

The subpixel circuit SPC may be supplied with a driving voltage EVDD (e.g., the high voltage EVDD of FIG. 1) corresponding to a high voltage through a driving voltage line DVL, and a base voltage EVSS (e.g., the low voltage EVSS of FIG. 1) corresponding to a low voltage lower than the driving voltage EVDD.

In an aspect, one or more additional voltages may be supplied to the subpixel circuit SPC depending on a circuit configuration of the control circuit CC.

In an aspect, one or more additional gate signals may be supplied to the subpixel circuit SPC depending on a circuit configuration of the control circuit CC. For example, such additional gate signals may include one or more scan signals and/or one or more light emitting control signals.

The driving transistor DRT may be a transistor for driving the light emitting element ED and may include a first node N1, a second node N2, and a third node N3. The first node N1 of the driving transistor DRT may be the gate node of the driving transistor DRT. The second node N2 of the driving transistor DRT may be the source node or drain node of the driving transistor DRT. The third node N3 of the driving transistor DRT may be the drain node or source node, and the driving voltage EVDD may be applied thereto.

The scan transistor SCT may be connected between the data line DL and the control circuit CC. The gate node of the scan transistor SCT may be electrically connected to the scan signal line SCL for carrying a scan signal SC, and the drain node or source node of the scan transistor SCT may be electrically connected to the data line DL. The source node or drain node of the scan transistor SCT may be electrically connected to a fourth node N4 of the control circuit CC. For example, the fourth node N4 of the control circuit CC may be electrically connected to any one of the first node N1, the second node N2, and the third node N3 of the driving transistor DRT or be electrically connected to any one of both terminals of the storage capacitor Cst.

Both terminals of the storage capacitor Cst may be electrically connected to a fifth node N5 and a sixth node N6 of the control circuit CC, respectively. One of the fifth node N5 and the sixth node N6 of the control circuit CC may be electrically connected to the first node N1 of the driving transistor DRT.

The driving voltage line DVL may be electrically connected to a seventh node N7 of the control circuit CC.

The light emitting element ED may be electrically connected to an eighth node N8 of the control circuit CC. The light emitting element ED may include an anode electrode AND, an emission layer EL, and a cathode electrode CAT. For example, the anode electrode AND may correspond to a pixel electrode and be electrically connected to the eighth node N8. The cathode electrode CAT may correspond to a common electrode, and the low voltage EVSS may be applied thereto.

Each of the driving transistor DRT and the scan transistor SCT may be an n-type transistor or a p-type transistor. One or more additional transistors included in the control circuit CC may also be n-type transistors or p-type transistors.

In an aspect, the subpixel circuit SPC may not include the control circuit CC or may include the control circuit CC. Even when an aspect where the subpixel circuit SPC includes the control circuit CC, the control circuit CC may have various circuit configurations according to design requirements. For example, such various circuit configurations may include the number and connection structure of transistors, the number and connection structure of capacitors, and/or the like.

In an aspect, the presence or absence of the control circuit CC or a circuit configuration of the control circuit CC may be determined or designed differently according to a size of the display device 100 (e.g., a large, medium, or small size), a type of display device 100 (e.g., a television, monitor, smartphone, tablet, or the like), a driving scheme, or a provided function, and/or the like.

In an aspect where the subpixel circuit SPC does not include the control circuit CC, the pixel circuit may have the most basic circuit configuration including two transistors (DRT, SCT) and one capacitor (Cst). In this aspect, the seventh node N7 and the third node N3 may be electrically connected, the fourth node N4, the fifth node N5, and the first node N1 may be electrically connected, and the sixth node N6, the eighth node N8, and the second node N2 may be electrically connected. In this implementation, the structure and components of the subpixel SP of FIG. 2 may be the same as the structure and components of the subpixel SP of FIG. 1.

Figure 3:
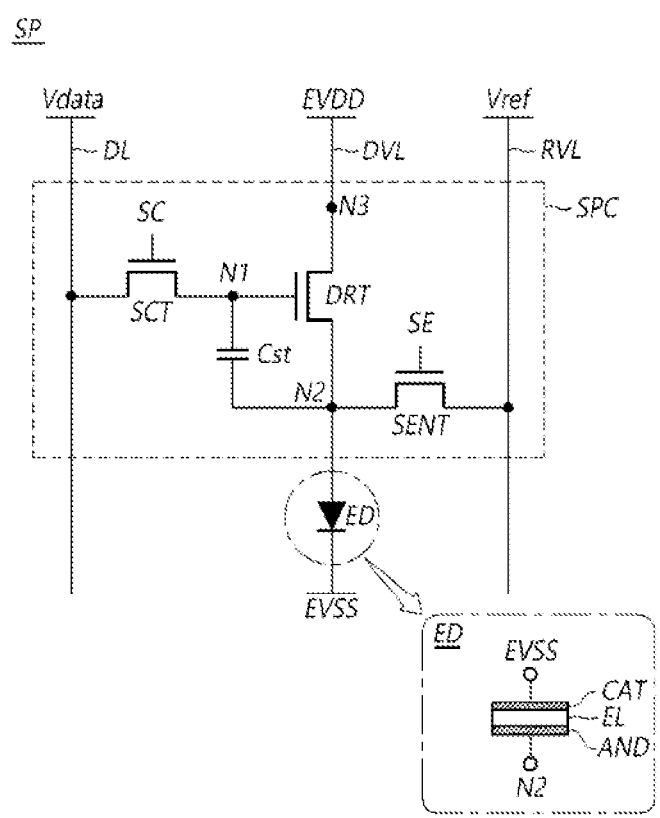
FIG. 3 illustrates an example equivalent circuit of a subpixel in the display panel according to aspects of the present disclosure.

FIG. 3 illustrates an example equivalent circuit of a subpixel SP in the display panel 110 according to aspects of the present disclosure.

Referring to FIG. 3, in one or more aspects, each of a plurality of subpixels SP disposed in the display panel 110 of the display device 100 according to aspects of the present disclosure may include a light emitting element ED and a subpixel circuit SPC for driving the light emitting element ED. For example, the corresponding subpixel circuit SPC of each subpixel SP may include a driving transistor DRT, a scan transistor SCT, a sensing transistor SENT, and a storage capacitor Cst. In this example, as the corresponding subpixel circuit SPC of each subpixel SP is configured with three transistors (3T: DRT, SCT and SENT) and one capacitor (1C: Cst), this structure of subpixel circuit SPC may be referred to as a "3T1C structure".

The subpixel SP of FIG. 3 is different from the subpixel SP of FIG. 2 in that the subpixel SP of FIG. 3 further includes the sensing transistor SENT compared with the subpixel SP of FIG. 2. Considering such a similarity, hereinafter, discussions on the subpixel SP of FIG. 3 will be provided by focusing on differences from the subpixel SP of FIG. 2.

Referring to FIG. 3, the light emitting element ED may include an anode electrode AND and a cathode electrode CAT and include an emission layer EL located between the anode electrode AND and the cathode electrode CAT. For example, the light emitting element ED may be an organic OLED, a LED based on an inorganic material, a quantum dot light emitting element, or the like.

Referring to FIG. 3, the driving transistor DRT may be a transistor for driving the light emitting element ED, and may include a first node N1, a second node N2, and a third node N3. The first node N1 of the driving transistor DRT may be the gate node of the driving transistor DRT and may be electrically connected to the source node or drain node of the scan transistor SCT. The second node N2 of the driving transistor DRT may be the source node or drain node of the driving transistor DRT, be electrically connected to the source node or drain node of the sensing transistor SENT, and be electrically connected to the anode electrode AND of the light emitting element ED. The third node N3 of the driving transistor DRT may be electrically connected to a high voltage line DVL for carrying the high voltage EVDD.

Referring to FIG. 3, the scan transistor SCT may be controlled by a scan signal SC, which is a type of gate signal, and may be connected between the first node N1 of the driving transistor DRT and a data line DL. In other words, the scan transistor SCT may be turned on or turned off depending on a scan signal SC carried through a scan signal line SCL, which is a type of the gate line GL, and control an electrical connection between the data line DL and the first node N1 of the driving transistor DRT.

The scan transistor SCT may be turned on by a scan signal SC having a turn-on level voltage, and thereby, pass a data voltage Vdata carried through the data line DL to the first node N1 of the driving transistor DRT.

Referring to FIG. 3, the sensing transistor SENT may be controlled by a sensing signal SE, which is a type of gate signal, and may be connected between the second node N2 of the driving transistor DRT and a reference voltage line RVL. In other words, the sensing transistor SENT may be turned on or turned off depending on a sensing signal SE carried through a sensing signal line SENL, which is another type of the gate line GL, and control an electrical connection between the second node N2 of the driving transistor DRT and the reference voltage line RVL.

The sensing transistor SENT may be turned on by a sensing signal SE having a turn-on level voltage, and thereby, pass a reference voltage Vref carried through the reference voltage line RVL to the second node N2 of the driving transistor DRT. The sensing signal SE may be referred to as a second scan signal that is different from the scan signal SC.

Further, the sensing transistor SENT may be turned on by a sensing signal SE having the turn-on level voltage, and thereby, pass a voltage at the second node N2 of the driving transistor DRT to the reference voltage line RVL.

In an aspect where the sensing transistor SENT is an n-type transistor, the turn-on level voltage of the sensing signal SE may be a high level voltage. In another example where the sensing transistor SENT is an p-type transistor, the turn-on level voltage of the sensing signal SE may be a low level voltage. Hereinafter, for simplicity, discussions are provided based on the example where the sensing transistor SENT is an n-type transistor. Accordingly, in discussions that follow, the turn-on level voltage of a sensing transistor SENT may be a high level voltage.

For example, the function of the sensing transistor SENT configured to pass the voltage of the second node N2 of the driving transistor DRT to the reference voltage line RVL may be used when the corresponding subpixel SP is driven to sense one or more characteristic values of the subpixel SP. In this example, the voltage passed to the reference voltage line RVL may be a voltage to determine a characteristic value of the subpixel SP or a voltage where the characteristic value of the subpixel SP is contained.

The characteristic value of the subpixel SP may be a characteristic value of the driving transistor DRT or the light emitting element ED. For example, the characteristic value of the driving transistor DRT may include a threshold voltage and/or mobility of the driving transistor DRT. The characteristic value of the light emitting element ED may include a threshold voltage of the light emitting element ED.

Referring to FIG. 3, the storage capacitor Cst may be connected between the first node N1 and the second node N2 of the driving transistor DRT.

Referring to FIG. 3, each of the driving transistor DRT, the scan transistor SCT, and the sensing transistor SENT may be an n-type transistor, or a p-type transistor. Herein, for convenience of description, discussions are provided based on an example where each of the driving transistor DRT, the scan transistor SCT, and the sensing transistor SENT is an n-type transistor.

The storage capacitor Cst may be an external capacitor intentionally designed to be located outside of the driving transistor DRT, other than an internal capacitor, such as a parasitic capacitor (e.g., a Cgs or a Cgd), that may be formed between the gate node and the source node (or the drain node) of the driving transistor DRT.

It should be noted that FIG. 3 illustrates just one example subpixel SP. For example, the subpixel SP may be modified in various ways by further including one or more transistors or one or more capacitors according to design requirements.

Figure 4A:
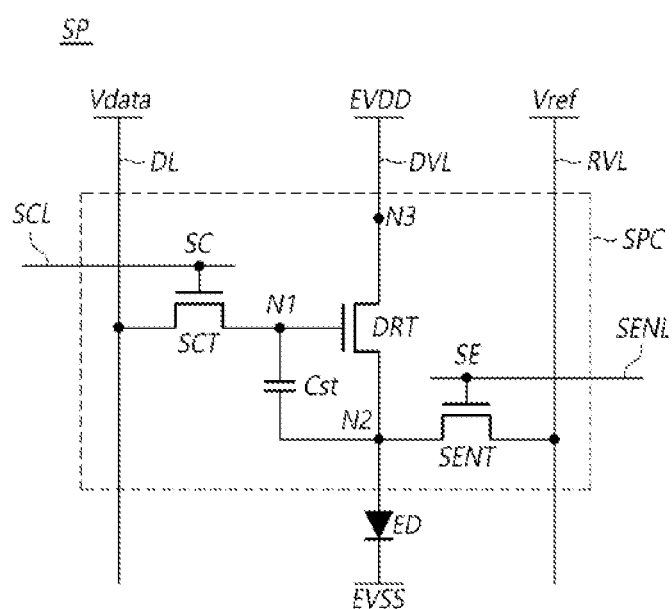
FIGS. 4A and 4B illustrate respective example equivalent circuits of a subpixel having a two-gate driven structure and another subpixel having a one-gate driven structure in the display panel according to aspects of the present disclosure.
Figure 4B:
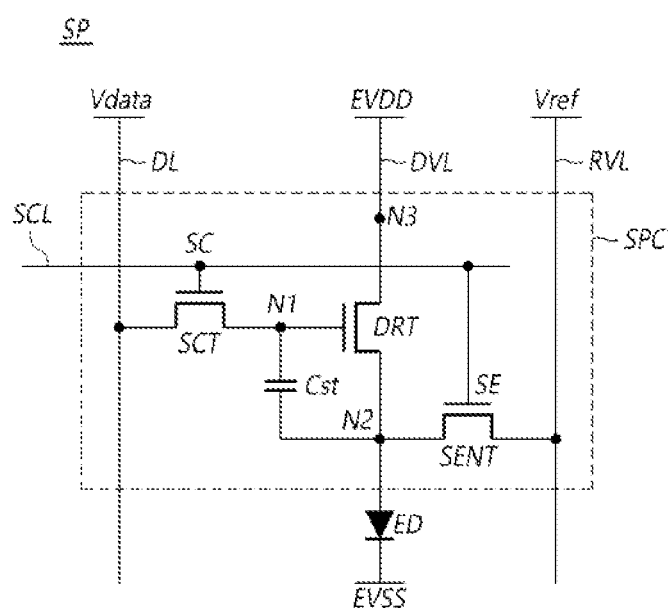

FIGS. 4A and 4B illustrate respective example equivalent circuits of a subpixel SP having a two-gate driven structure and another subpixel SP having a one-gate driven structure in the display panel 110 according to aspects of the present disclosure.

The subpixel circuit SPC of the subpixel SP of FIG. 4A and the subpixel circuit SPC of the subpixel SP of FIG. 4B have the same 3T1C structure as that of FIG. 3.

The subpixel SP of FIG. 4A and the subpixel SP of FIG. 4B may have different gate driving structures. The subpixel SP of FIG. 4A may have a two-gate driven structure. The subpixel SP of FIG. 4B may have a one-gate driven structure.

As shown in FIG. 4A, in examples where a subpixel SP has the two-gate driven structure, the subpixel SP may be connected to two gate lines GL serving as a scan signal line SCL and a sensing signal line SENL, respectively.

Referring to FIG. 4A, in the subpixel circuit SPC of the two-gate driven structure-based subpixel SP, the gate node of a scan transistor SCT may be connected to the scan signal line SCL, and the gate node of a sensing transistor SENT may be connected to the sensing signal line SENL. As a result, the scan transistor SCT and the sensing transistor SENT may operate independently of each other.

Referring to FIG. 4A, the subpixel circuit SPC of the two-gate driven structure-based subpixel SP may receive a scan signal SC through the scan signal line SCL and receive a sensing signal SE through the sensing signal line SENL. In this manner, in the subpixel circuit SPC of the two-gate driven structure-based subpixel SP, the gate node of the scan transistor SCT may receive a scan signal SC through the scan signal line SCL, and the gate node of the sensing transistor SENT may receive a sensing signal SE through the sensing signal line SENL.

As shown in FIG. 4A, in examples where a subpixel SP has the two-gate driven structure, on and/or off timings of a scan transistor SCT and on and/or off timings of a sensing transistor SENT in one subpixel SP may be independent of each other. For example, when a subpixel SP has the two-gate driven structure, on and/or off timings of a scan transistor SCT and on and/or off timings of a sensing transistor SENT in one subpixel SP may be different from, or be the same as, each other according to design requirements.

As shown in FIG. 4B, in examples where a subpixel SP has the one-gate driven structure, the subpixel SP may be connected to a scan signal line SCL corresponding to one gate line GL.

Referring to FIG. 4B, in the subpixel circuit SPC of the one-gate driven structure-based subpixel SP, the gate node of a scan transistor SCT and the gate node of a sensing transistor SENT may be connected to a single scan signal line SCL. As a result, the scan transistor SCT and the sensing transistor SENT may operate together.

Referring to FIG. 4B, in the subpixel circuit SPC of the one-gate driven structure-based subpixel SP, both the gate node of the scan transistor SCT and the gate node of the sensing transistor SENT may receive a scan signal SC together through the one scan signal line SCL.

Referring to FIG. 4B, in the subpixel circuit SPC of the one-gate driven structure-based subpixel SP, the scan signal SC supplied to the gate node of the sensing transistor SENT may serve as a sensing signal SE.

As shown in FIG. 4B, in examples where a subpixel SP has the one-gate driven structure as in the configuration of FIG. 4B, on and/or off timings of a scan transistor SCT and on and/or off timings of a sensing transistor SENT in one subpixel SP may be the same.

Figure 5:
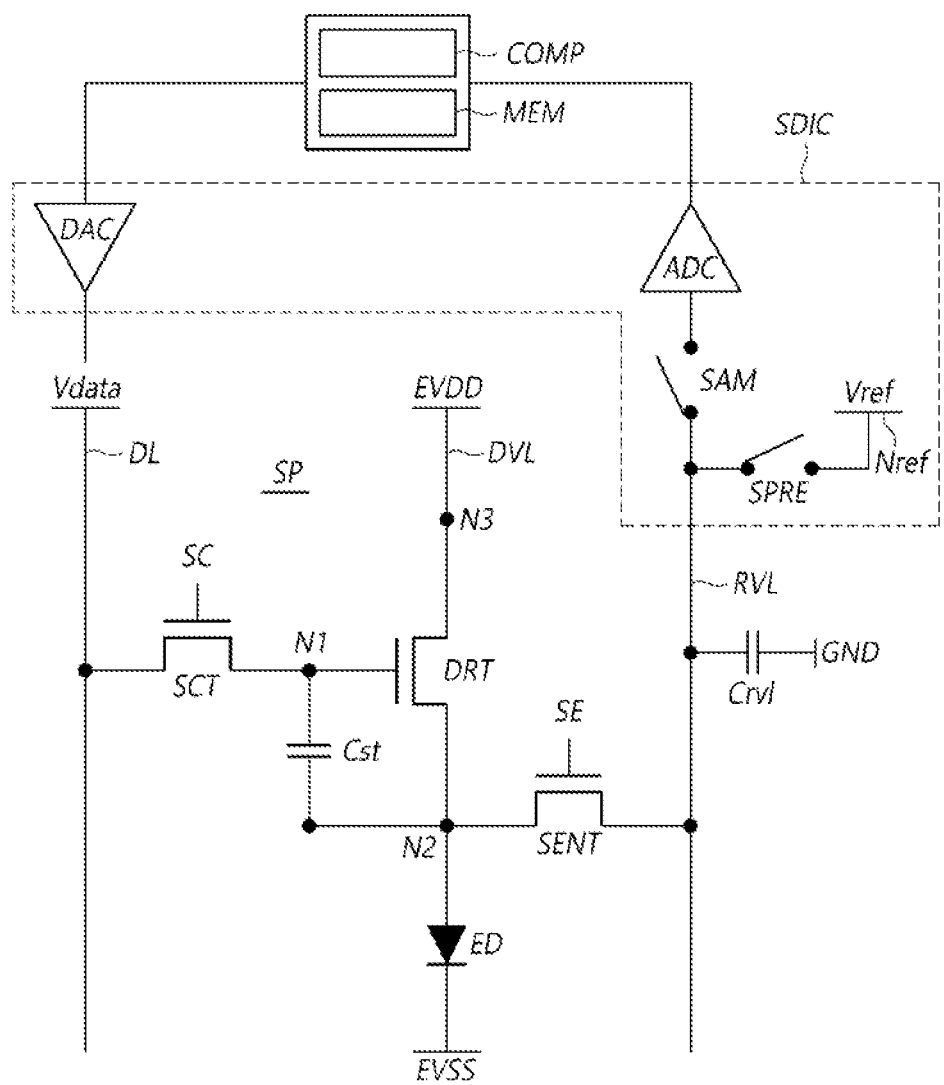
FIG. 5 illustrates an example compensation circuit of the display device according to aspects of the present disclosure.

FIG. 5 illustrates an example compensation circuit of the display device 100 according to aspects of the present disclosure. It should be noted here that the subpixel SP of FIG. 5 represents the subpixel SP of FIG. 3 as an example.

Referring to FIG. 5, the compensation circuit may be configured to perform sensing operation for characteristic values of circuit elements in the subpixel SP and an associated compensation process. In an aspect, the circuit elements may include light emitting elements ED, driving transistors DRT, and the like.

The compensation circuit may include a power switch SPRE, a sampling switch SAM, an analog-to-digital converter ADC, a compensator COMP, a memory MEM, and the like. In an aspect, the compensation circuit may further include a subpixel SP (e.g., the subpixel SP of FIG. 2 or 5).

The power switch SPRE may control a connection between the reference voltage line RVL and a reference voltage supply node Nref. A reference voltage Vref supplied by a power supply may be applied to the reference voltage supply node Nref, and the reference voltage Vref applied to the reference voltage supply node Nref may be passed to the reference voltage line RVL via the power switch SPRE.

The sampling switch SAM may control a connection between the analog-to-digital converter ADC and the reference voltage line RVL. When the analog-to-digital converter ADC is connected to the reference voltage line RVL by a sampling switch SAM, the analog-to-digital converter ADC may convert a voltage (e.g., an analog voltage) of the connected reference voltage line RVL into a sensing value in the form of digital value.

As the subpixel SP is driven, a line capacitor Crvl may be formed between the reference voltage line RVL and the ground GND. The voltage of the reference voltage line RVL may correspond to an amount of electric charges stored across the line capacitor Crvl.

The analog-to-digital converter ADC may provide sensing data containing the sensing value to the compensator COMP.

The compensator COMP may determine at least one corresponding characteristic value of at least one circuit element (e.g., the light emitting element ED, driving transistor DRT, and/or the like) included in the subpixel SP based on the sensing data from the analog-to-digital converter ADC. Thereafter, the compensator COMP may determine a compensation value to reduce or eliminate a difference in characteristic values between circuit elements based on the at least one characteristic value and store the compensation value in the memory MEM.

For example, the compensation value may be information determined to reduce or eliminate a difference in characteristic values between light emitting elements ED or a difference in characteristic values between driving transistors DRT and include an offset and/or a gain for modifying data.

The controller 140 may modify image data using the compensation value stored in the memory MEM and supply the modified image data to the data driving circuit 120.

The data driving circuit 120 may convert the changed image data into a data voltage Vdata in the form of analog voltage by using a digital-to-analog converter DAC and output the data voltage Vdata. In this manner, the compensation process may be executed.

Referring to FIG. 5, In an aspect, the analog-to-digital converter ADC, the power switch SPRE, and the sampling switch SAM may be included in a source driver integrated circuit SDIC. In this aspect, the source driver integrated circuit SDIC may be an integrated circuit serving as the data driving circuit 120 or a part of the data driving circuit 120, and include the digital-to-analog converter DAC.

In an aspect, the compensator COMP may be included in the controller 140.

As described above, the display device 100 may perform the compensation process to reduce a difference in characteristic values between the driving transistors DRT. Further, to perform the compensation process, the display device 100 may perform sensing driving to acquire information on a difference in characteristic values between the driving transistors DRT.

In an aspect, the display device 100 according to aspects of the present disclosure may perform sensing driving in two sensing modes (a first sensing mode and a second sensing mode). Hereinafter, sensing driving in two sensing modes (the first sensing mode and the second sensing mode) will be described with reference to FIGS. 6A and 6B.

Figure 6A:
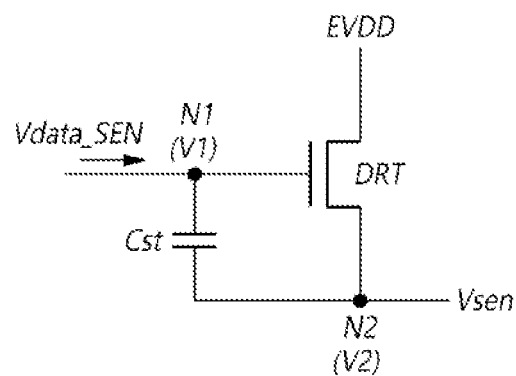
FIGS. 6A and 6B illustrate an example first sensing mode and an example second sensing mode used in the display device according to aspects of the present disclosure.
Figure 6A:
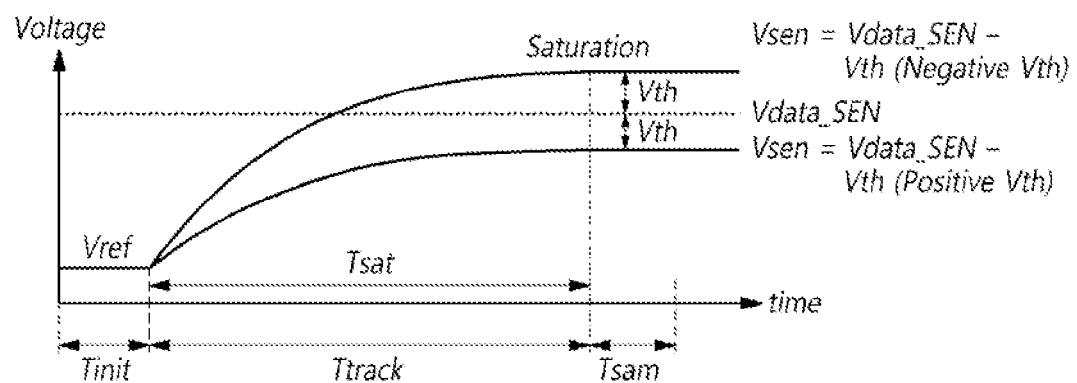
Figure 6B:
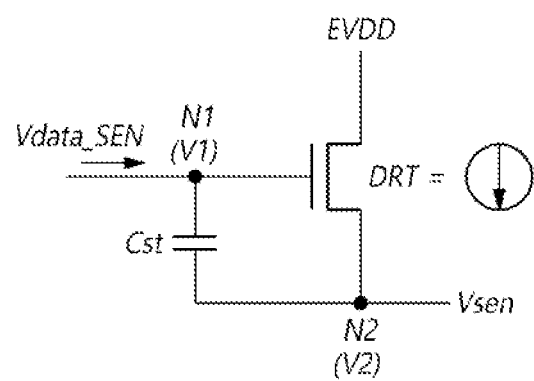
Figure 6B:
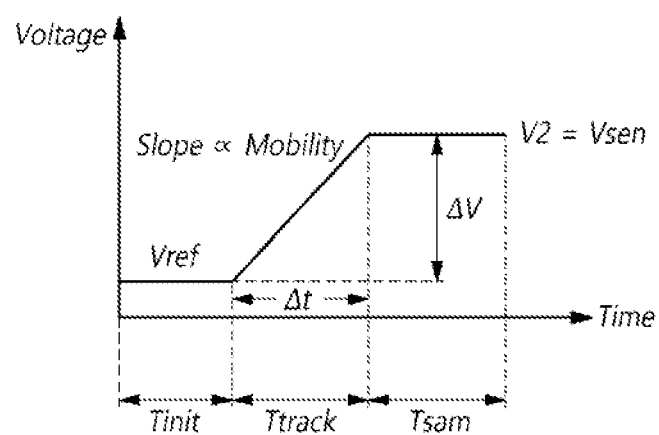

FIGS. 6A and 6B illustrate an example first sensing mode and an example second sensing mode used in the display device 100 according to aspects of the present disclosure.

Referring to FIG. 6A, the first sensing mode may sense a threshold voltage, which requires a relatively long sensing time, among the characteristic values (e.g., the threshold voltage and the mobility) of the driving transistor DRT. The first sensing mode may also be referred to as a "slow sensing mode" or a "threshold voltage sensing mode."

Referring to FIG. 6B, the second sensing mode may sense a mobility, which requires a relatively short sensing time, among the characteristic values (e.g., the threshold voltage and the mobility) of the driving transistor DRT. The second sensing mode may also be referred to as a "fast sensing mode" or a "mobility sensing mode."

Hereinafter, sensing driving in the first sensing mode and sensing driving in the second sensing mode will be described with reference to the compensation circuit of FIG. 5, as well as FIGS. 6A and 6B.

First, sensing driving in the first sensing mode will be described with reference to FIG. 6A.

Referring to FIG. 6A, a sensing driving period of the first sensing mode may include an initialization sub-period Tinit, a tracking sub-period Ttrack, and a sampling sub-period Tsam.

Referring to FIG. 6A, the initialization sub-period Tinit of the sensing driving period in the first sensing mode may be a period for initializing the first node N1 and the second node N2 of the driving transistor DRT.

During the initialization sub-period Tinit, a voltage V1 of the first node N1 of the driving transistor DRT may be initialized to a sensing driving data voltage Vdata_SEN, and a voltage V2 of the second node N2 of the driving transistor DRT may be initialized to a sensing driving reference voltage Vref.

During the initialization sub-period Tinit, the scan transistor SCT and the sensing transistor SENT may be turned on, and the power switch SPRE may be turned on.

Referring to FIG. 6A, the tracking sub-period Ttrack of the sensing driving period in the first sensing mode may be a period for tracking a voltage V2 of the second node N2 of the driving transistor DRT containing a threshold voltage Vth of the driving transistor DRT or a shift ΔVth in the threshold voltage Vth.

During the tracking sub-period Track, the power switch SPRE may be turned off or the sensing transistor SENT may be turned off.

Accordingly, during the tracking sub-period Ttrack, while the first node N1 of the driving transistor DRT is in a constant voltage state with the sensing driving data voltage Vdata_SEN, the second node N2 of the driving transistor DRT may be electrically floating. Accordingly, during the tracking sub-period Ttrack, the voltage V2 of the second node N2 of the driving transistor DRT may vary.

During the tracking sub-period Ttrack, the voltage V2 of the second node N2 of the driving transistor DRT may increase until the voltage V2 of the second node N2 of the driving transistor DRT contains a threshold voltage Vth of the driving transistor DRT (e.g., until the voltage V2 of the second node N2 of the driving transistor DRT reaches a saturation point at which the threshold voltage Vth of the driving transistor DRT (or a shift ΔVth in the threshold voltage Vth) is contained in the voltage V2 of the second node N2 of the driving transistor DRT).

During the initialization sub-period Tinit, a voltage difference between the first node N1 and the second node N2 of the driving transistor DRT, which has been initialized, may be greater than or equal to the threshold voltage Vth of the driving transistor DRT. Accordingly, when the tracking sub-period Ttrack is initiated, the driving transistor DRT may be turned on and allow current to flow. Thereby, when the tracking sub-period Ttrack is initiated, the voltage V2 of the second node N2 of the driving transistor DRT may increase.

During the tracking sub-period Ttrack, the voltage V2 of the second node N2 of the driving transistor DRT cannot continuously increase.

As the latter part of the tracking sub-period Ttrack progresses, an increasing width of the voltage V2 of the second node N2 of the driving transistor DRT may be reduced, and the voltage V2 of the second node N2 of the driving transistor DRT may eventually be saturated.

A saturated voltage V2 of the second node N2 of the driving transistor DRT may correspond to a difference (Vdata_SEN−Vth) between the sensing driving data voltage Vdata_SEN and the threshold voltage Vth or a difference (Vdata_SEN−ΔVth) between the sensing driving data voltage Vdata_SEN and a shift in the threshold voltage ΔVth. The threshold voltage Vth may be a negative threshold voltage (−Vth) or a positive threshold voltage (+Vth).

When the voltage V2 of the second node N2 of the driving transistor DRT is saturated, the sampling sub-period Tsam may be initiated.

Referring to FIG. 6A, the sampling sub-period Tsam of the sensing driving period in the first sensing mode may be a period for measuring a voltage (i.e., Vdata_SEN−Vth, Vdata_SEN−ΔVth) containing the threshold voltage Vth of the driving transistor DRT or a shift in the threshold voltage Vth.

During the sampling sub-period Tsam of the sensing driving period in the first sensing mode, a voltage of the reference voltage line RVL may be sensed by the analog-to-digital converter ADC. The voltage of the reference voltage line RVL may correspond to the voltage of the second node N2 of the driving transistor DRT and correspond to a charging voltage of a line capacitor Crvl formed on the reference voltage line RVL.

During the sampling sub-period Tsam, a voltage Vsen sensed by the analog-to-digital converter ADC may be the voltage (Vdata_SEN−Vth) resulting from subtracting the threshold voltage Vth from the sensing driving data voltage Vdata_SEN or the voltage (Vdata_SEN−ΔVth) resulting from subtracting the threshold voltage shift ΔVth from the sensing driving data voltage Vdata_SEN. The Vth may be a positive threshold voltage or a negative threshold voltage.

Referring to FIG. 6A, during the tracking sub-period Ttrack of the sensing driving period in the first sensing mode, a saturation time Tsat, which is the time taken until the voltage V2 of the second node N2 of the driving transistor DRT increases and then reaches saturation, may be a time period of the tracking sub-period Ttrack of the sensing driving period in the first sensing mode, and be a time taken until the threshold voltage Vth or threshold voltage shift ΔVth of the driving transistor DRT is contained in the voltage (V2=Vdata_SEN-Vth, or V2=Vdata_SEN−ΔVth) of the second node N2 of the driving transistor DRT.

This saturation time Tsat may occupy the majority of the entire time period of the sensing driving period in the first sensing mode. Thus, in the case of the first sensing mode, it may take quite a long time (saturation time Tsat) for the voltage V2 of the second node N2 of a driving transistor DRT to reach saturation after increasing.

As described above, the sensing driving method for sensing the threshold voltage of a driving transistor DRT (i.e., the first sensing mode) is sometimes referred to as a slow mode since a long saturation time Tsat is required until the voltage of the second node N2 of the driving transistor DRT contains the threshold voltage of the driving transistor DRT.

Next, sensing driving in the second sensing mode will be described with reference to FIG. 6B.

Referring to FIG. 6B, a sensing driving period of the second sensing mode may include an initialization sub-period Tinit, a tracking sub-period Ttrack, and a sampling sub-period Tsam.

Referring to FIG. 6B, the initialization sub-period Tinit of the sensing driving period in the second sensing mode may be a period for initializing the first node N1 and the second node N2 of the driving transistor DRT.

During the initialization sub-period Tinit, the scan transistor SCT and the sensing transistor SENT may be turned on, and the power switch SPRE may be turned on.

During the initialization sub-period Tinit, a voltage V1 of the first node N1 of the driving transistor DRT may be initialized to a sensing driving data voltage Vdata_SEN, and a voltage V2 of the second node N2 of the driving transistor DRT may be initialized to a sensing driving reference voltage Vref.

Referring to FIG. 6B, the tracking sub-period Ttrack of the sensing driving period in the second sensing mode may be a period for changing the voltage V2 of the second node N2 of the driving transistor DRT for a preset tracking time Δt until the voltage V2 of the second node N2 of the driving transistor DRT reaches a voltage containing mobility of the driving transistor DRT or a shift in the mobility.

During the tracking sub-period Ttrack, the preset tracking time Δt may be set to a relatively short time. Therefore, it may be difficult for the voltage V2 of the second node N2 of the driving transistor DRT to contain the threshold voltage Vth of the driving transistor DRT for a short tracking time Δt. To address this issue, the voltage V2 of the second node N2 of the driving transistor DRT may be changed enough to determine the mobility of the driving transistor DRT for such a short tracking time Δt.

Accordingly, the second sensing mode may be a sensing driving method for sensing the mobility of a driving transistor DRT.

During the tracking sub-period Ttrack, as the power switch SPRE is turned off or the sensing transistor SENT is turned off, the second node N2 of the driving transistor DRT may be electrically floating.

During the tracking sub-period Ttrack, the scan transistor SCT may be turned off by a scan signal SC of a turn-off level voltage, and the first node N1 of the driving transistor DRT may be also electrically floating.

During the initialization sub-period Tinit, a voltage difference between the first node N1 and the second node N2 of the driving transistor DRT, which has been initialized, may be greater than or equal to the threshold voltage Vth of the driving transistor DRT. Accordingly, when the tracking sub-period Ttrack is initiated, the driving transistor DRT may be turned on and allow current to flow.

The voltage difference between the first node N1 and the second node N2 of the driving transistor DRT may be denoted by Vgs when the first node N1 and the second node N2 of the driving transistor DRT are the gate node and the source node, respectively.

Accordingly, during the tracking sub-period Ttrack, the voltage V2 of the second node N2 of the driving transistor DRT may increase. In this situation, the voltage V1 of the first node N1 of the driving transistor DRT may also increase.

During the tracking sub-period Ttrack, an increasing rate of the voltage V2 of the second node N2 of the driving transistor DRT may vary depending on the current capability (e.g., mobility) of the driving transistor DRT. As the driving transistor DRT has greater current capability (e.g., mobility), the voltage V2 of the second node N2 of the driving transistor DRT may increase more steeply.

After the tracking sub-period Ttrack progresses for the preset tracking time Δt, that is, after the voltage V2 of the second node N2 of the driving transistor DRT increases for the preset tracking time Δt, the sampling sub-period Tsam may proceed.

During the tracking sub-period Ttrack, an increasing rate of the voltage V2 of the second node N2 of the driving transistor DRT may corresponds to an amount of voltage variance ΔV in the second node N2 of the driving transistor DRT during the preset tracking time Δt. The amount of voltage variance ΔV in the second node N2 of the driving transistor DRT may correspond to an amount of voltage variance in the reference voltage line RVL.

Referring to FIG. 6B, after the tracking sub-period Ttrack progresses for the preset tracking time Δt, the sampling sub-period Tsam may be initiated. During the sampling sub-period Tsam, the sampling switch SAM may be turned on, and the reference voltage line RVL and the analog-to-digital converter ADC may be electrically connected.

The analog-to-digital converter ADC may sense a voltage of the reference voltage line RVL. The voltage Vsen sensed by the analog-to-digital converter ADC may be a voltage (Vref+ΔV) increased from the reference voltage Vref by the amount of voltage variance ΔV for the preset tracking time Δt.

The voltage Vsen sensed by the analog-to-digital converter ADC may be the voltage of the reference voltage line RVL and be the voltage of the second node N2 electrically connected to the reference voltage line RVL through the sensing transistor SENT.

Referring to FIG. 6B, in the sampling sub-period Tsam of the sensing driving period in the second sensing mode, the voltage Vsen sensed by the analog-to-digital converter ADC may vary depending on the mobility of the driving transistor DRT. As the driving transistor DRT has higher mobility, the sensing voltage Vsen may increase. As the driving transistor DRT has lower mobility, the sensing voltage Vsen may decrease.

As described above, the sensing driving method for sensing the mobility of a driving transistor DRT (e.g., the second sensing mode) is sometimes referred to as a fast mode since this method may be executed by changing the voltage of the second node N2 of the driving transistor DRT for such a short period of time Δt.

Referring to FIG. 6A, the compensator COMP may detect a threshold voltage Vth or a shift in the threshold voltage Vth of a driving transistor DRT of a corresponding subpixel SP based on sensing data corresponding to a voltage Vsen sensed through the first sensing mode, determine a threshold voltage compensation value for reducing or eliminating a difference in threshold voltages between driving transistors DRT, and store the acquired threshold voltage compensation value in the memory MEM.

Referring to FIG. 6B, the compensator COMP may detect mobility or a shift in the mobility of a driving transistor DRT of a corresponding subpixel SP based on sensing data corresponding to a voltage Vsen sensed through the second sensing mode, determine a mobility compensation value for reducing or eliminating a difference in mobilities between driving transistors DRT, and store the acquired mobility compensation value in the memory MEM.

The controller 140 may modify data Data based on the threshold voltage compensation value Φ and mobility compensation value a stored in the memory MEM and supply the modified data (Data'=α×Data+Φ) to the data driving circuit 120.

The data driving circuit 120 may convert the data (Data'=α×Data+Φ) into a data voltage Vdata, and supply the converted data voltage Vdata to the corresponding subpixel SP. The data voltage Vdata supplied to the corresponding subpixel SP may capable of reducing a difference in threshold voltages and a difference in mobilities.

As described above, because a long sensing time is required for threshold voltage sensing, and a short sensing time is sufficient for mobility sensing, therefore, the threshold voltage sensing may be performed in the first sensing mode corresponding to the slow sensing mode, and the mobility sensing may be performed in the second sensing mode corresponding to the fast sensing mode.

Figure 7:
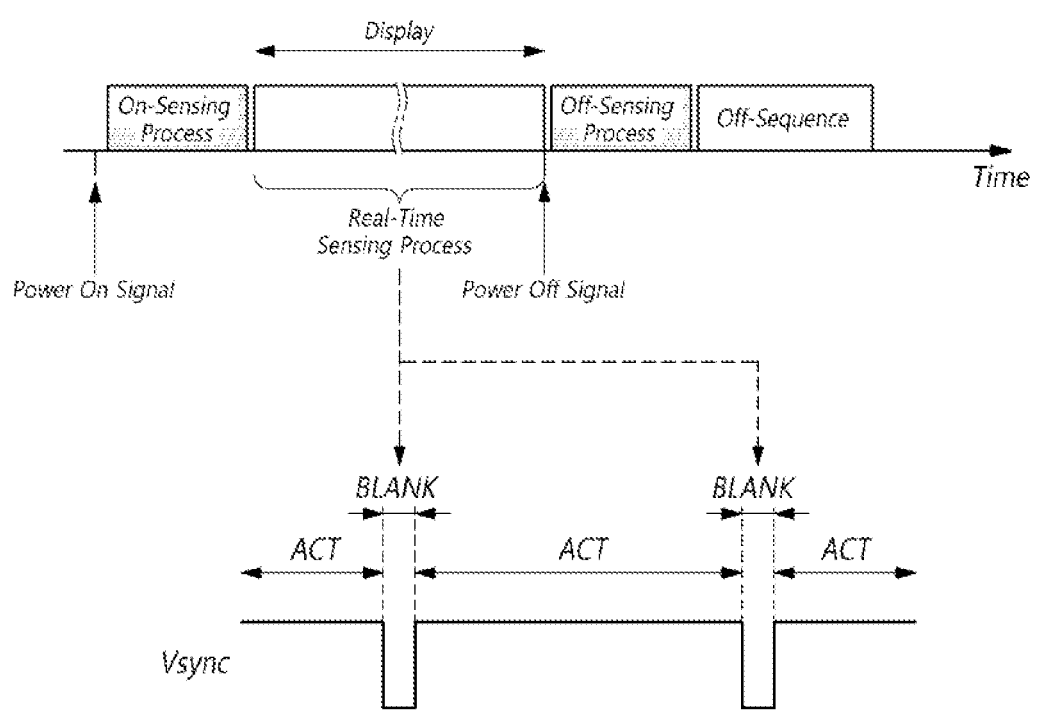
FIG. 7 illustrates various example sensing driving timings of the display device according to aspects of the present disclosure.

FIG. 7 illustrates various sensing driving timings (various sensing periods) defined in the display device 100 according to aspects of the present disclosure.

Referring to FIG. 7, in an aspect, when a power-on signal is generated, the display device 100 according to aspects of the present disclosure may sense respective characteristic values of corresponding driving transistors of all or one or more of a plurality subpixel SP disposed in the display panel 110. This sensing process may be referred to as an "on-sensing process" that occurs in response to a power-on signal.

Referring to FIG. 7, in another aspect, when a power-off signal is generated, before an off-sequence such as switch-off of power proceeds, the display device 100 may also sense respective characteristic values of corresponding driving transistors of all or one or more of the plurality subpixels SP disposed in the display panel 110. This sensing process may be referred to as an "off-sensing process" that occurs in response to a power-off signal.

Referring to FIG. 7, in further another aspect, while display driving is being performed after the power-on signal is generated and before the power-off signal is generated, the display device 100 may also sense respective characteristic values of corresponding driving transistors of all or one or more of the plurality subpixels SP. This sensing process may be referred to as a "real-time sensing process".

The real-time sensing process may be performed every blank period BLANK between active periods ACT based on a vertical synchronization signal Vsync.

As discussed above, a relatively short period of time may be sufficient for sensing the mobility of a driving transistor DRT, and therefore, mobility sensing may be performed in the second sensing mode, which is the faster sensing mode among the two sensing modes.

Since a relatively short period of time is sufficient for mobility sensing, mobility sensing may be performed using any one of the on-sensing process, the off-sensing process, and the real-time sensing process. For example, mobility sensing, which may be performed in the second sensing mode, may be performed in the real-time sensing process mode that may reflect a variance in mobility in real time while the display is being driving. Accordingly, mobility sensing may be performed every blank period BLANK while the display is being driven.

As discussed above, threshold voltage sensing of a driving transistor DRT may require a relatively long sensing time including a long saturation time Vsat. Accordingly, threshold voltage sensing may be performed in the first sensing mode corresponding to the slow sensing mode among the two sensing modes.

Since threshold voltage sensing has a relatively long sensing time, threshold voltage sensing is desired to be performed using timing that does not interfere with the user's viewing. Accordingly, threshold voltage sensing of a driving transistor DRT may be performed after a power-off signal is generated by an input event from a user, and the like. For example, the threshold voltage sensing may be performed in a period during which the display device 100 is not driven for display image or a situation in which the user has no intention of viewing. In this manner, threshold voltage sensing may be performed using the off-sensing process.

Figure 8:
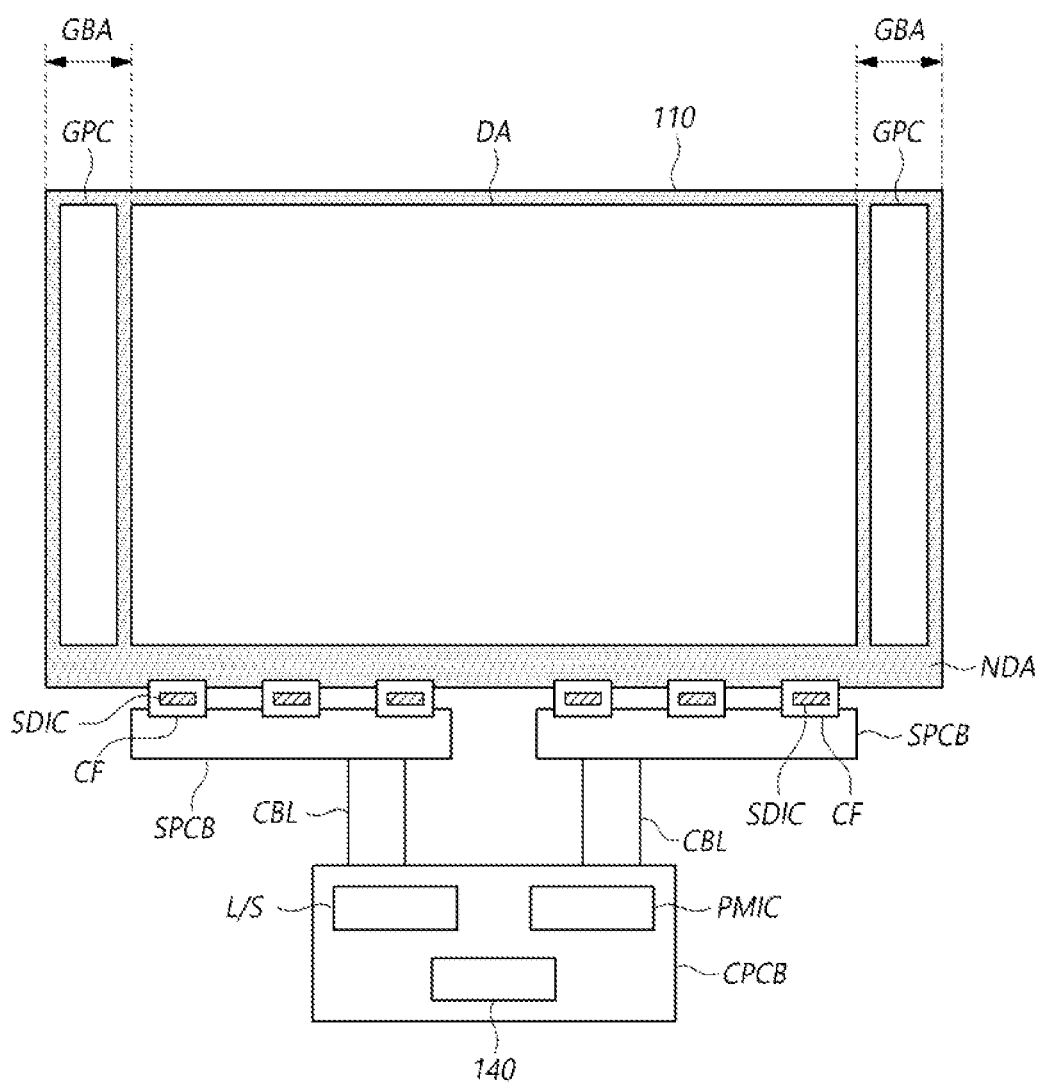
FIG. 8 illustrates an example system configuration of the display device according to aspects of the present disclosure.

FIG. 8 illustrates an example system configuration of the display device 100 according to aspects of the present disclosure.

Referring to FIG. 8, the display panel 110 may include a display area DA in which one or more images may be displayed and a non-display area NDA in which an image is not displayed.

According to the configuration of FIG. 8, a data driving circuit 120 (e.g., the data driving circuit 120 discussed above with reference to FIG. 1) may include a plurality of source driver integrated circuits SDIC and may be implemented using the COF technique. For example, each of the plurality of source driver integrated circuits SDIC may be mounted on a corresponding circuit film CF connected to the non-display area NDA of the display panel 110. In this example, the circuit film CF may be also referred to as a flexible printed circuit.

In an aspect, in the configuration of FIG. 8, one or more gate driving circuits 130 may be implemented using the GIP technique. Hereinafter, a gate driving circuit 130 implemented using the GIP technique may be also referred to as a gate driving panel circuit GPC.

One or more gate driving panel circuit GPC may be located in the non-display area NDA of the display panel 110. In an aspect, in the configuration of FIG. 8, one or more gate driving panel circuits GPC may be located in and/or electrically connected to, but not limited to, one or more areas of the non-display area NDA of the display panel 110. For example, the one or more gate driving panel circuits GPC may be located in, and/or electrically connected to, only one side or portion (e.g., a left edge, a right edge, an upper edge, or a lower edge), or two sides or portions (e.g., a left edge and a right edge, an upper edge and a lower edge, or the like) of the display panel 110. Hereinafter, two or more gate driving panel circuits GPC, which are gate driving circuits 130 configured using the GIP technique, may be disposed in the display panel 110 as shown in FIG. 8. For merely convenience of description, discussions related to the gate driving panel circuits GPC will be provided by restricting to one gate driving panel circuit GPC unless explicitly stated otherwise. It should be therefore understood that the scope of the present disclosure includes examples where the two or more gate driving panel circuits GPC are disposed in the display panel 110.

The display device 100 may include at least one source printed circuit board SPCB and a control printed circuit board CPCB for a circuital connection between the plurality of source driver integrated circuits SDIC and other devices or components (e.g., controller 140, level shifter L/S, the PMIC, and the like).

At least one circuit film CF on which a corresponding source driver integrated circuit SDIC is mounted may be connected to a corresponding one of the at least one source printed circuit board SPCB. For example, a first side of each of the at least one circuit film CF on which a corresponding source driver integrated circuit SDIC is mounted may be electrically connected to the display panel 110, and a second opposing side thereof may be electrically connected to the source printed circuit board SPCB.

A controller 140 (e.g., the controller 140 discussed above with reference to FIG. 1) and a power management integrated circuit PMIC may be mounted on the control printed circuit board CPCB.

The controller 140 may perform an overall control function related to the driving of the display panel 110 and control operations of the plurality of source driver integrated circuits SDIC and the gate driving panel circuit GPC.

The power management integrated circuit PMIC may supply various types of voltages or currents to the plurality of source driver integrated circuits SDIC, the gate driving panel circuit GPC, and the like, or control the various types of voltages or currents to be supplied.

A circuital connection between the at least one source printed circuit board SPCB and the control printed circuit board CPCB may be performed through at least one connection cable CBL. For example, the connection cable CBL may be one of a flexible printed circuit (FPC) and a flexible flat cable (FFC).

In an aspect, the at least one source printed circuit board SPCB and the control printed circuit board CPCB may be integrated into one printed circuit board.

In an aspect, the display device 100 according to aspects of the present disclosure may further include at least one level shifter L/S for adjusting a voltage level of a signal. For example, the level shifter L/S may be disposed on the control printed circuit board CPCB or the at least one source printed circuit board SPCB.

In an aspect, in the display device 100 according to aspects of the present disclosure, the level shifter L/S may output signals needed for gate driving to the gate driving panel circuit GPC, which is the gate driving circuit 130 configured using the GIP technique.

For example, the power management integrated circuit PMIC may supply a signal to the level shifter L/S. The level shifter L/S may adjust a voltage level of the signal supplied by the power management integrated circuit PMIC. The signal whose voltage level has been adjusted by the level shifter L/S may be supplied to the gate driving panel circuit GPC.

For example, the level shifter L/S may supply a plurality of clock signals with different phases to the gate driving panel circuit GPC. The gate driving panel circuit GPC may generate a plurality of gate signals (e.g., at least one scan signal SC, at least one sensing signal SE, and the like) based on the plurality of clock signals supplied by the level shifter L/S, and output the generated gate signals to a plurality of gate lines (e.g., at least one scan signal line SCL, at least one sensing signal line SENL, and the like).

Referring to FIG. 8, the non-display area NDA of the display panel 110 may include one or more gate bezel areas GBA. FIG. 8 illustrates two or more gate bezel areas GBA disposed in the non-display area NDA, but for merely convenience of description, discussions related to the gate bezel areas GBA will be provided by restricting to one gate bezel area GBA unless explicitly stated otherwise. It should be therefore understood that the scope of the present disclosure includes examples where the two or more gate bezel areas GBA GPC are disposed in the non-display area NDA. The gate bezel area GBA may refer to an area where the gate driving panel circuit GPC, which is the gate driving circuit 130 configured using the GIP technique, and several types of lines connected to the gate driving panel circuit GPC are disposed.

Referring to FIG. 8, the several types of lines connected to the gate driving panel circuit GPC may include one or more clock lines, one or more high level gate voltage lines, and one or more low level gate voltage lines, and the like.

Hereinafter, discussions are provided on an example configuration of the gate driving panel circuit GPC and an example structure of the gate bezel area GBA where the gate driving panel circuit GPC is disposed in the display device 100 according to aspects of the present disclosure.

Figure 9A:
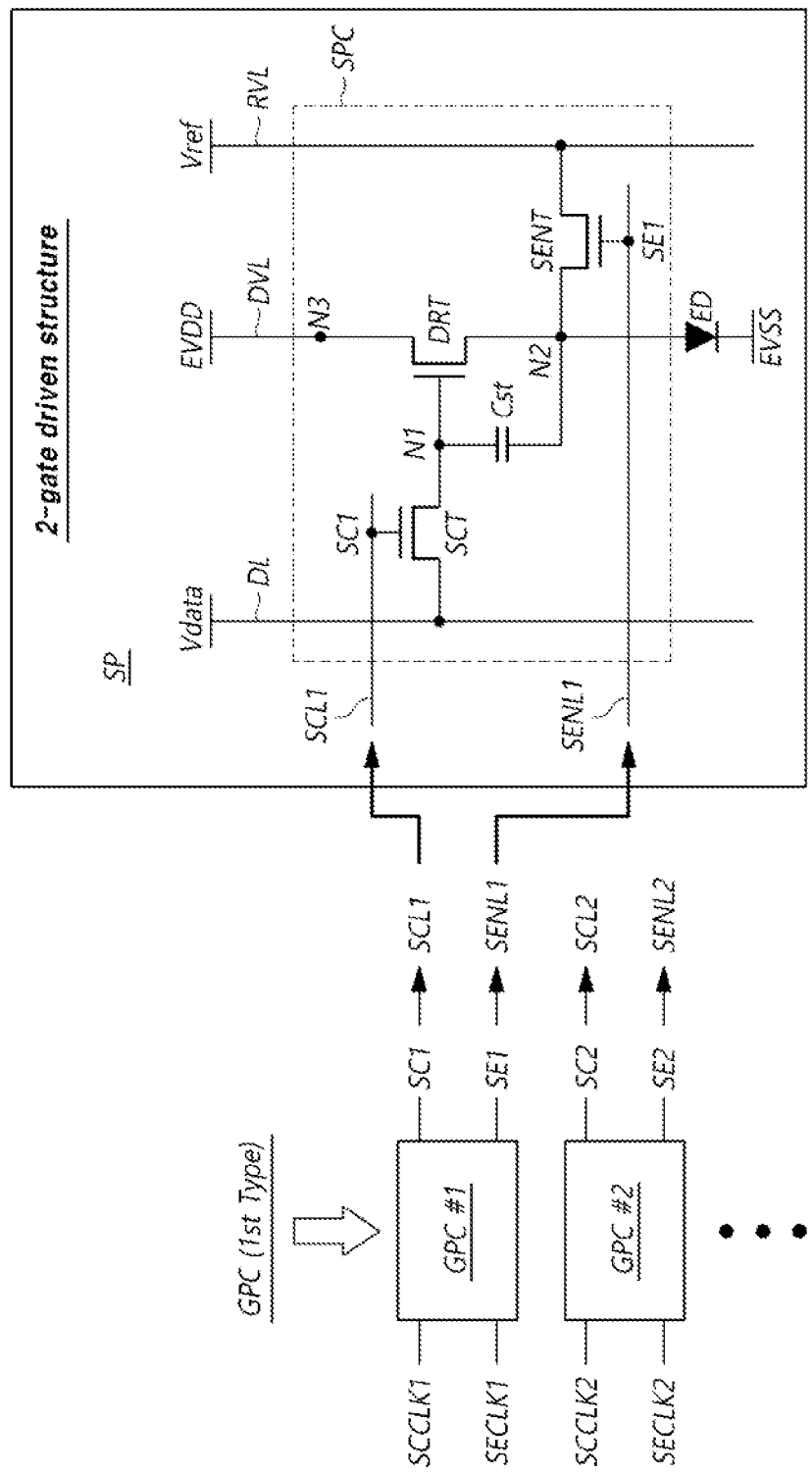
FIG. 9A illustrates inputs and outputs of an example gate driving panel circuit in an example where the gate driving panel circuit is configured with a first type in the display device according to aspects of the present disclosure.

FIG. 9A illustrates inputs and outputs of an example gate driving panel circuit GPC in an example where the gate driving panel circuit GPC is configured with a first type (which may be referred to as a "first type of gate driving panel circuit GPC") in the display device 100 according to aspects of the present disclosure.

Referring to FIG. 9A, in examples where each subpixel SP disposed in the display panel 110 has the two-gate driven structure (see FIG. 4A), the gate driving panel circuit GPC may be configured with the first type.

Referring to FIG. 9A, in the example where the first type of gate driving panel circuit GPC is applied, a first gate driving panel circuit GPC #1 included in the gate driving panel circuit GPC may receive a first scan clock signal SCCLK1 and a first sensing clock signal SECLK1, and output a first scan signal SC1 and a first sensing signal SE1.

The first scan clock signal SCCLK1 and the first sensing clock signal SECLK1 may be output by a level shifter L/S.

The first scan signal SC1 and the first sensing signal SE1 may be applied to a first scan signal line SCL1 and a first sensing signal line SENL1, respectively.

Referring to FIG. 9A, in the example where the first type of gate driving panel circuit GPC is applied, a second gate driving panel circuit GPC #2 included in the gate driving panel circuit GPC may receive a second scan clock signal SCCLK2 and a second sensing clock signal SECLK2, and output a second scan signal SC2 and a second sensing signal SE2.

The second scan clock signal SCCLK2 and the second sensing clock signal SECLK2 may be output by a level shifter L/S.

The second scan signal SC2 and the second sensing signal SE2 may be applied to a second scan signal line SCL2 adjacent to the first scan signal line SCL1 and a second sensing signal line SENL2 adjacent to the first sensing signal line SENL1, respectively.

Figure 9B:
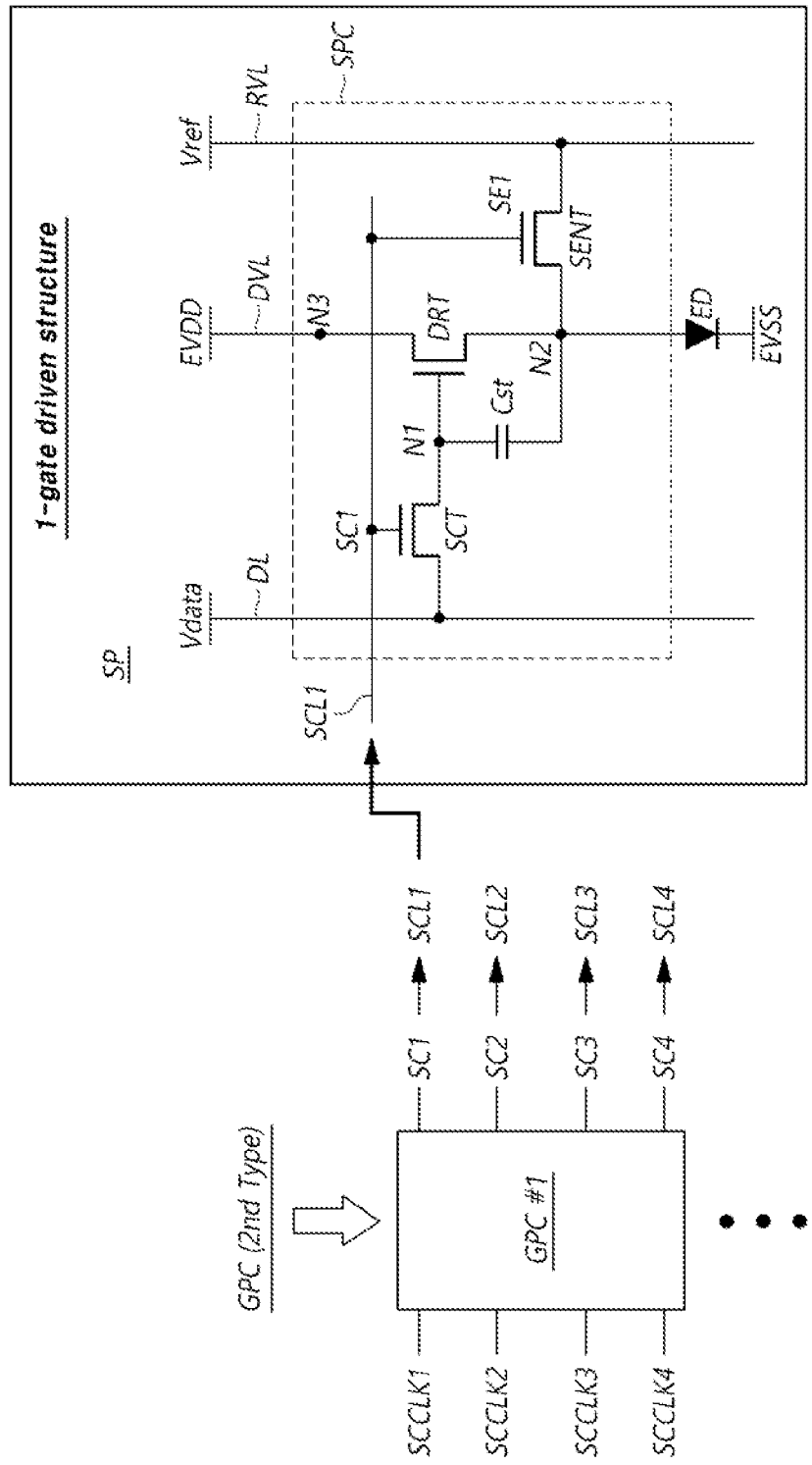
FIG. 9B illustrates inputs and outputs of an example gate driving panel circuit in an example where the gate driving panel circuit is configured with a second type in the display device according to aspects of the present disclosure.

FIG. 9B illustrates inputs and outputs of an example gate driving panel circuit GPC in an example where the gate driving panel circuit GPC is configured with a second type (which may be referred to as a "second type of gate driving panel circuit GPC") in the display device 100 according to aspects of the present disclosure.

Referring to FIG. 9B, in examples where each subpixel SP disposed in the display panel 110 has the one-gate driven structure (see FIG. 4B), the gate driving panel circuit GPC may be configured with the second type.

Referring to FIG. 9B, in the example where the second type of gate driving panel circuit GPC is applied, a first gate driving panel circuit GPC1 included in the gate driving panel circuit GPC may receive a first scan clock signal SCCLK1, a second scan clock signal SCCLK2, a third scan clock signal SCCLK3, and a fourth scan clock signal SCCLK4, and output a first scan signal SC1, a second scan signal SC2, a third scan signal SC3, and a fourth scan signal SC4.

The first scan clock signal SCCLK1, the second scan clock signal SCCLK2, the third scan clock signal SCCLK3, and the fourth scan clock signal SCCLK4 may be output by a level shifter L/S.

The first scan signal SC1 may be applied to a first scan signal line SCL1. The second scan signal SC2, the third scan signal SC3, and the fourth scan signal SC4 respectively may be applied to a second scan signal line SCL2, a third scan signal line SCL3, and a fourth scan signal line SCL4, which are adjacent to the first scan signal line SCL1.

Figure 10:
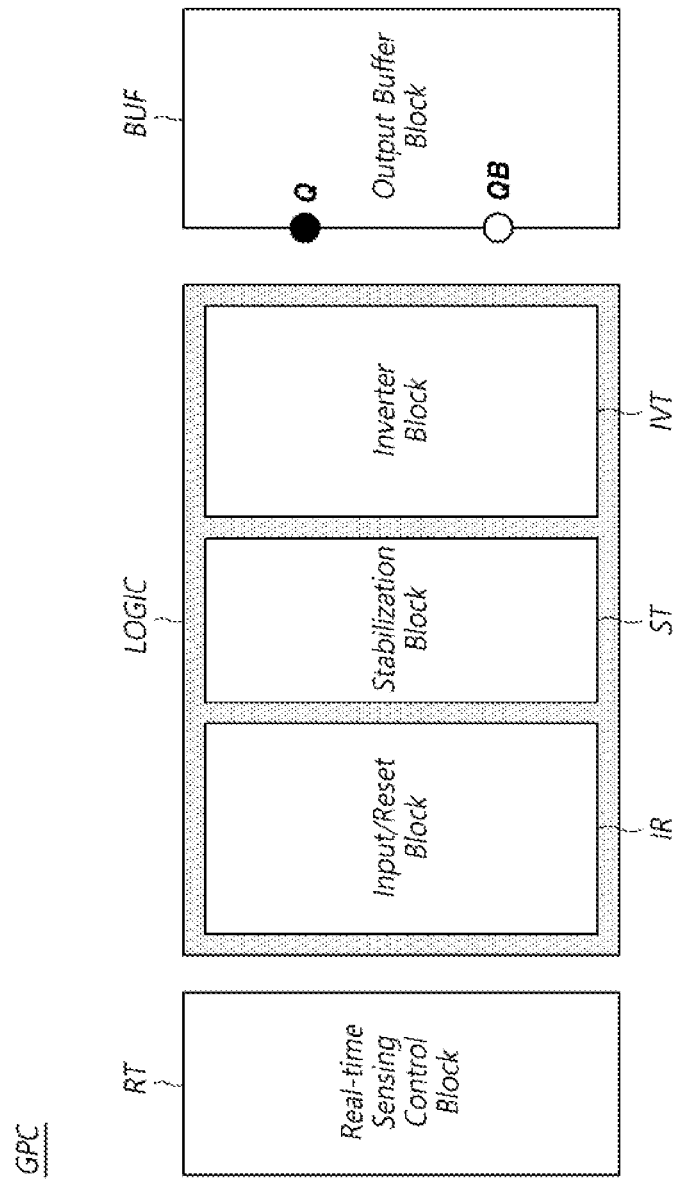
FIG. 10 illustrates an example system configuration of a gate driving panel circuit in the display device according to aspects of the present disclosure.

FIG. 10 illustrates an example system configuration of a gate driving panel circuit (e.g., the first type of gate driving panel circuit in FIG. 9A or the second type of gate driving panel circuit in FIG. 9B) in the display device 100 according to aspects of the present disclosure.

Referring to FIG. 10, the gate driving panel circuit GPC may include an output buffer block BUF, a logic block LOGIC, and a real-time sensing control block RT.

Referring to FIG. 10, the output buffer block BUF may be configured to output two or more gate signals.

In the example where the first type of gate driving panel circuit GPC is applied, the output buffer block BUF may output at least one scan signal SC and at least one sensing signal SE.

In the example where the first type of gate driving panel circuit GPC is applied, a subpixel SP may have the two-gate driven structure as illustrated in FIG. 4A.

In the example where the second type of gate driving panel circuit GPC is applied, the output buffer block BUF may output two or more scan signals SC.

In the example where the second type of gate driving panel circuit GPC is applied, a subpixel SP may have the one-gate driven structure as illustrated in FIG. 4B.

Referring to FIG. 10, the output buffer block BUF may be controlled depending on respective voltage values or voltage levels of a Q node and a QB node. The operation and output of the output buffer block BUF may vary depending on the voltage values or voltage levels of the Q node and QB node.

The Q node and QB node may have different voltage levels. For example, during a first period, when a voltage of the Q node is a high level voltage, a voltage of the QB node may be a low level voltage. During a second period before or after the first period, when a voltage of the Q node is a low level voltage, a voltage of the QB node may be a high level voltage.

Referring to FIG. 10, the logic block LOGIC may be a circuit configured to control the operation of the output buffer block BUF and implement the operation of a shift register. The logic block LOGIC may control voltages of the Q node and QB node to control the operation of the output buffer block BUF.

Referring to FIG. 10, the logic block LOGIC may include an input and reset block IR, a stabilization block ST, an inverter block IVT, and the like.

The input and reset block IR may be a circuit configured to control charging and discharging of the Q node. The inverter block IVT may be configured to control an electrical value (or level) of the Q node or the QB node such that a voltage level resulting from inverting a voltage level of the Q node becomes a voltage level of the QB node depending on a voltage of the Q node. The stabilization block ST may be configured to stabilize the Q node and the output of the gate driving panel circuit GPC depending on a voltage of the QB node during a period during which an output signal of the gate driving panel circuit GPC has a turn-off level voltage.

Each of the input and reset block IR, the stabilization block ST, and inverter block IVT may include at least one transistor.

The real-time sensing control block RT may be a circuit configured to control the operation of the output buffer block BUF for real-time sensing driving. The real-time sensing driving may be a sensing driving performed in real time while the display is being driven, and be a sensing driving performed in each blank period BLANK between active periods ACT (see FIG. 7). The real-time sensing driving may proceed in the second sensing mode corresponding to a fast sensing mode (see FIG. 6B). The real-time sensing driving may be a sensing driving for sensing the mobility of a corresponding driving transistor DRT of each subpixel SP (see FIG. 6B).

The real-time sensing control block RT may include at least one transistor.

In the example where the first type of gate driving panel circuit GPC is applied, the real-time sensing control block RT may control voltages of the Q node and the QB node so that the output buffer block BUF may output a scan signal SC and a sensing signal SE to a subpixel SP where real-time sensing driving is performed.

In the example where the second type of gate driving panel circuit GPC is applied, the real-time sensing control block RT may control voltages of the Q node and the QB node so that the output buffer block BUF may output at least one scan signal SC to a subpixel SP where real-time sensing driving is performed.

Figure 11:
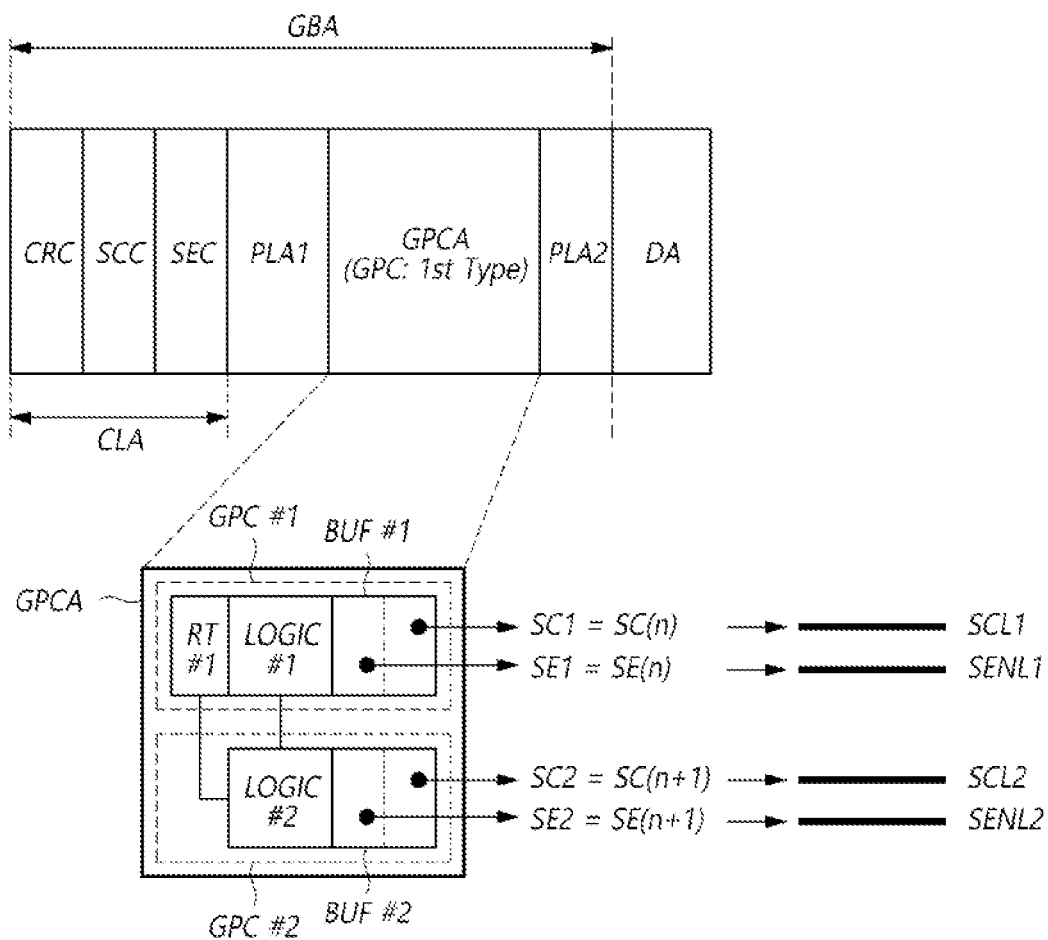
FIG. 11 illustrates, in the example where the first type of gate driving panel circuit is applied, an example configuration of a gate bezel area of the display panel according to aspects of the present disclosure.

FIG. 11 illustrates, in the example where the first type of gate driving panel circuit GPC is applied, an example configuration of the gate bezel area GBA of the display panel 110 according to aspects of the present disclosure.

Referring to FIG. 11, in one or more aspects, the gate bezel area GBA of the display panel 110 may include a clock signal line area CLA, a first power line area PLA1, a gate driving panel circuit area GPCA, a second power line area PLA2, and the like.

The gate driving panel circuit area GPCA may be an area in which the first type (1st Type) of gate driving panel circuit GPC is disposed. The first type (1st Type) of gate driving panel circuit GPC may output scan signals SC and sensing signals SE to be supplied to subpixels SP having the two-gate driven structure.

In an aspect, several types of lines for carrying power, voltage, and signals to the gate driving panel circuit GPC may be disposed around the gate driving panel circuit area GPCA. For example, the clock signal line area CLA, the first power line area PLA1, and the second power line area PLA2 may be disposed around the gate driving panel circuit area GPCA of the gate bezel area GBA.

For example, the clock signal line area CLA and the first power line area PLA1 may be located on a first side of the gate driving panel circuit area GPCA, and the second power line area PLA2 may be located on a second opposing side of the gate driving panel circuit area GPCA.

For example, the gate driving panel circuit area GPCA may be located on a first side of the second power line area PLA2, and the display area DA may be located on a second opposing side of the second power line area PLA2.

The clock signal line area CLA may be an area in which clock signal lines are disposed for delivering several types of clock signals to the gate driving panel circuit GPC.

The first power line area PLA1 may be an area in which a plurality of first lines are disposed.

The plurality of first lines may include at least one gate high voltage line for delivering at least one gate high voltage to the gate driving panel circuit GPC.

In an aspect, the plurality of first lines disposed in the first power line area PLA1 may further include at least one control signal line for delivering at least one control signal to the gate driving panel circuit GPC. For example, the at least one control signal may include at least one of a start signal, a reset signal, and a line selection signal.

The second power line area PLA2 may be an area in which a plurality of second lines are disposed.

The plurality of second lines may include at least one gate low voltage line for delivering at least one gate low voltage to the gate driving panel circuit GPC.

Referring to FIG. 11, in the example where the first type of gate driving panel circuit GPC is applied, the clock signal line area CLA may include a carry clock signal line area CRC, a scan clock signal line area SCC, and a sensing clock signal line area SEC.

The carry clock signal line area CRC may be an area in which carry clock signal lines are disposed for delivering carry clock signals to the gate driving panel circuit GPC.

The scan clock signal line area SCC may be an area in which scan clock signal lines are disposed for delivering scan clock signals to the gate driving panel circuit GPC.

The sensing clock signal line area SEC may be an area in which sensing clock signal lines are disposed for delivering sensing clock signals to the gate driving panel circuit GPC.

An order in which the carry clock signal line area CRC, the scan clock signal line area SCC, and the sensing clock signal line area SEC are located may be set in various orders (e.g., CRC-SCC-SEC, SCC-CRC-SEC, SCC-SEC-CRC, SEC-SCC-CRC, or the like).

For example, among the carry clock signal line area CRC, the scan clock signal line area SCC, and the sensing clock signal line area SEC, the scan clock signal line area SCC may be located between the carry clock signal line area CRC and the sensing clock signal line area SEC, and the carry clock signal line area CRC may be located further away from the display area DA or the gate driving panel circuit area GPCA than the sensing clock signal line area SEC.

Referring to FIG. 11, in the example where the first type of gate driving panel circuit GPC is applied, the gate driving panel circuit GPC disposed in the gate driving panel circuit area GPCA may include a first gate driving panel circuit GPC #1 (e.g., the first gate driving panel circuit GPC #1 of FIG. 9A) and a second gate driving panel circuit GPC #2 (e.g., the second gate driving panel circuit GPC #2 of FIG. 9B). Each of the first gate driving panel circuit GPC #1 and the second gate driving panel circuit GPC #2 may have a separate Q node and a separate QB node.

The first gate driving panel circuit GPC #1 may include a first output buffer block BUF #1, a first logic block LOGIC #1, and a first real-time sensing control block RT #1.

The first output buffer block BUF #1 may be configured to output a first scan signal SC1 and a first sensing signal SE1 respectively to a first scan signal line SCL1 and a first sensing signal line SENL1 connected to a first subpixel SP. For example, the first scan signal SC1 may be an nth scan signal SC(n), and the first sensing signal SE1 may be an nth sensing signal SE(n).

The first logic block LOGIC #1 may be configured to control operation of the first output buffer block BUF #1 by controlling respective voltages of the Q node and the QB node of the first gate driving panel circuit GPC #1.

The second gate driving panel circuit GPC #2 may include only a second output buffer block BUF #2 and a second logic block LOGIC #2.

The second output buffer block BUF #2 may be configured to output a second scan signal SC2 and a second sensing signal SE2 respectively to a second scan signal line SCL2 and a second sensing signal line SENL2 connected to a second subpixel SP. For example, the second scan signal SC2 may be an (n+1)th scan signal SC(n+1), and the second sensing signal SE2 may be an (n+1)th sensing signal SE(n+1).

The second logic block LOGIC #2 may be configured to control operation of the second output buffer block BUF #2 by controlling respective voltages of the Q node and the QB node of the second gate driving panel circuit GPC #2.

The first real-time sensing control block RT #1 may be shared by the first gate driving panel circuit GPC #1 and the second gate driving panel circuit GPC #2. Accordingly, the size of the gate bezel area GBA may be significantly reduced.

The first real-time sensing control block RT #1 may be configured to control operation of the first output buffer block BUF #1 so that the first output buffer block BUF #1 may output a first scan signal SC1 and a first sensing signal SE1 for sensing driving to a corresponding first subpixel SP where real-time sensing driving will be performed by controlling respective voltages of the Q node and QB node of the first gate driving panel circuit GPC #1 during a first real-time sensing driving period (a first blank period).

The first real-time sensing control block RT #1 may be configured to control operation of the second output buffer block BUF #2 so that the second output buffer block BUF #2 may output a second scan signal SC2 and a second sensing signal SE2 for sensing driving to a corresponding second subpixel SP where real-time sensing driving will be performed by controlling respective voltages of the Q node and QB node of the second gate driving panel circuit GPC #2 during a second real-time sensing driving period (a second blank period), which is different from the first real-time sensing driving period (the first blank period).

At least one specific node of the first logic block LOGIC #1 and at least one specific node of the second logic block LOGIC #2 may be electrically connected to each other.

Referring to FIG. 11, among the first output buffer block BUF #1, the first logic block LOGIC #1, and the first real-time sensing control block RT #1, the first real-time sensing control block RT #1 may be located furthest away from the display area DA.

Referring to FIG. 11, the gate driving panel circuit area GPCA may be disposed between the first power line area PLA1 and the second power line area PLA2.

Accordingly, at least one gate high voltage line disposed in the first power line area PLA1 and at least one gate low voltage line disposed in the second power line area PLA2 may be separated by the gate driving panel circuit GPC disposed in the gate driving panel circuit area GPCA.

According to the configuration of the power-related lines and areas discussed above, since at least one high voltage line and at least one low voltage line do not overlap with each other, one or more high voltages (e.g., GVDD, GVDD2, and GVDD_o in FIG. 12) and one or more low voltages (e.g., GVSS0, GVSS1, and GVSS2 of FIG. 12) may be stabilized or stably supplied.

Figure 12:
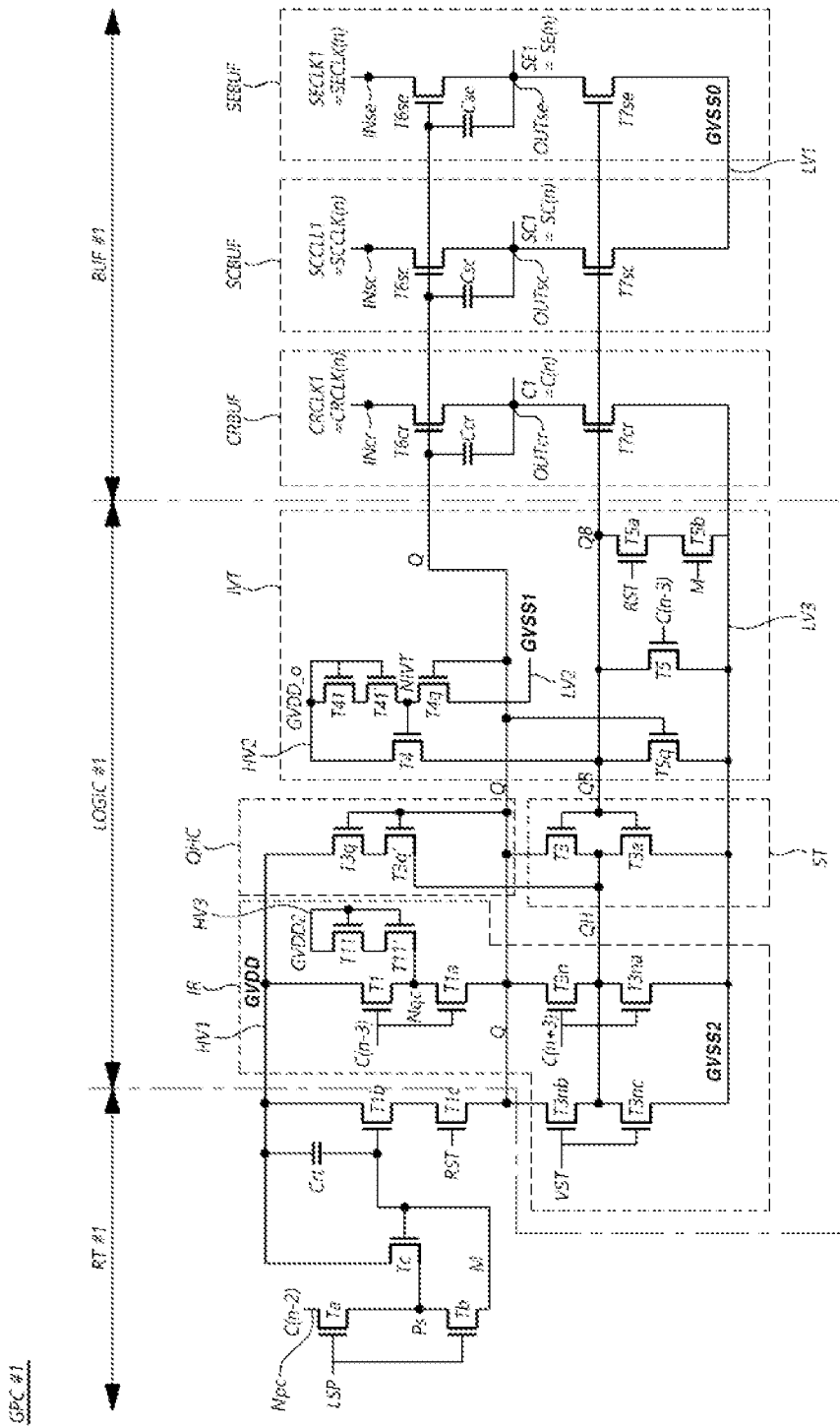
FIG. 12 illustrates, in the example where the first type of gate driving panel circuit is applied, an example first gate driving panel circuit included in the gate driving panel circuit in the display device according to aspects of the present disclosure.

FIG. 12 illustrates, in the example where the first type of gate driving panel circuit GPC is applied, an example first gate driving panel circuit GPC #1 included in the gate driving panel circuit GPC in the display device 100 according to aspects of the present disclosure.

In this implementation, the first gate driving panel circuit GPC #1 may be configured to output an odd-numbered nth scan signal SC(n) and an odd-numbered nth sensing signal SE(n). The nth scan signal SC(n) may be supplied to an odd-numbered nth scan signal line SCL, and the nth sensing signal SE(n) may be supplied to an odd-numbered nth sensing signal line SENL. Hereinafter, for convenience of description, the nth scan signal SC(n) may be also referred to as a first scan signal SC1, and the nth sensing signal SE(n) may be also referred to as a first sensing signal SE1.

Referring to FIG. 12, the first gate driving panel circuit GPC #1 may include a first output buffer block BUF #1, a first logic block LOGIC #1, and a first real-time sensing control block RT #1.

Referring to FIG. 12, the first output buffer block BUF #1 may include a carry output buffer CRBUF, a scan output buffer SCBUF, and a sensing output buffer SEBUF.

Referring to FIG. 12, the carry output buffer CRBUF may include a carry pull-up transistor T6$cr$ and a carry pull-down transistor T7$cr$.

The carry pull-up transistor T6$cr$ may be turned on or turned off depending on a voltage of a Q node, and thereby, control a connection between a carry clock node INcr to which an nth carry clock signal CRCLK(n) is input and a carry output node OUTcr from which an nth carry signal C(n) is output. Here, the nth carry clock signal CRCLK(n) may also be referred to as a first carry clock signal CRCLK1, and the nth carry signal C(n) may also be referred to as a first carry signal C1.

The gate node of the carry pull-up transistor T6$cr$ may be the Q node or be electrically connected to the Q node. The source node (or drain node) of the carry pull-up transistor T6$cr$ may be the carry output node OUTcr or be electrically connected to the carry output node OUTcr. The drain node (or source node) of the carry pull-up transistor T6$cr$ may be the carry clock node INcr or be electrically connected to the carry clock node INcr.

When the carry pull-up transistor T6$cr$ is turned on, the carry pull-up transistor T6$cr$ may output the first carry signal C1 having a high level voltage using the first carry clock signal CRCLK1.

The carry output buffer CRBUF may further include a carry bootstrapping capacitor Ccr connected between the gate node and the source node (or drain node) of the carry pull-up transistor T6$cr$.

The carry pull-down transistor T7$cr$ may be turned on or turned off depending on a voltage of a QB node, and thereby, control a connection between a third gate low voltage node LV3 to which a third gate low voltage GVSS2 is input and the carry output node OUTcr from which the nth carry signal C(n) is output.

The gate node of the carry pull-down transistor T7$cr$ may be the QB node or may be electrically connected to the QB node. The drain node or source node of the carry pull-down transistor T7$cr$ may be the third gate low voltage node LV3 or be electrically connected to the third gate low voltage node LV3, and the source node or drain node of the carry pull-down transistor T7$cr$ may be the carry output node OUTcr or be electrically connected to the carry output node OUTcr.

When the carry pull-down transistor T7$cr$ is turned on, the carry pull-down transistor T7$cr$ may output the first carry signal C1 having a low level voltage using the third gate low voltage GVSS2.

Referring to FIG. 12, the scan output buffer SCBUF may be configured to output an nth scan clock signal SCCLK(n) having a turn-on level voltage or a turn-off level voltage to a scan output node OUTsc. The nth scan clock signal SCCLK(n) output to the scan output node OUTsc may be applied to a first scan signal line SCL1 electrically connected to the scan output node OUTsc.

Referring to FIG. 12, the scan output buffer SCBUF may include a scan pull-up transistor T6$sc$ and a scan pull-down transistor T7$sc$.

The scan pull-up transistor T6$sc$ may be turned on or turned off depending on a voltage of the Q node, and thereby, control a connection between a scan clock node INsc to which an nth scan clock signal SCCLK(n) is input and the scan output node OUTsc from which the nth scan signal SC(n) is output. Here, the nth scan clock signal SCCLK(n) may also be referred to as a first scan clock signal SCCLK1, and the nth scan signal SC(n) may also be referred to as a first scan signal SC1.

The gate node of the scan pull-up transistor T6$sc$ may be the Q node or be electrically connected to the Q node. The source node (or drain node) of the scan pull-up transistor T6$sc$ may be the scan output node OUTsc or be electrically connected to the scan output node OUTsc. The drain node (or source node) of the scan pull-up transistor T6$sc$ may be the scan clock node INsc or be electrically connected to the scan clock node INsc.

When the scan pull-up transistor T6$sc$ is turned on, the scan pull-up transistor T6$sc$ may output the first scan signal SC1 having a turn-on level voltage (e.g., a high level voltage) using the scan clock signal SCCLK to the scan output node OUTsc. The first scan signal SC1 having the turn-on level voltage (e.g., the high level voltage) output from the scan pull-up transistor T6$sc$ may be applied to the first scan signal line SCL1.

The scan output buffer SCBUF may further include a scan bootstrapping capacitor Csc connected between the gate node and the source node (or drain node) of the scan pull-up transistor T6$sc$.

The scan pull-down transistor T7$sc$ may be turned on or turned off depending on a voltage of the QB node, and thereby, control a connection between a first gate low voltage node LV1 to which a first gate low voltage GVSS0 is input and the scan output node OUTsc from which the nth scan signal SC(n) is output.

The gate node of the scan pull-down transistor T7$sc$ may be the QB node or may be electrically connected to the QB node. The drain node or source node of the scan pull-down transistor T7$sc$ may be the first gate low voltage node LV1 or be electrically connected to the first gate low voltage node LV1. The source node or drain node of the scan pull-down transistor T7$sc$ may be the scan output node OUTsc or be electrically connected to the scan output node OUTsc.

When the scan pull-down transistor T7sc is turned on, the scan pull-down transistor T7sc may output the first scan signal SC1 having a turn-off level voltage (e.g., a low level voltage) using the first gate low voltage GVSS0 to the scan output node OUTsc. The first scan signal SC1 having the turn-off level voltage (e.g., the low level voltage) output from the scan pull-down transistor T7sc may be applied to the first scan signal line SCL1.

Referring to FIG. 12, the sensing output buffer SEBUF may be configured to output an nth sensing clock signal SECLK(n) having a turn-on level voltage or a turn-off level voltage to a sensing output node OUTse. The nth sensing clock signal SECLK(n) output to the sensing output node OUTse may be applied to a first sensing signal line SENL1 electrically connected to the sensing output node OUTse.

Referring to FIG. 12, the sensing output buffer SEBUF may include a sensing pull-up transistor T6se and a sensing pull-down transistor T7se.

The sensing pull-up transistor T6se may be turned on or turned off depending on a voltage of the Q node, and thereby, control a connection between a sensing clock node INse to which an nth sensing clock signal SECLK(n) is input and the sensing output node OUTse from which the nth sensing signal SE(n) is output. Here, the nth sensing clock signal SECLK(n) may also be referred to as a first sensing clock signal SECLK1, and the nth sensing signal SE(n) may also be referred to as a first sensing signal SEL.

The gate node of the sensing pull-up transistor T6se may be the Q node or be electrically connected to the Q node. The source node (or drain node) of the sensing pull-up transistor T6se may be the sensing output node OUTse or be electrically connected to the sensing output node OUTse. The drain node (or source node) of the sensing pull-up transistor T6se may be the sensing clock node INse or be electrically connected to the sensing clock node INse.

When the sensing pull-up transistor T6se is turned on, the sensing pull-up transistor T6se may output the first sensing signal SE1 having a turn-on level voltage (e.g., a high level voltage) using the sensing clock signal SECLK to the sensing output node OUTse. The first sensing signal SE1 having the turn-on level voltage (e.g., the high level voltage) output from the sensing pull-up transistor T6se may be applied to the first sensing signal line SENL1.

The sensing output buffer SEBUF may further include a sensing bootstrapping capacitor Cse connected between the gate node and the source node (or drain node) of the sensing pull-up transistor T6se.

The sensing pull-down transistor T7se may be turned on or turned off depending on a voltage of the QB node, and thereby, control a connection between the first gate low voltage node LV1 to which the first gate low voltage GVSS0 is input and the sensing output node OUTse from which the nth sensing signal SE(n) is output.

The gate node of the sensing pull-down transistor T7se may be the QB node or may be electrically connected to the QB node. The drain node or source node of the sensing pull-down transistor T7se may be the first gate low voltage node LV1 or be electrically connected to the first gate low voltage node LV1. The source node (or drain node) of the sensing pull-down transistor T7se may be the sensing output node OUTse or be electrically connected to the sensing output node OUTse.

When the sensing pull-down transistor T7se is turned on, the sensing pull-down transistor T7se may output the first sensing signal SE1 having a turn-off level voltage (e.g., a low level voltage) using the first gate low voltage GVSS0 to the sensing output node OUTse. The first sensing signal SE1 having the turn-off level voltage (e.g., the low level voltage) output from the sensing pull-down transistor T7se may be applied to the first sensing signal line SENL1.

The respective gate nodes of the carry pull-up transistor T6cr, the scan pull-up transistor T6sc, and the sensing pull-up transistor T6se included in the first output buffer block BUF #1 may be electrically connected to each other.

The Q node may be shared by the carry output buffer CRBUF, the scan output buffer SCBUF, and the sensing output buffer SEBUF included in the first output buffer block BUF #1. The Q node may be electrically connected to the gate node of the carry pull-up transistor T6cr, the gate node of the scan pull-up transistor T6sc, and the gate node of the sensing pull-up transistor T6se. This structure may also be referred to as a "Q node sharing structure."

The respective gate nodes of the carry pull-down transistor T7cr, the scan pull-down transistor T7sc, and the sensing pull-down transistor T7se included in the first output buffer block BUF #1 may be electrically connected to each other.

The QB node may be shared by the carry output buffer CRBUF, the scan output buffer SCBUF, and the sensing output buffer SEBUF included in the first output buffer block BUF #1. The QB node may be electrically connected to the gate node of the carry pull-down transistor T7cr, the gate node of the scan pull-down transistor T7sc, and the gate node of the sensing pull-down transistor T7se.

Referring to FIG. 12, the first logic block LOGIC #1 may be a circuit configured to control voltages of the Q node and QB node to control operation of the first output buffer block BUF #1, and include an input and reset block IR, a stabilization block ST, and an inverter block IVT.

Referring to FIG. 12, the input and reset block IR may be a circuit configured to control charging and discharging of the Q node and include a Q node charging block connected between a first gate high voltage node HV1 and the Q node and a Q node discharging block connected between the Q node and the third gate low voltage node LV3. For example, a first gate high voltage GVDD may be input to the first gate high voltage node HV1. The third gate low voltage GVSS2 may be input to the third gate low voltage node LV3.

Referring to FIG. 12, to cause the Q node to charge, the Q node charging block of the input and reset block IR may include at least one Q node charging transistor, which may be turned on or turned off by an (n−3)th carry signal C(n−3) and thereby, control a connection between the first gate high voltage node HV1 and the Q node.

For example, the Q node charging block of the input and reset block IR may include a first Q node charging transistor T1 and a second Q node charging transistor T1a connected in series between the first gate high voltage node HV1 and the Q node.

The gate node of the first Q node charging transistor T1 and the gate node of the second Q node charging transistor T1a may be electrically connected to each other, and receive the (n−3)th carry signal C(n−3) together.

The first Q node charging transistor T1 may be connected between the first gate high voltage node HV1 and a Q node charging control node Nqc, and the second Q node charging transistor T1a may be connected between the Q node charging control node Nqc and the Q node.

Referring to FIG. 12, to control the Q node charging control node Nqc, the Q node charging block of the input and reset block IR may further include a first Q node charging control transistor T11 and a second Q node charging control transistor T11' connected in series between a third gate high voltage node HV3 and the Q node charging control node Nqc. For example, a third gate high voltage GVDD2 may be applied to the third gate high voltage node HV3.

The gate node of the first Q node charge control transistor T11 and the gate node of the second Q node charge control transistor T11' may be electrically connected to each other and be connected to the third gate high voltage node HV3 together.

Referring to FIG. 12, to cause the Q node to discharge, the Q node discharging block of the input and reset block IR may include a first Q node discharging transistor T3n and a second Q node discharging transistor T3na connected in series between the Q node and the third gate low voltage node LV3.

The first Q node discharging transistor T3n and the second Q node discharging transistor T3na may be turned on or turned off together by an (n+3)th carry signal C(n+3), and control a connection between the Q node and the third gate low voltage node LV3.

The first Q node discharging transistor T3n may be connected between the Q node and a holding node (QH node), and the second Q node discharging transistor T3na may be connected between the holding node (QH node) and the third gate low voltage node LV3.

The gate node of the first Q node discharging transistor T3n and the gate node of the second Q node discharging transistor T3na may be electrically connected to each other, and may receive the (n+3)th carry signal C(n+3) together.

Referring to FIG. 12, to cause the Q node to discharge, the Q node discharging block of the input and reset block IR may further include a third Q node discharging transistor T3nb and a fourth Q node discharging transistor T3nc connected in series between the Q node and the third gate low voltage node LV3.

The third Q node discharging transistor T3nb and the fourth Q node discharging transistor T3nc may be turned on or turned off together by a start signal VST and control a connection between the Q node and the third gate low voltage node LV3.

The third Q node discharging transistor T3nb may be connected between the Q node and the holding node (e.g., the QH node), and the fourth Q node discharging transistor T3nc may be connected between the holding node (e.g., the QH node) and the third gate low voltage node LV3.

Referring to FIG. 12, the stabilization block ST may be a circuit configured to stabilize the Q node and the output of the gate driving panel circuit GPC depending on a voltage of the QB node during a period during which an output signal of the gate driving panel circuit GPC has a turn-off level voltage.

Referring to FIG. 12, the stabilization block ST may include a first stabilization transistor T3 and a second stabilization transistor T3a, which may be turned on or turned off depending on a voltage of the QB node and thereby, control a connection between the Q node and the third gate low voltage node LV3.

The first stabilization transistor T3 may be connected between the Q node and the holding node (QH node). The first stabilization transistor T3 may be turned on or turned off depending on a voltage of the QB node, and thereby, control a connection between the Q node and the holding node (QH node).

The second stabilization transistor T3a may be connected between the holding node (QH node) and the third gate low voltage node LV3. The second stabilization transistor T3a may be turned on or turned off depending on a voltage of the QB node, and thereby, control a connection between the holding node (QH node) and the third gate low voltage node LV3.

Referring to FIG. 12, the inverter block IVT may be a circuit configured to control an electrical value (or level) of the Q node or the QB node such that depending on a voltage of the Q node, a voltage level resulting from inverting a voltage level of the Q node becomes a voltage level of the QB node.

Referring to FIG. 12, the inverter block IVT may include a QB node charging transistor T4 to cause the QB node to charge.

The QB node charging transistor T4 may be connected between a second gate high voltage node HV2 and the QB node. The QB node charging transistor T4 may be turned on or turned off depending on a voltage of an inverter control node NIVT, and thereby, control a connection between the second gate high voltage node HV2 and the QB node. For example, a second gate high voltage GVDD_o may be applied to the second gate high voltage node HV2.

Referring to FIG. 12, the inverter block IVT may further include a first inverter control transistor T4q for controlling the voltage of the inverter control node NIVT.

The first inverter control transistor T4q may be connected between the inverter control node NIVT and a second gate low voltage node LV2. The first inverter control transistor T4q may be turned on or turned off depending on a voltage of the Q node, and thereby, control a connection between the inverter control node NIVT and the second gate low voltage node LV2. For example, a second gate low voltage GVSS1 may be applied to the second gate low voltage node LV2.

As the Q node has a low level voltage, the first inverter control transistor T4q may be turned off. In this situation, the inverter control node NIVT may be in a state in which the second gate high voltage GVDD_o supplied by a second inverter control transistor T41 and a third inverter control transistor T41' is applied. Accordingly, the QB node charging transistor T4 may be turned on, and thereby, the second gate high voltage GVDD_o may be applied to the QB node (QB node charging).

As the Q node has a high level voltage, the first inverter control transistor T4q may be turned on, and thereby, pass the second gate low voltage GVSS1 to the inverter control node NIVT. Accordingly, the QB node charging transistor T4 may be turned off, thereby preventing the second gate high voltage GVDD_o from being applied to the QB node.

Referring to FIG. 12, the inverter block IVT may further include a second inverter control transistor T41 and a third inverter control transistor T41' for controlling the voltage of the inverter control node NIVT.

The second inverter control transistor T41 and a third inverter control transistor T41' may be connected between the second gate high voltage node HV2 and the inverter control node NIVT. The second inverter control transistor T41 and a third inverter control transistor T41' may be turned on or turned off depending on the second gate low voltage GVSS1, and thereby, control a connection between the gate high voltage node HV2 and the inverter control node NIVT.

The second inverter control transistor T41 and a third inverter control transistor T41' may always remain in a turn-on state, and may pass the second gate high voltage GVDD_o to the inverter control node NIVT.

Referring to FIG. 12, to cause the QB node to discharge, the inverter block IVT may include a first QB node discharging transistor T5 connected between the QB node and the third gate low voltage node LV3.

The first QB node discharging transistor T5 may be turned on or turned off depending on an (n−3)th carry signal C(n−3), and thereby, control a connection between the QB node and the third gate low voltage node LV3. When first QB node discharging transistor T5 is turned on, the third gate low voltage GVSS2 may be applied to the QB node. Accordingly, the QB node may be discharged.

Referring to FIG. 12, to cause the QB node to discharge, the inverter block IVT may further include a second QB node discharging transistor T5q connected between the QB node and the third gate low voltage node LV3.

The second QB node discharging transistor T5q may be turned on or turned off depending on a voltage of the Q node, and thereby, control a connection between the QB node and the third gate low voltage node LV3. When second QB node discharging transistor T5q is turned on, the third gate low voltage GVSS2 may be applied to the QB node. Accordingly, the QB node may be discharged.

Referring to FIG. 12, to cause the QB node to discharge, the inverter block IVT may further include a third QB node discharging transistor T5a and a fourth QB node discharging transistor T5b connected in series between the QB node and the third gate low voltage node LV3.

A reset signal RST may be input to the gate node of the third QB node discharging transistor T5a. That is, the third QB node discharging transistor T5a may be turned on or turned off depending on a voltage of the reset signal RST.

The gate node of the fourth QB node discharging transistor T5b may be electrically connected to an intermediate node M. That is, the fourth QB node discharging transistor T5b may be turned on or turned off depending on a voltage of the intermediate node M. For example, the intermediate node M may be a node included in the first real-time sensing control block RT #1.

Referring to FIG. 12, among the plurality of QB node discharging transistors (T5, T5q, T5a, and T5b) included in the inverter block IVT, the first QB node discharging transistor T5 and the second QB node discharging transistor T5q may be configured to discharge the QB node for display driving during an active period ACT, and the third QB node discharging transistor T5a and the fourth QB node discharging transistor T5b may be configured to discharge the QB node for sensing driving during a blank period BLANK.

Referring to FIG. 12, the first logic block LOGIC #1 may further include a holding node control block QHC for controlling a voltage of the holding node (QH node). The holding node control block QHC may be connected between the first gate high voltage node HV1 and the holding node (QH node).

Referring to FIG. 12, the holding node control block QHC may include a first holding node control transistor T3q and a second holding node control transistor T3q' connected in series between the first gate high voltage node HV1 and the holding node (QH node).

Respective gate nodes of the first holding node control transistor T3q and the second holding node control transistor T3q' may be connected to the Q node together.

When the Q node has a high level voltage, both the first holding node control transistor T3q and the second holding node control transistor T3q' may be turned on, and thereby, the first gate high voltage GVDD may be applied to the holding node (QH node). As the holding node (QH node) has the first gate high voltage GVDD, regardless of respective switching of the third Q node discharging transistor T3nb, the first Q node discharging transistor T3n, and the first stabilization transistor T3, the Q node may stably maintain a high level voltage.

Referring to FIG. 12, the first real-time sensing control block RT #1 may be a circuit configured to control operation of the first output buffer block BUF #1 for real-time sensing driving. The first real-time sensing control block RT #1 may be configured to control a voltage of the Q node so that a first scan signal SC1 and a first sensing signal SE1 may be output at a preset timing by the first output buffer block BUF #1 during a blank period BLANK.

Referring to FIG. 12, the first real-time sensing control block RT #1 may perform a control operation so that during a blank period BLANK, the first scan signal SC1 may be output by the first output buffer block BUF #1 to a corresponding one of a plurality of scan signal lines, and the first sensing signal SE1 may be output by the first output buffer block BUF #1 to a corresponding one of a plurality of sensing signal lines SENL. Through this operation, sensing driving may be performed for a subpixel SP included in a corresponding one of a plurality of subpixel lines (or subpixel arrays).

Referring to FIG. 12, the first real-time sensing control block RT #1 may include a first sensing control transistor Ta, a second sensing control transistor Tb, a third sensing control transistor Tc, and a fourth sensing control transistor T1b, and a fifth sensing control transistor T1c.

The first sensing control transistor Ta and the second sensing control transistor Tb may be connected in series between a previous carry input node Npc and the intermediate node M. For example, an (n−2)th carry signal C(n−2) may be input to the previous carry input node Npc.

In order that real-time sensing driving is performed for a subpixel SP intended to receive (or to be determined to receive) the first scan signal SC1 and the first sensing signal SE1 output from the first gate driving panel circuit GPC #1, the first gate driving panel circuit GPC #1 outputs the first scan signal SC1 and the first sensing signal SE1 as sensing driving gate signals during a real-time sensing driving period. For example, the real-time sensing driving period may be included in a blank period BLANK.

The first real-time sensing control block RT #1 may use a line selection signal LSP so that the first scan signal SC1 and the first sensing signal SE1 may be output as sensing driving gate signals during a real-time sensing driving period.

During a real-time sensing driving period, the line selection signal LSP may be commonly input to respective gate nodes of the first sensing control transistor Ta and the second sensing control transistor Tb. For example, the line selection signal LSP may be a pulse-shaped signal, and may be commonly applied to the gate nodes of the first sensing control transistor Ta and the second sensing control transistors Tb in a period between a start period and an end period of a frame.

The third sensing control transistor Tc may be turned on or turned off depending on a voltage of the intermediate node M, and thereby, control a connection between a connection point Ps and the first gate high voltage node HV1. For example, the connection point Ps may be a point at which the first sensing control transistor Ta and the second sensing control transistor Tb are connected.

The fourth sensing control transistor T1b and the fifth sensing control transistor T1c may be connected in series between the first gate high voltage node HV1 and the Q node.

The gate node of the fourth sensing control transistor T1b may be connected to the intermediate node M. A reset signal RST may be input to the gate node of the fifth sensing control transistor T1c.

During the real-time sensing driving period, each of the fourth sensing control transistor T1b and the fifth sensing control transistor T1c may be turned on depending on a voltage of the intermediate node M and the reset signal RST, and thereby, pass first gate high voltage GVDD to the Q node. Accordingly, the Q node may be charged during a real-time sensing operation period. For example, the real-time sensing driving period may be included in a blank period BLANK.

Referring to FIG. 12, the first real-time sensing control block RT #1 may include a sensing control capacitor Crt connected between the first gate high voltage node HV1 and the intermediate node M.

Figure 13A:
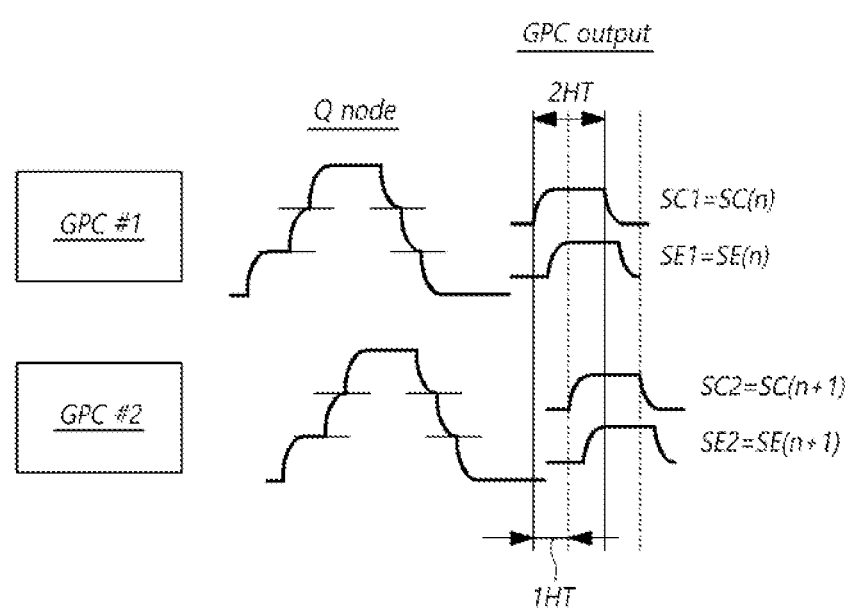
FIG. 13A illustrates, in the example where the first type of gate driving panel circuit is applied, respective example outputs and voltage changes at Q nodes of the first gate driving panel circuit and a second gate driving panel circuit included in the gate driving panel circuit in the display device according to aspects of the present disclosure.

FIG. 13A illustrates, in the example where the first type of gate driving panel circuit GPC is applied, respective example outputs and voltage changes at Q nodes of the first gate driving panel circuit GPC #1 and the second gate driving panel circuit GPC #2 included in the gate driving panel circuit GPC in the display device 100 according to aspects of the present disclosure.

Referring to FIG. 13A, voltage rising (e.g., boosting) may occur two or more times during a period during which a voltage of the Q node of the first gate driving panel circuit GPC #1 increases. Further, voltage rising may occur two or more times during a period during which a voltage of the Q node of the second gate driving panel circuit GPC #2 increases.

Referring to FIG. 13A, when the Q node of the first gate driving panel circuit GPC #1 has a high level voltage, the first gate driving panel circuit GPC #1 may output a first scan signal SC1 having a high level voltage and a first sensing signal SE1 having a high level voltage. A high level voltage period of the first sensing signal SE1 may proceed after a high level voltage period of the first scan signal SC1.

Referring to FIG. 13A, when the Q node of the second gate driving panel circuit GPC #2 has a high level voltage, the second gate driving panel circuit GPC #2 may output a second scan signal SC2 having a high level voltage and a second sensing signal SE2 having a high level voltage. A high level voltage period of the second sensing signal SE2 may proceed after a high level voltage period of the second scan signal SC2.

Referring to FIG. 13A, a time period of a respective high level voltage period of each of the first scan signal SC1 and the second scan signal SC2 may be two horizontal times 2HT (which may refer to a time period corresponding two horizontal periods).

Referring to FIG. 13A, the high level voltage period of the first scan signal SC1 and the high level voltage period of the second scan signal SC2 may overlap in time. A time period during which the high level voltage period of the first scan signal SC1 and the high level voltage period of the second scan signal SC2 overlap each other may be one horizontal time 1HT (which may refer to a time period corresponding one horizontal period). As described above, a gate driving scheme in which respective high level voltage periods of two scan signals (SC1 and SC2), which are output immediately adjacent to each other in time, overlap in time may be referred to as an "overlap gate driving scheme."

Referring to FIG. 13A, the high level voltage period of the first sensing signal SE1 and the high level voltage period of the second sensing signal SE2 may overlap in time. A time period during which the high level voltage period of the first sensing signal SE1 and the high level voltage period of the second sensing signal SE2 overlaps each other in time may be one horizontal time 1HT.

Figure 13B:
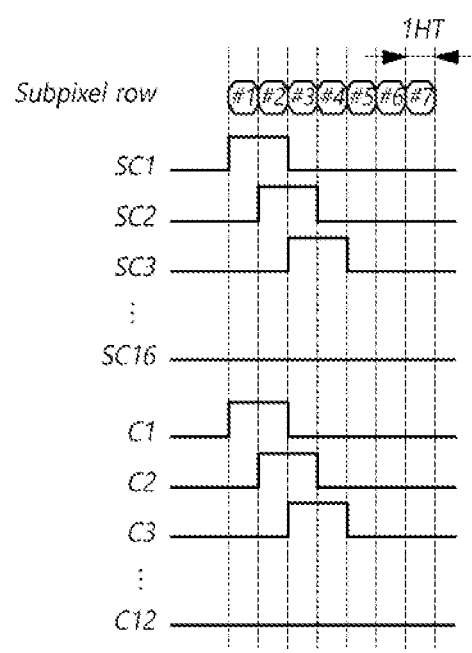
FIG. 13B illustrates, in the example where the first type of gate driving panel circuit is applied, example scan signals and carry signals produced from the gate driving panel circuit in the display device according to aspects of the present disclosure.

FIG. 13B illustrates, in the example where the first type of gate driving panel circuit GPC is applied, example scan signals (SC1 to SC16) and carry signals (C1 to C12) produced from the gate driving panel circuit GPC in the display device 100 according to aspects of the present disclosure.

Referring to FIG. 13B, the gate driving panel circuit GPC may supply a corresponding scan signal to each of a plurality of subpixel rows (e.g., subpixel row: #1, #2, #3, . . . , and #7). The gate driving panel circuit GPC may supply a first scan signal SC1, a second scan signal SC2, and a third scan signal SC3 to a first subpixel row #1, a second subpixel row #2, and a third subpixel row #3, respectively.

A time period of a respective high level voltage period of each of the scan signals (SC1 to SC16) may be two horizontal times 2HT. The second half of the high level voltage period of the first scan signal SC1 and the first half of the high level voltage period of the second scan signal SC2 may overlap by one horizontal time 1HT. The second half of the high level voltage period of the second scan signal SC2 and the first half of the high level voltage period of the third scan signal SC3 may overlap by one horizontal time 1HT.

Referring to FIG. 13B, the carry signals (C1 to C12) may be output by circuits or elements in the gate driving panel circuit GPC.

A time period of a respective high level voltage period of each of the carry signals (C1 to C12) may be two horizontal times 2HT. The second half of the high level voltage period of the first carry signal C1 and the first half of the high level voltage period of the second carry signal C2 may overlap by one horizontal time 1HT. The second half of the high level voltage period of the second carry signal C2 and the first half of the high level voltage period of the third carry signal C3 may overlap by one horizontal time 1HT.

Figure 14:
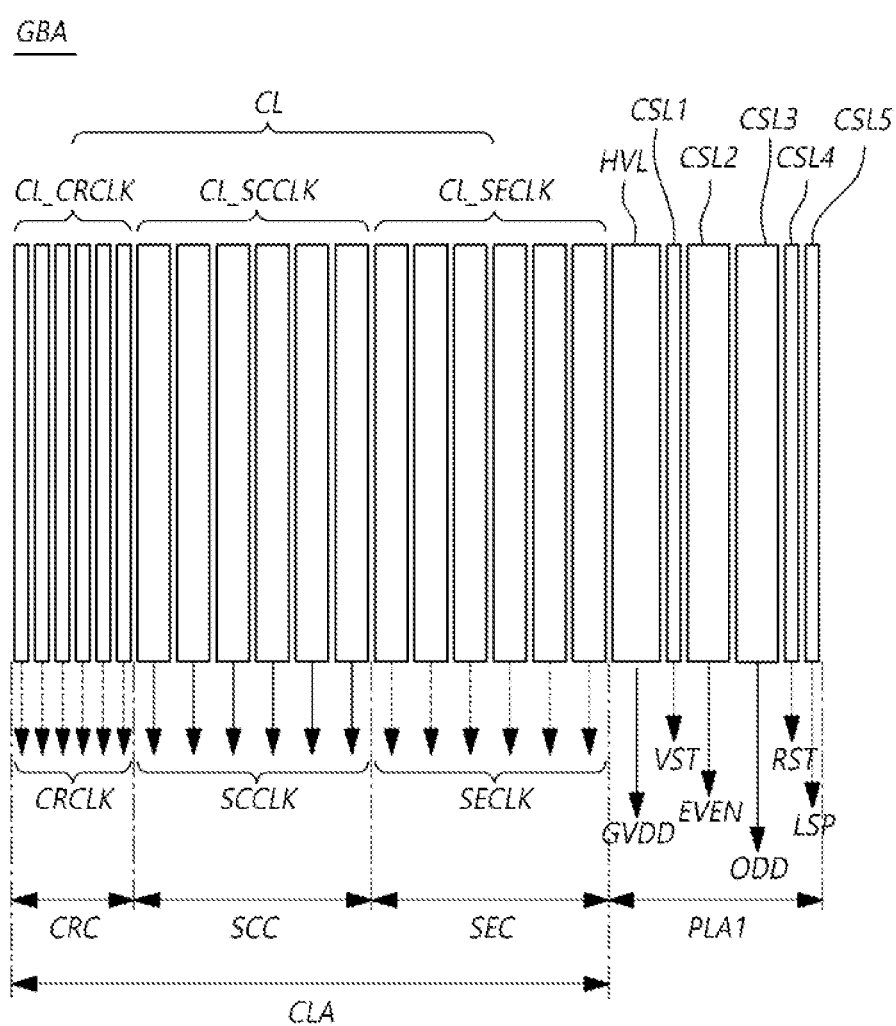
FIG. 14 illustrates, in the example where the first type of gate driving panel circuit is applied, an example line arrangement in a clock signal line area and a first power line area included in the gate bezel area in the display device according to aspects of the present disclosure.

FIG. 14 illustrates, in the example where the first type of gate driving panel circuit GPC (see FIG. 9A) is applied, an example line arrangement in a clock signal line area CLA and a first power line area PLA1 included in the gate bezel area GBA in the display device according to aspects of the present disclosure.

Referring to FIG. 14, the gate bezel area GBA of the display panel 110 may include the clock signal line area CLA and the first power line area PLA1. The clock signal line area CLA and the first power line area PLA1 may be located on a first side of a gate driving panel circuit area GPCA (e.g., the gate driving panel circuit area GPCA of FIG. 11) in which the first type of gate driving panel circuit GPC is disposed.

Referring to FIG. 14, in the example where the first type of gate driving panel circuit GPC is applied, the clock signal line area CLA in which a plurality of clock signal lines CL are disposed may include a carry clock signal line area CRC, a scan clock signal line area SCC, and a sensing clock signal line area SEC.

Carry clock signal lines CL_CRCLK for delivering carry clock signals CRCLK to the gate driving panel circuit GPC may be disposed in the carry clock signal line area CRC.

Scan clock signal lines CL_SCCLK for delivering scan clock signals SCCLK to the gate driving panel circuit GPC may be disposed in the scan clock signal line area SCC.

Sensing clock signal lines CL_SECLK for delivering sensing clock signals SECLK to the gate driving panel circuit GPC may be disposed in the sensing clock signal line area SEC.

Among the carry clock signal line area CRC, the scan clock signal line area SCC, and the sensing clock signal line area SEC, the scan clock signal line area SCC may be located between the carry clock signal line area CRC and the sensing clock signal line area SEC, the carry clock signal line area CRC may be located furthest away from the display area DA, and the sensing clock signal line area SEC may be located closest to the display area DA.

Among the carry clock signal line area CRC, the scan clock signal line area SCC, and the sensing clock signal line area SEC, the carry clock signal line area CRC may be located furthest away from the gate driving panel circuit area GPCA, and the sensing clock signal line area SEC may be located closest to the gate driving panel circuit area GPCA.

Referring to FIG. 14, in an aspect, a width of one scan clock signal line CL_SCCLK may be greater than that of one carry clock signal line CL_CRCLK. In an aspect, a width of one sensing clock signal line CL_SECLK may be greater than that of one carry clock signal line CL_CRCLK.

Referring to FIG. 14, at least one gate high voltage line HVL for delivering at least one gate high voltage GVDD to the gate driving panel circuit GPC may be disposed in the first power line area PLA1.

Referring to FIG. 14, at least one control signal line may be further disposed in the first power line area PLA1. For example, the at least one control signal line may include at least one of a start signal line CSL1 for delivering a start signal VST for indicating the start of gate driving operation to the gate driving panel circuit GPC, a first driving sequence control signal line CSL2 for delivering an even-numbered driving control signal EVEN to the gate driving panel circuit GPC, a second driving sequence control signal line CSL3 for delivering an odd-numbered driving control signal ODD to the gate driving panel circuit GPC, a reset signal line CSL4 for delivering a reset signal RST for indicating the end of the gate driving operation to the gate driving panel circuit GPC, and a line selection signal line CSL5 for delivering a line selection signal LSP to the gate driving panel circuit GPC.

The gate high voltage line HVL may have a greater width than the start signal line CSL1, the reset signal line CSL4, and the line selection signal line CSL5.

For example, the first driving sequence control signal line CSL2 and the second driving sequence control signal line CSL3 may be disposed in two specific line areas in the first power line area PLA1. In another example, instead of the first driving sequence control signal line CSL2 and the second driving sequence control signal line CSL3, two gate high voltage lines may be disposed in the two specific line areas in the first power line area PLA1.

Figure 15:
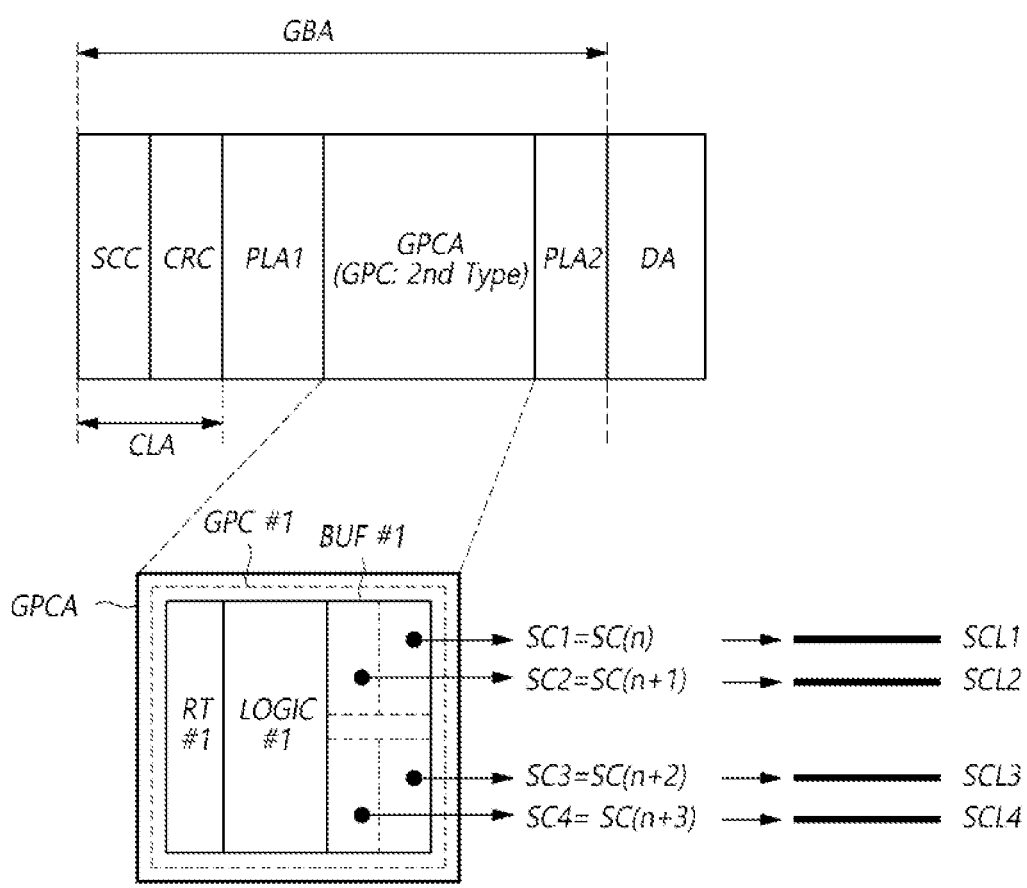
FIG. 15 illustrates, in the example where the second type of gate driving panel circuit is applied, an example configuration of the gate bezel area of the display panel according to aspects of the present disclosure.

FIG. 15 illustrates, in the example where the second type of gate driving panel circuit GPC is applied, an example configuration of the gate bezel area GBA of the display panel 110 according to aspects of the present disclosure.

Referring to FIG. 15, in one or more aspects, the gate bezel area GBA in the non-display area NDA of the display panel 110 may include a clock signal line area CLA, a first power line area PLA1, a gate driving panel circuit area GPCA, and a second power line area PLA2.

Referring to FIG. 15, an arrangement of the remaining sub-areas except for the clock signal line area CLA and the gate driving panel circuit area GPCA among sub-areas in the gate bezel area GBA in the example where the second type of gate driving panel circuit GPC (see FIG. 9B) is disposed may be nearly the same as an arrangement of corresponding sub-areas of the sub-areas in the gate bezel area GBA in the example where the first type of gate driving panel circuit GPC (see FIG. 9A) is disposed (see FIG. 11). Accordingly, discussions on the sub-areas of FIG. 15 will be provided by focusing on different configurations from sub-areas in the gate bezel area GBA where the first type of gate driving panel circuit GPC is disposed (see FIG. 11).

Referring to FIG. 15, the gate driving panel circuit area GPCA may be an area in which the second type of gate driving panel circuit GPC is disposed. The second type of gate driving panel circuit GPC may output scan signals SC to be supplied to subpixels SP having the one-gate driving structure.

For example, the clock signal line area CLA, the first power line area PLA1, and the second power line area PLA2 may be disposed around the gate driving panel circuit area GPCA in the gate bezel area GBA.

For example, the clock signal line area CLA and the first power line area PLA1 may be located on a first side of the gate driving panel circuit area GPCA, and the first power line area PLA1 may be located between the clock signal line area CLA and the gate driving panel circuit area GPCA. The second power line area PLA2 may be located on a second opposing side of the gate driving panel circuit area GPCA. The second power line area PLA2 may be located between the gate driving panel circuit area GPCA and the display area DA. For example, the gate driving panel circuit area GPCA may be located on a first side of the second power line area PLA2, and the display area DA may be located on a second opposing side of the second power line area PLA2.

The clock signal line area CLA may be included in the gate bezel area GBA of the non-display area NDA and be an area in which a plurality of clock signal lines for delivering a plurality of clock signals to the gate driving panel circuit GPC are disposed.

The first power line area PLA1 may be included in the gate bezel area GBA of the non-display area NDA and be an area in which at least one gate high voltage line for delivering at least one gate high voltage to the gate driving panel circuit GPC is disposed.

For example, a plurality of gate high voltage lines for delivering a plurality of gate high voltages to the gate driving panel circuit GPC may be disposed in the first power line area PLAL. For example, all of the plurality of gate high voltages may have a same high voltage value. In another example, one or more of the plurality of gate high voltages may have different high voltage values from the remaining gate high voltages. The plurality of gate high voltages may be high voltages having different usages from each other.

In an aspect, at least one control signal line for delivering at least one control signal to the gate driving panel circuit GPC may be further disposed in the first power line area PLA1. For example, the at least one control signal may include at least one of a start signal VST, a reset signal RST, and a line selection signal LSP.

The second power line area PLA2 may be included in the gate bezel area GBA of the non-display area NDA and be an area in which at least one gate low voltage line for delivering at least one gate low voltage to the gate driving panel circuit GPC is disposed.

For example, a plurality of gate low voltage lines for delivering a plurality of gate low voltages to the gate driving panel circuit GPC may be disposed in the second power line area PLA2. For example, all of the plurality of gate low voltages may have a same low voltage value. In another example, one or more of the plurality of gate low voltages may have different low voltage values from the remaining gate low voltages. The plurality of gate low voltages may be low voltages having different usages from each other.

Referring to FIG. 15, in the example where the second type of gate driving panel circuit GPC is applied, the clock signal line area CLA may include a scan clock signal line area SCC and a carry clock signal line area CRC.

The scan clock signal line area SCC may be an area in which scan clock signal lines are disposed for delivering scan clock signals to the gate driving panel circuit GPC.

The carry clock signal line area CRC may be an area in which carry clock signal lines are disposed for delivering carry clock signals to the gate driving panel circuit GPC.

In the example where the second type of gate driving panel circuit GPC is applied, the clock signal line area CLA may not include a sensing clock signal line area.

For example, among the scan clock signal line area SCC and the carry clock signal line area CRC, the scan clock signal line area SCC may be located further away from the display area DA or the gate driving panel circuit area GPCA than the carry clock signal line area CRC, and the carry clock signal line area CRC may be located closer to the display area DA or the gate driving panel circuit area GPCA than the scan clock signal line area SCC.

In another example, the carry clock signal line area CRC may be located further away from the display area DA or the gate driving panel circuit area GPCA than the scan clock signal line area SCC. The scan clock signal line area SCC may be located closer to the display area DA or the gate driving panel circuit area GPCA than the carry clock signal line area CRC.

Referring to FIG. 15, in the example where the second type of gate driving panel circuit GPC is applied, the gate driving panel circuit GPC disposed in the gate driving panel circuit area GPCA may include a first gate driving panel circuit GPC #1 (e.g., the first gate driving panel circuit GPC #1 of FIG. 9B), and the like.

The first gate driving panel circuit GPC #1 may include a first output buffer block BUF #1, a first logic block LOGIC #1, and a first real-time sensing control block RT #1.

The first output buffer block BUF #1 may be configured to output two or more scan signals SC to two or more scan signal lines SCL. For example, the first output buffer block BUF #1 may be configured to output four scan signals (SC1, SC2, SC3, and SC4) to four scan signal lines (SCL1, SCL2, SCL3, and SCL4), respectively.

The four scan signals (SC1, SC2, SC3, and SC4) may include a first scan signal SC1 corresponding to an nth scan signal SC(n), a second scan signal SC2 corresponding to an (n+1)th scan signal SC(n+1), a third scan signal SC3 corresponding to an (n+2)th scan signal SC(n+2), and a fourth scan signal SC4 corresponding to an (n+3)th scan signal SC(n+3).

The first scan signal SC1, the second scan signal SC2, the third scan signal SC3, and the fourth scan signal SC4 may be applied to the first scan signal line SCL1, the second scan signal line SCL2, the third scan signal line SCL3, and the fourth scan signal line SCL4, respectively.

The first logic block LOGIC #1 may be configured to control operation of the first output buffer block BUF #1 by controlling respective voltages of Q and QB nodes of the first gate driving panel circuit GPC #1.

The first real-time sensing control block RT #1 may be configured to control operation of the first output buffer block BUF #1 so that the first output buffer block BUF #1 may output a first scan signal SC1 for sensing driving to a corresponding first subpixel SP where real-time sensing driving will be performed by controlling respective voltages of the Q and QB nodes of the first gate driving panel circuit GPC #1 during a first real-time sensing driving period.

Referring to FIG. 15, as the gate driving panel circuit area GPCA is disposed between the first power line area PLA1 and the second power line area PLA2, the first power line area PLA1 and the second power line area PLA2 may be separated from each other by the gate driving panel circuit area GPCA.

Accordingly, at least one gate high voltage line disposed in the first power line area PLA1 and at least one gate low voltage line disposed in the second power line area PLA2 may be separated by the gate driving panel circuit GPC disposed in the gate driving panel circuit area GPCA.

According to the configuration of the power-related lines and areas discussed above, since at least one high voltage line and at least one low voltage line do not overlap with each other, one or more high voltages (e.g., GVDD, GVDD2, and GVDD_o in FIG. 16) and one or more low voltages (e.g., GVSS0, GVSS1, and GVSS2 of FIG. 16) may be stabilized or stably supplied.

Figure 16:
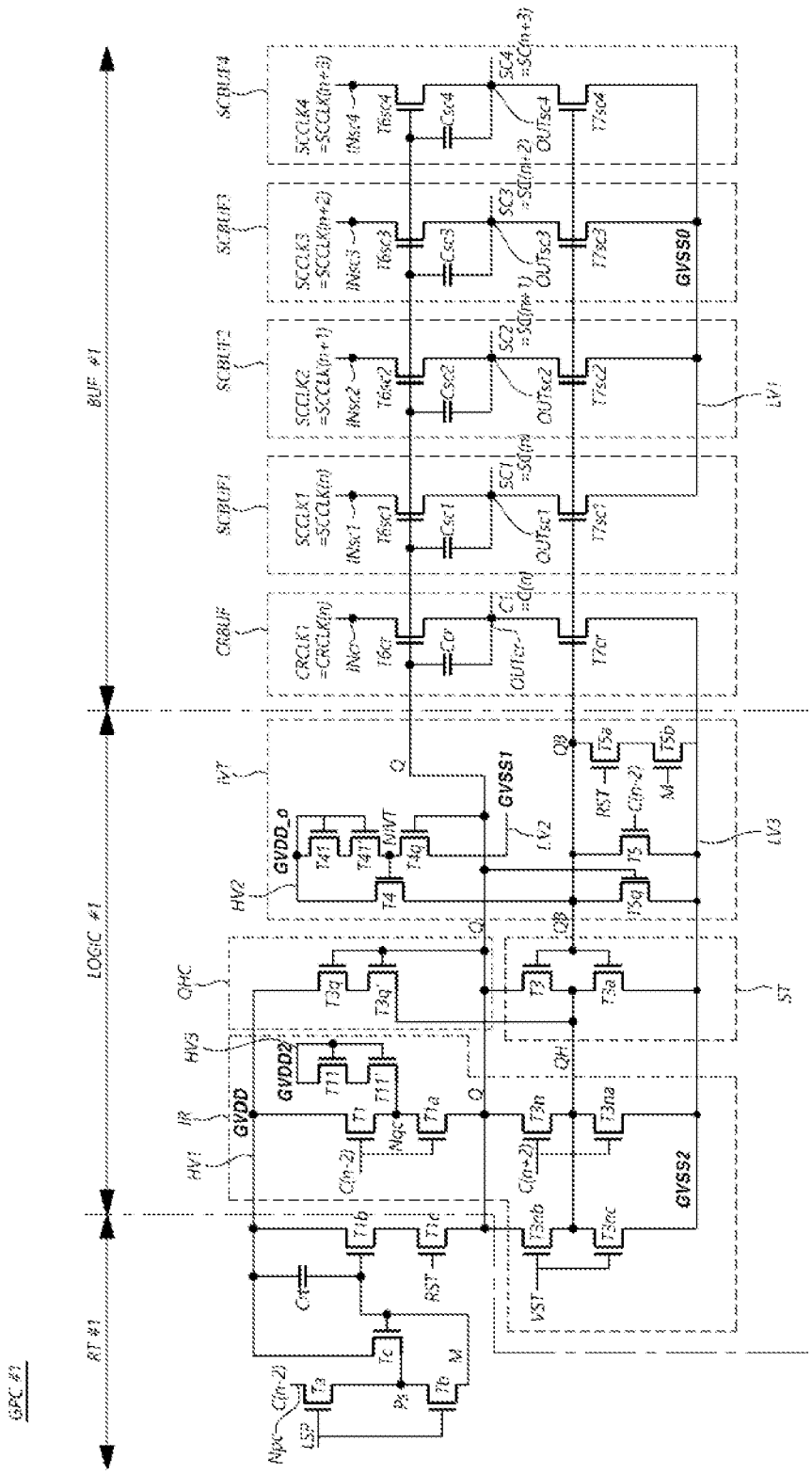
FIG. 16 illustrates, in the example where the second type of gate driving panel circuit is applied, an example first gate driving panel circuit included in the gate driving panel circuit in the display device according to aspects of the present disclosure.

FIG. 16 illustrates, in the example where the second type of gate driving panel circuit GPC is applied, an example first gate driving panel circuit GPC #1 (e.g., the first gate driving panel circuit GPC #1 of FIG. 9B) included in the gate driving panel circuit GPC in the display device 100 according to aspects of the present disclosure.

Hereinafter, for convenience of description, an nth scan signal SC(n) may be referred to as a first scan signal SC1, and an (n+1)th scan signal SC(n+1) may be referred to as a second scan signal SC2, an (n+2)th scan signal SC(n+2) may be referred to as a third scan signal SC3, and an (n+3)th scan signal SC(n+3) may be referred to as a fourth scan signal SC4.

Further, for convenience of description, an nth scan clock signal SCCLK(n) may be referred to as a first scan clock signal SCCLK1, an (n+1)th scan clock signal SCCLK(n+1) may be described as a second scan clock signal SCCLK2, an (n+2)th scan clock signal SCCLK(n+2) may be described as a third scan clock signal SCCLK3, and an (n+3)th scan clock signal SCCLK(n+3) may be referred to as a fourth scan clock signal SCCLK4.

Further, for convenience of description, an nth carry signal C(n) may be referred to as a first carry signal C1, and an nth carry clock signal CRCLK(n) may be referred to as a first carry clock signal CRCLK1. Referring to FIG. 16, the first gate driving panel circuit GPC #1 may include a first output buffer block BUF #1, a first logic block LOGIC #1, and a first real-time sensing control block RT #1.

Except for input carry signals and a configuration of the first output buffer block BUF #1, the first gate driving panel circuit GPC #1 of the second type of gate driving panel circuit GPC illustrated in FIG. 16 may have the same basic structure and configuration as the first gate driving panel circuit GPC #1 of the first type of gate driving panel circuit GPC illustrated in FIG. 12. Considering such similarity, discussions on the first gate driving panel circuit GPC #1 of the second type of gate driving panel circuit GPC will be provided by focusing on different configurations from the first gate driving panel circuit GPC #1 of the first type of gate driving panel circuit GPC illustrated in FIG. 12.

Referring to FIG. 16, the first output buffer block BUF #1 may include a carry output buffer CRBUF and two or more scan output buffers. For example, the first output buffer block BUF #1 may include a carry output buffer CRBUF, a first scan output buffer SCBUF1, a second scan output buffer SCBUF2, a third scan output buffer SCBUF3, and a fourth scan output buffer SCBUF4.

Referring to FIG. 16, the carry output buffer CRBUF may include a carry pull-up transistor T6$cr$ and a carry pull-down transistor T7$cr$.

The carry pull-up transistor T6cr may be turned on or turned off depending on a voltage of a Q node, and thereby, control a connection between a carry clock node INcr to which a first carry clock signal CRCLK1 is input and a carry output node OUTcr from which a first carry signal C1 is output.

The gate node of the carry pull-up transistor T6cr may be the Q node or be electrically connected to the Q node. The source node (or drain node) of the carry pull-up transistor T6cr may be the carry output node OUTcr or be electrically connected to the carry output node OUTcr. The drain node (or source node) of the carry pull-up transistor T6cr may be the carry clock node INcr or be electrically connected to the carry clock node INcr.

When the carry pull-up transistor T6cr is turned on, the carry pull-up transistor T6cr may output the first carry signal C1 having a high level voltage using the first carry clock signal CRCLK1.

The carry output buffer CRBUF may further include a carry bootstrapping capacitor Ccr connected between the gate node and the source node (or drain node) of the carry pull-up transistor T6cr.

The carry pull-down transistor T7cr may be turned on or turned off depending on a voltage of a QB node, and thereby, control a connection between a third gate low voltage node LV3 to which a third gate low voltage GVSS2 is input and the carry output node OUTcr from which the first carry signal C1 is output.

The gate node of the carry pull-down transistor T7cr may be the QB node or may be electrically connected to the QB node. The drain node or source node of the carry pull-down transistor T7cr may be the third gate low voltage node LV3 or be electrically connected to the third gate low voltage node LV3, and the source node or drain node of the carry pull-down transistor T7cr may be the carry output node OUTcr or be electrically connected to the carry output node OUTcr. When the carry pull-down transistor T7cr is turned on, the carry pull-down transistor T7cr may output the first carry signal C1 having a low level voltage using the third gate low voltage GVSS2.

Referring to FIG. 16, the first scan output buffer SCBUF1 may be configured to output a first scan signal SC1 having a turn-on level voltage or a turn-off level voltage to a first scan output node OUTsc1. The first scan signal SC1 output to the first scan output node OUTsc1 may be applied to a first scan signal line SCL1 electrically connected to the first scan output node OUTsc1.

Referring to FIG. 16, the first scan output buffer SCBUF1 may include a first scan pull-up transistor T6sc1 and a first scan pull-down transistor T7sc1.

The first scan pull-up transistor T6sc1 may be turned on or turned off depending on a voltage of the Q node, and control a connection between a first scan clock node INsc1 to which a first scan clock signal SCCLK1 is input and the first scan output node OUTsc1 from which the first scan signal SC1 is output.

The gate node of the first scan pull-up transistor T6sc1 may be the Q node or be electrically connected to the Q node. The source node (or drain node) of the first scan pull-up transistor T6sc1 may be the first scan output node OUTsc1 or may be electrically connected to the first scan output node OUTsc1. The drain node (or source node) of the first scan pull-up transistor T6sc1 may be the first scan clock node INsc1 or may be electrically connected to the first scan clock node INsc1.

When the first scan pull-up transistor T6sc1 is turned on, the first scan pull-up transistor T6sc1 may output the first scan signal SC1 having a turn-on level voltage (e.g., a high level voltage) using the first scan clock signal SCCLK1 to the first scan output node OUTsc1.

The first scan output buffer SCBUF1 may further include a first scan bootstrapping capacitor Csc1 connected between the gate node and the source node (or drain node) of the first scan pull-up transistor T6sc1.

The first scan pull-down transistor T7sc1 may be turned on or turned off depending on a voltage of the QB node, and control a connection between a first gate low voltage node LV1 to which a first gate low voltage GVSS0 is input and the first scan output node OUTsc1 from which the first scan signal SC1 is output.

The gate node of the first scan pull-down transistor T7sc1 may be the QB node or may be electrically connected to the QB node. The drain node or source node of the first scan pull-down transistor T7sc1 may be the first gate low voltage node LV1 or be electrically connected to the first gate low voltage node LV1. The source node or drain node of the first scan pull-down transistor T7sc1 may be the first scan output node OUTsc1 or may be electrically connected to the first scan output node OUTsc1.

When the first scan pull-down transistor T7sc1 is turned on, the first scan pull-down transistor T7sc1 may output the first scan signal SC1 having a turn-off level voltage (e.g., a low level voltage) using the first gate low voltage GVSS0 to the first scan output node OUTsc1.

Referring to FIG. 16, the second scan output buffer SCBUF2 may be configured to output a second scan signal SC2 having a turn-on level voltage or a turn-off level voltage to a second scan output node OUTsc2. The second scan signal SC2 output to the second scan output node OUTsc2 may be applied to a second scan signal line SCL2 electrically connected to the second scan output node OUTsc2.

Referring to FIG. 16, the second scan output buffer SCBUF2 may include a second scan pull-up transistor T6sc2 and a second scan pull-down transistor T7sc2.

The second scan pull-up transistor T6sc2 may be turned on or turned off depending on a voltage of the Q node, and control a connection between a second scan clock node INsc2 to which a second scan clock signal SCCLK2 is input and the second scan output node OUTsc2 from which the second scan signal SC2 is output.

The gate node of the second scan pull-up transistor T6sc2 may be the Q node or be electrically connected to the Q node. The source node or drain node of the second scan pull-up transistor T6sc2 may be the second scan output node OUTsc2 or may be electrically connected to the second scan output node OUTsc2. The drain node (or source node) of the second scan pull-up transistor T6sc2 may be the second scan clock node INsc2 or may be electrically connected to the second scan clock node INsc2.

When the second scan pull-up transistor T6sc2 is turned on, the second scan pull-up transistor T6sc2 may output the second scan signal SC2 having a turn-on level voltage (e.g., a high level voltage) using the second scan clock signal SCCLK2 to the second scan output node OUTsc2.

The second scan output buffer SCBUF2 may further include a second scan bootstrapping capacitor Csc2 connected between the gate node and the source node (or drain node) of the second scan pull-up transistor T6sc2.

The second scan pull-down transistor T7sc2 may be turned on or turned off depending on a voltage of the QB node, and control a connection between the first gate low voltage node LV1 to which the first gate low voltage GVSS0 is input and the second scan output node OUTsc2 from which the second scan signal SC2 is output.

The gate node of the second scan pull-down transistor T7sc2 may be the QB node or may be electrically connected to the QB node. The drain node or source node of the second scan pull-down transistor T7sc2 may be the first gate low voltage node LV1 or be electrically connected to the first gate low voltage node LV1. The source node or drain node of the second scan pull-down transistor T7sc2 may be the second scan output node OUTsc2 or may be electrically connected to the second scan output node OUTsc2.

When the second scan pull-down transistor T7sc2 is turned on, the second scan pull-down transistor T7sc2 may output the second scan signal SC2 having a turn-off level voltage (e.g., a low level voltage) using the first gate low voltage GVSS0 to the second scan output node OUTsc2.

Referring to FIG. 16, the third scan output buffer SCBUF3 may be configured to output a third scan signal SC3 having a turn-on level voltage or a turn-off level voltage to a third scan output node OUTsc3. The third scan signal SC3 output to the third scan output node OUTsc3 may be applied to a third scan signal line SCL3 electrically connected to the third scan output node OUTsc3.

Referring to FIG. 16, the third scan output buffer SCBUF3 may include a third scan pull-up transistor T6sc3 and a third scan pull-down transistor T7sc3.

The third scan pull-up transistor T6sc3 may be turned on or turned off depending on a voltage of the Q node, and control a connection between a third scan clock node INsc3 to which a third scan clock signal SCCLK3 is input and the third scan output node OUTsc3 from which the third scan signal SC3 is output.

The gate node of the third scan pull-up transistor T6sc3 may be the Q node or be electrically connected to the Q node. The source node or drain node of the third scan pull-up transistor T6sc3 may be the third scan output node OUTsc3 or may be electrically connected to the third scan output node OUTsc3. The drain node (or source node) of the third scan pull-up transistor T6sc3 may be the third scan clock node INsc3 or may be electrically connected to the third scan clock node INsc3.

When the third scan pull-up transistor T6sc3 is turned on, the third scan pull-up transistor T6sc3 may output the third scan signal SC3 having a turn-on level voltage (e.g., a high level voltage) using the third scan clock signal SCCLK3 to the third scan output node OUTsc3.

The third scan output buffer SCBUF3 may further include a third scan bootstrapping capacitor Csc3 connected between the gate node and the source node (or drain node) of the third scan pull-up transistor T6sc3.

The third scan pull-down transistor T7sc3 may be turned on or turned off depending on a voltage of the QB node, and control a connection between the first gate low voltage node LV1 to which the first gate low voltage GVSS0 is input and the third scan output node OUTsc3 from which the third scan signal SC3 is output.

The gate node of the third scan pull-down transistor T7sc3 may be the QB node or may be electrically connected to the QB node. The drain node or source node of the third scan pull-down transistor T7sc3 may be the first gate low voltage node LV1 or be electrically connected to the first gate low voltage node LV1. The source node or drain node of the third scan pull-down transistor T7sc3 may be the third scan output node OUTsc3 or may be electrically connected to the third scan output node OUTsc3.

When the third scan pull-down transistor T7sc3 is turned on, the third scan pull-down transistor T7sc3 may output the third scan signal SC3 having a turn-off level voltage (e.g., a low level voltage) using the first gate low voltage GVSS0 to the third scan output node OUTsc3.

Referring to FIG. 16, the fourth scan output buffer SCBUF4 may be configured to output a fourth scan signal SC4 having a turn-on level voltage or a turn-off level voltage to a fourth scan output node OUTsc4. The fourth scan signal SC4 output to the fourth scan output node OUTsc4 may be applied to a fourth scan signal line SCL4 electrically connected to the fourth scan output node OUTsc4.

Referring to FIG. 16, the fourth scan output buffer SCBUF4 may include a fourth scan pull-up transistor T6sc4 and a fourth scan pull-down transistor T7sc4.

The fourth scan pull-up transistor T6sc4 may be turned on or turned off depending on a voltage of the Q node, and control a connection between a fourth scan clock node INsc4 to which a fourth scan clock signal SCCLK4 is input and the fourth scan output node OUTsc4 from which the fourth scan signal SC4 is output.

The gate node of the fourth scan pull-up transistor T6sc4 may be the Q node or be electrically connected to the Q node. The source node or drain node of the fourth scan pull-up transistor T6sc4 may be the fourth scan output node OUTsc4 or may be electrically connected to the fourth scan output node OUTsc4. The drain node (or source node) of the fourth scan pull-up transistor T6sc4 may be the fourth scan clock node INsc4 or may be electrically connected to the fourth scan clock node INsc4.

When the fourth scan pull-up transistor T6sc4 is turned on, the fourth scan pull-up transistor T6sc4 may output the fourth scan signal SC4 having a turn-on level voltage (e.g., a high level voltage) using the fourth scan clock signal SCCLK4 to the fourth scan output node OUTsc4.

The fourth scan output buffer SCBUF4 may further include a fourth scan bootstrapping capacitor Csc4 connected between the gate node and the source node (or drain node) of the fourth scan pull-up transistor T6sc4.

The fourth scan pull-down transistor T7sc4 may be turned on or turned off depending on a voltage of the QB node, and control a connection between the first gate low voltage node LV1 to which the first gate low voltage GVSS0 is input and the fourth scan output node OUTsc4 from which the fourth scan signal SC4 is output.

The gate node of the fourth scan pull-down transistor T7sc4 may be the QB node or may be electrically connected to the QB node. The drain node or source node of the fourth scan pull-down transistor T7sc4 may be the first gate low voltage node LV1 or be electrically connected to the first gate low voltage node LV1. The source node or drain node of the fourth scan pull-down transistor T7sc4 may be the fourth scan output node OUTsc4 or may be electrically connected to the fourth scan output node OUTsc4.

When the fourth scan pull-down transistor T7sc4 is turned on, the fourth scan pull-down transistor T7sc4 may output the fourth scan signal SC4 having a turn-off level voltage (e.g., a low level voltage) using the first gate low voltage GVSS0 to the fourth scan output node OUTsc4.

Respective gate nodes of the carry pull-up transistor T6cr, the first scan pull-up transistor T6sc1, the second scan pull-up transistor T6sc2, the third scan pull-up transistor T6sc3, and the fourth scan pull-up transistor T6sc4, which are included in the first output buffer block BUF #1, may be electrically connected to each other.

For example, the Q node may be shared by the carry output buffer CRBUF, the first scan output buffer SCBUF1, the second scan output buffer SCBUF2, the third scan output buffer SCBUF3, and the fourth scan output buffer SCBUF4, which are included in the first output buffer block BUF #1.

The Q node may be electrically connected to respective gate nodes of the carry pull-up transistor T6cr, the first scan pull-up transistor T6sc1, the second scan pull-up transistor T6sc2, the third scan pull-up transistor T6sc3, and the fourth scan pull-up transistor T6sc4, which are included in the first output buffer block BUF #1. This structure may also be referred to as a "Q node sharing structure."

Respective gate nodes of the carry pull-down transistor T7cr, the first scan pull-down transistor T7sc1, the second scan pull-down transistor T7sc2, the third scan pull-down transistor T7sc3, and the fourth scan pull-down transistor T7sc4, which are included in the first output buffer block BUF #1, may be electrically connected to each other.

For example, the QB node may be shared by the carry output buffer CRBUF, the first scan output buffer SCBUF1, the second scan output buffer SCBUF2, the third scan output buffer SCBUF3, and the fourth scan output buffer SCBUF4, which are included in the first output buffer block BUF #1. The QB node may be electrically connected to respective gate nodes of the carry pull-down transistor T7cr, the first scan pull-down transistor T7sc1, the second scan pull-down transistor T7sc2, the third scan pull-down transistor T7sc3, and the fourth scan pull-down transistor T7sc4, which are included in the first output buffer block BUF #1.

Referring to FIG. 16, the first logic block LOGIC #1 may be a circuit configured to control voltages of the Q node and QB node to control operation of the first output buffer block BUF #1, and include an input and reset block IR, a stabilization block ST, and an inverter block IVT.

Referring to FIG. 16, the first logic block LOGIC #1 may further include a holding node control block QHC for controlling a voltage of a holding node (QH node). The holding node control block QHC may be connected between a first gate high voltage node HV1 and the holding node (QH node).

The first logic block LOGIC #1 illustrated in FIG. 16 may be the same circuit configuration as the first logic block LOGIC #1 illustrated in FIG. 12, except for the following differences.

As a first difference, in the input and reset block IR of the first logic block LOGIC #1 illustrated in FIG. 16, the gate node of a first Q node charging transistor T1 and the gate node of a second Q node charging transistor T1a may be electrically connected to each other and receive an (n−2)th carry signal C(n−2) together, and the gate node of a first Q node discharging transistor T3n and the gate node of a second Q node discharging transistor T3na may be electrically connected to each other and receive an (n+2)th carry signal C(n+2) together.

As a second difference, in the inverter block IVT of the first logic block LOGIC #1 illustrated in FIG. 16, the (n−2)th carry signal C(n−2) may be input to the gate node of a first QB node discharging transistor T5.

Hereinafter, the circuit configuration of the first logic block LOGIC #1 illustrated in FIG. 16 will be briefly described.

Referring to FIG. 16, the input and reset block IR may be a circuit configured to control charging and discharging of the Q node, and include a Q node charging block connected between the first gate high voltage node HV1 and the Q node and a Q node discharging block connected between the Q node and the third gate low voltage node LV3. For example, a first gate high voltage GVDD may be input to the first gate high voltage node HV1. Further, the third gate low voltage GVSS2 may be input to the third gate low voltage node LV3.

Referring to FIG. 16, to cause the Q node to charge, the Q node charging block of the input and reset block IR may include at least one Q node charging transistor, which may be turned on or turned off by the (n−2)th carry signal C(n−2) and thereby, control a connection between the first gate high voltage node HV1 and the Q node.

For example, the Q node charging block of the input and reset block IR may include the first Q node charging transistor T1 and the second Q node charging transistor T1a connected in series between the first gate high voltage node HV1 and the Q node.

Referring to FIG. 16, to control a Q node charging control node Nqc, the Q node charging block of the input and reset block IR may further include a first Q node charging control transistor T11 and a second Q node charging control transistor T11' connected in series between a third gate high voltage node HV3 and the Q node charging control node Nqc. For example, a third gate high voltage GVDD2 may be applied to the third gate high voltage node HV3.

Referring to FIG. 16, to cause the Q node to discharge, the Q node discharging block of the input and reset block IR may include the first Q node discharging transistor T3n and the second Q node discharging transistor T3na connected in series between the Q node and the third gate low voltage node LV3.

Referring to FIG. 16, to cause the Q node to discharge, the Q node discharging block of the input and reset block IR may further include a third Q node discharging transistor T3nb and a fourth Q node discharging transistor T3nc connected in series between the Q node and the third gate low voltage node LV3.

Referring to FIG. 16, the stabilization block ST may be a circuit configured to stabilize the Q node and the output of the gate driving panel circuit GPC depending on a voltage of the QB node during a period during which an output signal of the gate driving panel circuit GPC has a turn-off level voltage.

Referring to FIG. 16, the stabilization block ST may include a first stabilization transistor T3 and a second stabilization transistor T3a, which may be turned on or turned off depending on a voltage of the QB node and thereby, control a connection between the Q node and the third gate low voltage node LV3.

Referring to FIG. 16, the inverter block IVT may be a circuit configured to control an electrical value (or level) of the Q node or the QB node such that a voltage level resulting from inverting a voltage level of the Q node becomes a voltage level of the QB node depending on a voltage of the Q node.

Referring to FIG. 16, the inverter block IVT may include a QB node charging transistor T4 to cause the QB node to charge.

Referring to FIG. 16, the inverter block IVT may further include a first inverter control transistor T4q for controlling the voltage of an inverter control node NIVT corresponding to the gate node of the QB node charging transistor T4.

Referring to FIG. 16, the inverter block IVT may further include a second inverter control transistor T41 and a third inverter control transistor T41' for controlling the voltage of the inverter control node NIVT.

Referring to FIG. 16, to cause the QB node to discharge, the inverter block IVT may include the first QB node discharging transistor T5 connected between the QB node and the third gate low voltage node LV3. The first QB node discharging transistor T5 may be turned on or turned off depending on the (n−2)th carry signal C(n−2).

Referring to FIG. 16, to cause the QB node to discharge, the inverter block IVT may further include a second QB node discharging transistor T5q connected between the QB node and the third gate low voltage node LV3. The second QB node discharging transistor T5q may be turned on or turned off depending on a voltage of the Q node.

Referring to FIG. 16, to cause the QB node to discharge, the inverter block IVT may further include a third QB node discharging transistor T5a and a fourth QB node discharging transistor T5b connected in series between the QB node and the third gate low voltage node LV3.

Referring to FIG. 16, among the plurality of QB node discharging transistors (T5, T5q, T5a, and T5b) included in the inverter block IVT, the first QB node discharging transistor T5 and the second QB node discharging transistor T5q may be configured to discharge the QB node for display driving during an active period ACT, and the third QB node discharging transistor T5a and the fourth QB node discharging transistor T5b may be configured to discharge the QB node for sensing driving during a blank period BLANK.

Referring to FIG. 16, the holding node control block QHC may include a first holding node control transistor T3q and a second holding node control transistor T3q' connected in series between the first gate high voltage node HV1 and the holding node (QH node).

Respective gate nodes of the first holding node control transistor T3q and the second holding node control transistor T3q' may be connected to the Q node together.

Referring to FIG. 16, the first real-time sensing control block RT #1 may be a circuit configured to control operation of the first output buffer block BUF #1 for real-time sensing driving. The first real-time sensing control block RT #1 may be configured to control a voltage of the Q node so that a first scan signal SC1 may be output at a preset timing by the first output buffer block BUF #1 during a blank period BLANK.

Referring to FIG. 16, the first real-time sensing control block RT #1 may perform a control operation so that during a blank period BLANK, the first scan signal SC1 may be output by the first output buffer block BUF #1 to a corresponding one of a plurality of scan signal lines. Through this operation, sensing driving may be performed for a subpixel SP included in a corresponding one of a plurality of subpixel lines (or subpixel arrays).

Referring to FIG. 16, the first real-time sensing control block RT #1 may include a first sensing control transistor Ta, a second sensing control transistor Tb, a third sensing control transistor Tc, and a fourth sensing control transistor T1b, and a fifth sensing control transistor Tic.

Referring to FIG. 16, the first real-time sensing control block RT #1 may include a sensing control capacitor Crt connected between the first gate high voltage node HV1 and an intermediate node M.

Figure 17A:
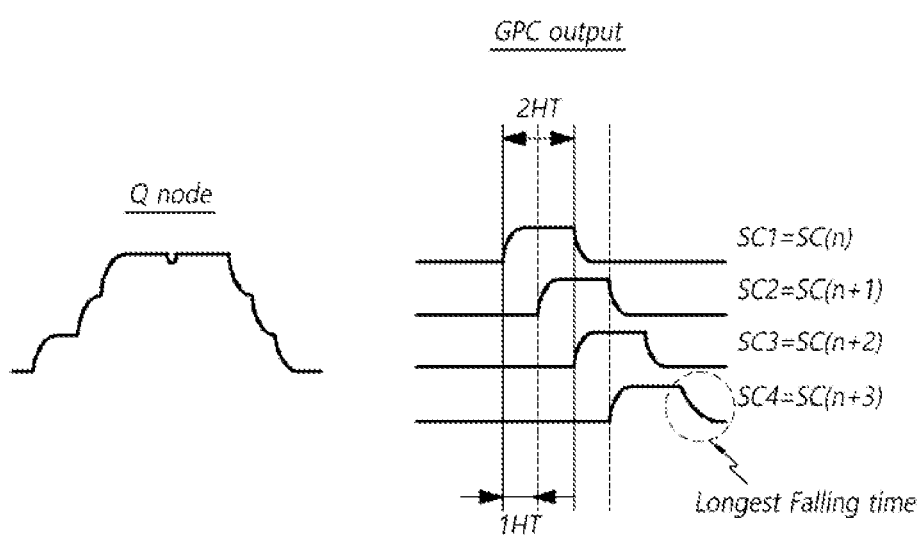
FIG. 17A illustrates, in the example where the second type of gate driving panel circuit is applied, example outputs and voltage changes at a Q node of the first gate driving panel circuit included in the gate driving panel circuit in the display device according to aspects of the present disclosure.

FIG. 17A illustrates, in the example where the second type of gate driving panel circuit is applied, example outputs and voltage changes at the Q node of the first gate driving panel circuit GPC #1 included in the gate driving panel circuit GPC in the display device 100 according to aspects of the present disclosure.

Referring to FIG. 17A, voltage rising (boosting) may occur two or more times during a period during which a voltage of the Q node of the first gate driving panel circuit GPC #1 increases.

Referring to FIG. 17A, when the Q node of the first gate driving panel circuit GPC #1 has a high level voltage, the first gate driving panel circuits GPC #1 may sequentially output first to fourth scan signals (SC1, SC2, SC3, and SC4) having a high level voltage.

Referring to FIG. 17A, a time period of a respective high level voltage period of each of the first to fourth scan signals (SC1, SC2, SC3, and SC4) may be two horizontal times 2HT (which may refer to a time period corresponding two horizontal periods).

Referring to FIG. 17A, respective high level voltage periods of two scan signals adjacent in time to each other among the first to fourth scan signals (SC1, SC2, SC3, and SC4) may overlap in time. A time period during which respective high level voltage periods of two scan signals adjacent in time to each other overlaps each other may be one horizontal time 1HT (which may refer to a time period corresponding one horizontal period).

The high level voltage period of the first scan signal SC1 and the high level voltage period of the second scan signal SC2 may overlap in time. The high level voltage period of the second scan signal SC2 and the high level voltage period of the third scan signal SC3 may overlap in time. The high level voltage period of the third scan signal SC3 and the high level voltage period of the fourth scan signal SC4 may overlap in time.

As described above, a gate driving scheme in which respective high level voltage periods of two scan signals, which are output immediately adjacent to each other in time, overlap in time may be referred to as an "overlap gate driving scheme."

Referring to FIG. 17A, according to the Q node sharing structure and overlap gate driving, among the first to fourth scan signals (SC1, SC2, SC3, and SC4) output from the first output buffer block BUF #1 configured to share one Q node, a falling period (i.e., a period during which a corresponding voltage level is pulled down) of the fourth scan signal SC4, which is output lastly, may be the longest. The longest falling period of the fourth scan signal SC4 output lastly may mean that the falling time (voltage pulled-down time) of the fourth scan signal SC4 is the longest.

Figure 17B:
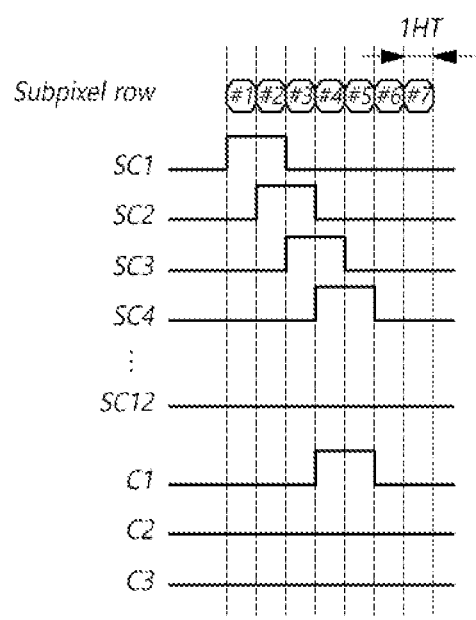
FIG. 17B illustrates, in the example where the second type of gate driving panel circuit is applied, example scan signals and carry signals produced from the gate driving panel circuit in the display device according to aspects of the present disclosure.

FIG. 17B illustrates, in the example where the second type of gate driving panel circuit GPC is applied, example scan signals (SC1 to SC12) and carry signals (C1 to C3) produced from the gate driving panel circuit GPC in the display device 100 according to aspects of the present disclosure.

Referring to FIG. 17B, the gate driving panel circuit GPC may supply a corresponding scan signal to each of a plurality of subpixel rows (e.g., subpixel row: #1, #2, #3, . . . , and #7). The gate driving panel circuit GPC may supply a first scan signal SC1, a second scan signal SC2, and a third scan signal SC3 to a first subpixel row #1, a second subpixel row #2, and a third subpixel row #3, respectively.

A time period of a respective high level voltage period of each of the scan signals (SC1 to SC12) may be two horizontal times 2HT. The second half of the high level voltage period of the first scan signal SC1 and the first half of the high level voltage period of the second scan signal SC2 may overlap by one horizontal time 1HT. The second half of the high level voltage period of the second scan signal SC2 and the first half of the high level voltage period of the third scan signal SC3 may overlap by one horizontal time 1HT.

Referring to FIG. 17B, the carry signals (C1 to C3) may be output by circuits or elements in the gate driving panel circuit GPC.

Referring to FIG. 17B, a time period of a respective high level voltage period of each of the carry signals (C1 to C3) may be 2 horizontal times 2HT. With respect to a first carry signal C1, the first to fourth scan signals (SC1, SC2, SC3, and SC4) may be sequentially output.

Referring to FIG. 17B, the first half of the high level voltage period of the first carry signal C1 may overlap with the second half of the high level voltage period of the third scan signal SC3. The high level voltage period of the first carry signal C1 may overlap with the high level voltage period of the fourth scan signal SC4.

Referring to FIG. 17B, the high level voltage period of the first carry signal C1 and the high level voltage period of the second carry signal C2 may not overlap with each other. The high level voltage period of the second carry signal C2 and the high level voltage period of the third carry signal C3 may not overlap with each other.

Figure 18:
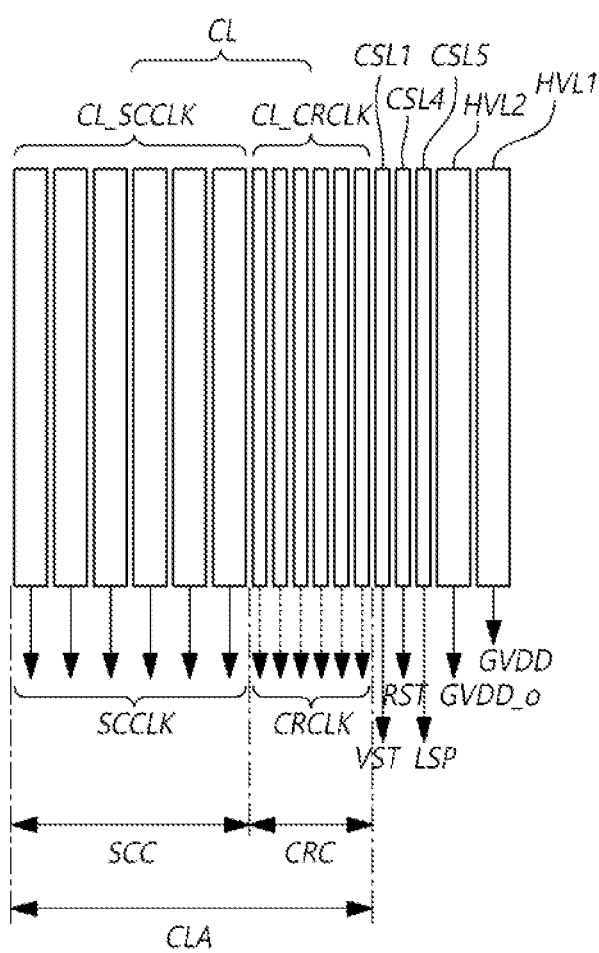
FIG. 18 illustrates, in the example where the second type of gate driving panel circuit is applied, an example line arrangement in a clock signal line area and a first power line area included in the gate bezel area in the display device according to aspects of the present disclosure.

FIG. 18 illustrates, in the example where the second type of gate driving panel circuit GPC is applied, an example line arrangement in a clock signal line area CLA and a first power line area PLA1 included in the gate bezel area GBA in the display device 100 according to aspects of the present disclosure.

Referring to FIG. 18, the gate bezel area GBA of the display panel 110 may include the clock signal line area CLA and the first power line area PLA1. The clock signal line area CLA and the first power line area PLA1 may be located on a first side of a gate driving panel circuit area GPCA (e.g., the gate driving panel circuit area GPCA of FIG. 15) in which the second type of gate driving panel circuit GPC is disposed.

Referring to FIG. 18, in the example where the second type of gate driving panel circuit GPC is applied, the clock signal line area CLA may include a scan clock signal line area SCC and a carry clock signal line area CRC.

Scan clock signal lines CL_SCCLK for delivering scan clock signals SCCLK to a gate driving panel circuit GPC (e.g., the second type of gate driving panel circuit GPC in FIG. 9B) may be disposed in the scan clock signal line area SCC.

Carry clock signal lines CL_CRCLK for delivering carry clock signals CRCLK to the gate driving panel circuit GPC may be disposed in the carry clock signal line area CRC.

The scan clock signal line area SCC may be located further away from the display area DA than the carry clock signal line area CRC. The carry clock signal line area CRC may be located closer to the display area DA than the scan clock signal line area SCC.

The scan clock signal line area SCC may be located further away from a gate drive panel circuit area GPCA than the carry clock signal line area CRC. The carry clock signal line area CRC may be located closer to the gate driving panel circuit area GPCA than the scan clock signal line area SCC.

Referring to FIG. 18, a width of one scan clock signal line CL_SCCLK may be greater than a width of one carry clock signal line CL_CRCLK.

Referring to FIG. 18, at least one gate high voltage line HVL for delivering at least one gate high voltage GVDD to the gate driving panel circuit GPC may be disposed in the first power line area PLAL. For example, a first gate high voltage line HVL1 and a second gate high voltage line HVL2 for respectively delivering a first gate high voltage GVDD and a second gate high voltage GVDD_o to the gate driving panel circuit GPC may be disposed in the first power line area PLA1.

Referring to FIG. 18, at least one control signal line may be further disposed in the first power line area PLA1. For example, at least one control signal line may include at least one of a start signal line CSL1 for delivering a start signal VST for indicating the start of gate driving operation to the gate driving panel circuit GPC, a reset signal line CSL4 for delivering a reset signal RST for indicating the end of the gate driving operation to the gate driving panel circuit GPC, and a line selection signal line CSL5 for delivering a line selection signal LSP to the gate driving panel circuit GPC.

Each of the first gate high voltage line HVL1 and the second gate high voltage line HVL2 may have a greater width than the start signal line CSL1, the reset signal line CSL4, and the line selection signal line CSL5.

The first gate high voltage line HVL1, the second gate high voltage line HVL2, the start signal line CSL1, the reset signal line CSL4, and the line selection signal line CSL5 may be arranged in the first power line area PLA1 in various arrangement orders.

For example, as shown in the example of FIG. 18, the start signal line CSL1, the reset signal line CSL4, the line selection signal line CSL5, the second gate high voltage line HVL2, and the first gate high voltage line HVL1 may be arranged in this sequential order. In this example, the start signal line CSL1 may be located closest to the clock signal line area CLA, and the first gate high voltage line HVL1 may be located furthest away from the clock signal line area CLA. For example, a third gate high voltage line HVL3 for delivering a third gate high voltage GVDD2 to the gate driving panel circuit GPC may be further disposed inside of the first gate high voltage line HVL1 in the first power line area PLA1.

Figure 19A:
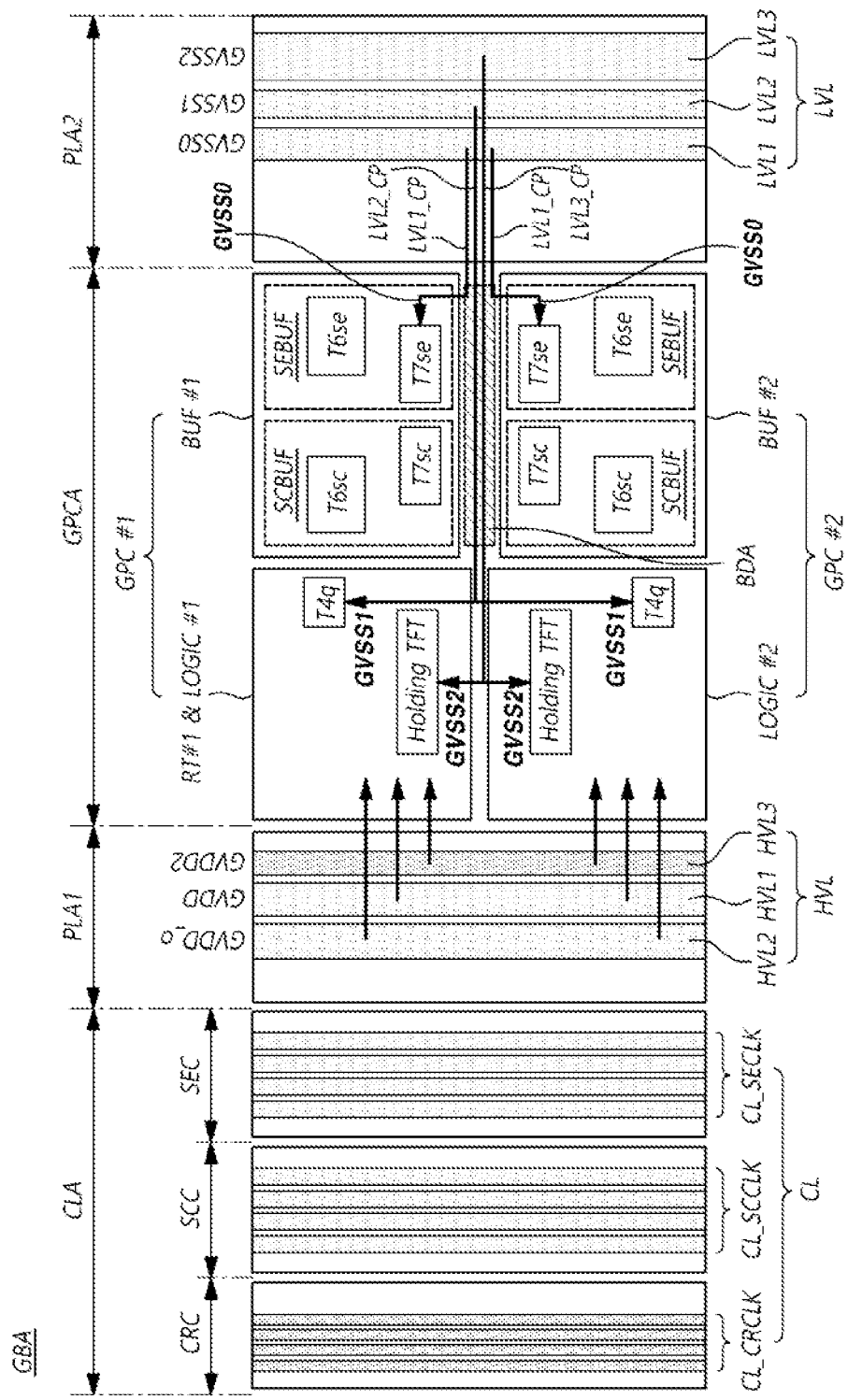
FIG. 19A is an example plan view of the gate bezel area of the display panel in the example where the first type of gate driving panel circuit is applied in the display device according to aspects of the present disclosure.

FIG. 19A is an example plan view of the gate bezel area GBA of the display panel 110 in the example where first and second gate driving panel circuits (GPC #1 and GPC #2) (e.g., the first and second gate driving panel circuits (GPC #1 and GPC #2) in FIG. 9A) are configured with the first type in the display device 100 according to aspects of the present disclosure.

Referring to FIG. 19A, the first type of first gate driving panel circuit GPC #1 and the first type of second gate driving panel circuit GPC #2 may be disposed in a gate driving panel circuit area GPCA.

Referring to FIG. 19A. the first gate driving panel circuit GPC #1 may include a first output buffer block BUF #1, a first logic block LOGIC #1, and a first real-time sensing control block RT #1. The second gate driving panel circuit GPC #2 may include a second output buffer block BUF #2, a second logic block LOGIC #2, and a second real-time sensing control block RT #2.

Referring to FIG. 19A, a first output buffer block BUF #1 of the first gate driving panel circuit GPC #1 may include a scan output buffer SCBUF for outputting a first scan signal SC1 and a sensing output buffer SEBUF for outputting a first sensing signal SE1.

A second output buffer block BUF #2 of the second gate driving panel circuit GPC #2 may include a scan output buffer SCBUF for outputting a second scan signal SC2 and a sensing output buffer SEBUF for outputting a second sensing signal SE2.

Referring to FIG. 19A, the scan output buffer SCBUF included in each of the first output buffer block BUF #1 and the second output buffer block BUF #2 may include a scan pull-up transistor T6$sc$ and a scan pull-down transistor T7$sc$.

The sensing output buffer SEBUF included in each of the first output buffer block BUF #1 and the second output buffer block BUF #2 may include a sensing pull-up transistor T6$se$ and a sensing pull-down transistor T7$se$.

The gate bezel area GBA in the non-display area NDA of the display panel 110 may include a central area BDA for separating the first output buffer block BUF #1 and the second output buffer block BUF #2 from each other.

The display panel 110 may further include at least one first gate low voltage connection line LVL1_CP for connecting a first gate low voltage line LVL1 disposed in a second power line area PLA2 with the first output buffer block BUF #1 and the second output buffer block BUF #2.

The display panel 110 may further include at least one second gate low voltage connection line LVL2_CP for connecting a second gate low voltage line LVL2 disposed in the second power line area PLA2 with a first logic block LOGIC #1 and a second logic block LOGIC #2.

The display panel 110 may further include at least one third gate low voltage connection line LVL3_CP for connecting a third gate low voltage line LVL3 disposed in the second power line area PLA2 with the first logic block LOGIC #1 and the second logic block LOGIC #2.

The first gate low voltage connection line LVL1_CP, the second gate low voltage connection line LVL2_CP, and the third gate low voltage connection line LVL3_CP may run through the central area BDA.

Referring to FIG. 19A, the scan output buffer SCBUF of the first output buffer block BUF #1 and the scan output buffer SCBUF of the second output buffer block BUF #2 may have a symmetrical structure about the central area BDA.

For example, locations or shapes of elements included in the scan output buffer SCBUF of the first output buffer block BUF #1 and locations or shapes of elements included in the scan output buffer SCBUF of the second output buffer block BUF #2 may be symmetrical about the central area BDA. For example, the elements included in the scan output buffer SCBUF may include transistors (T6sc, T7sc) and capacitors (Csc).

Referring to FIG. 19A, the sensing output buffer SEBUF of the first output buffer block BUF #1 and the sensing output buffer SEBUF of the second output buffer block BUF #2 may have a symmetrical structure about the central area BDA.

For example, locations or shapes of elements included in the sensing output buffer SEBUF of the first output buffer block BUF #1 and locations or shapes of elements included in the sensing output buffer SEBUF of the second output buffer block BUF #2 may be symmetrical about the central area BDA. For example, the elements included in the sensing output buffer SEBUF may include transistors (T6se, T7se) and capacitors (Cse).

Referring to FIG. 19A, a clock signal line area CLA may be located on a first side of the gate driving panel circuit area GPCA and may be an area in which a plurality of clock signal lines CL are disposed.

For example, the clock signal line area CLA may include a carry clock signal line area CRC, a scan clock signal line area SCC, and a sensing clock signal line area SEC.

The plurality of clock signal lines CL may include a plurality of carry clock signal lines CL_CRCLK disposed in the carry clock signal line area CRC, a plurality of scan clock signal lines CL_SCCLK disposed in the scan clock signal line area SCC, and a plurality of sensing clock signal lines CL_SECLK disposed in the sensing clock signal line area SEC.

Since each of the plurality of carry clock signal lines CL_CRCLK, the plurality of scan clock signal lines CL_SCCLK, and the plurality of sensing clock signal lines CL_SECLK is desired to reduce load for gate driving, therefore, these lines may have a multilayer line structure.

Scan clock signals SCCLK and sensing clock signals SECLK may be more sensitive to signal delay or signal waveform changes in terms of driving than carry clock signals CRCLK Therefore, to reduce the load of the plurality of scan clock signal lines CL_SCCLK and the plurality of sensing clock signal lines CL_SECLK, a line width of each of the plurality of scan clock signal lines CL_SCCLK and the plurality of sensing clock signal lines CL_SECLK may be designed to be greater than a line width of each of the plurality of carry clock signal lines CL_CRCLK.

Referring to FIG. 19A, the plurality of scan clock signal lines CL_SCCLK may be disposed between the plurality of carry clock signal lines CL_CRCLK and the plurality of sensing clock signal lines CL_SECLK. The plurality of carry clock signal lines CL_CRCLK may be located further away from the gate driving panel circuit area GPCA than the plurality of sensing clock signal lines CL_SECLK.

Referring to FIG. 19A, a first power line area PLA1 may be located on the first side of the gate driving panel circuit area GPCA and include at least one gate high voltage line HVL disposed in a column direction.

For example, the at least one gate high voltage line HVL may include a first gate high voltage line HVL1 for delivering a first gate high voltage GVDD to the first gate driving panel circuit GPC #1 and the second gate driving panel circuit GPC #2, a second gate high voltage line HVL2 for delivering a second gate high voltage GVDD_o to the first gate driving panel circuit GPC #1 and the second gate driving panel circuit GPC #2, and a third gate high voltage line HVL3 for delivering a third gate high voltage GVDD2 to the first gate driving panel circuit GPC #1 and the second gate driving panel circuit GPC #2.

The first gate high voltage line HVL1 may be a first gate high voltage node HV1 or may be electrically connected to the first gate high voltage node HV1. The second gate high voltage line HVL2 may be a second gate high voltage node HV2 or may be electrically connected to the second gate high voltage node HV2. The third gate high voltage line HVL3 may be a third gate high voltage node HV3 or may be electrically connected to the third gate high voltage node HV3.

The first gate high voltage GVDD, the second gate high voltage GVDD_o, and the third gate high voltage GVDD2 may be supplied to the first logic block LOGIC #1 included in the first gate driving panel circuit GPC #1 and the second logic block LOGIC #2 included in the second gate driving panel circuit GPC #2.

Among the first gate high voltage GVDD, the second gate high voltage GVDD_o, and the third gate high voltage GVDD2, the first gate high voltage GVDD may also be supplied to the first real-time sensing control block RT #1 included in the first gate driving panel circuit GPC #1.

Referring to FIG. 19A, the second power line area PLA2 may be located on the second opposing side of the gate driving panel circuit area GPCA and include at least one gate low voltage line LVL disposed in the column direction.

For example, the at least one gate low voltage line LVL may include the first gate low voltage line LVL1 for delivering a first gate low voltage GVSS0 to the first gate driving panel circuit GPC #1 and the second gate driving panel circuit GPC #2, the second gate low voltage line LVL2 for delivering a second gate low voltage GVSS1 to the first gate driving panel circuit GPC #1 and the second gate driving panel circuit GPC #2, and the third gate low voltage line LVL3 for delivering a third gate low voltage GVSS2 to the first gate driving panel circuit GPC #1 and the second gate driving panel circuit GPC #2.

The first gate low voltage line LVL1 may be a first gate low voltage node LV1 or may be electrically connected to the first gate low voltage node LV1. The second gate low voltage line LVL2 may be a second gate low voltage node LV2 or may be electrically connected to the second gate low voltage node LV2. The third gate low voltage line LVL3 may be a third gate low voltage node LV3 or may be electrically connected to the third gate low voltage node LV3.

Referring to FIG. 19A, the first gate low voltage GVSS0 may be supplied to the scan output buffer SCBUF and the sensing output buffer SEBUF included in the first output buffer block BUF #1 of the first gate driving panel circuit GPC #1 and to the scan output buffer SCBUF and the sensing output buffer SEBUF included in the second output buffer block BUF #2 of the second gate driving panel circuit GPC #2.

The first gate low voltage GVSS0 may be applied to respective drain nodes or source nodes of a scan pull-down transistor T7sc and a sensing pull-down transistor T7se included in the first output buffer block BUF #1 and to respective drain nodes or source nodes of a scan pull-down transistor T7sc and a sensing pull-down transistor T7se included in the second output buffer block BUF #2.

The first gate low voltage connection line LVL1_CP may electrically connect respective drain nodes or source nodes of the scan pull-down transistor T7sc and the sensing pull-down transistor T7se included in the first output buffer block BUF #1 to the gate low voltage line LVL1.

Further, the first gate low voltage connection line LVL1_CP may electrically connect respective drain nodes or source nodes of the scan pull-down transistor T7sc and the sensing pull-down transistor T7se included in the second output buffer block BUF #2 to the gate low voltage line LVL1.

The first gate low voltage connection line LVL1_CP may be disposed in the row direction and run through the central area BDA.

Referring to FIG. 19A, the second gate low voltage GVSS1 may be supplied to the first logic block LOGIC #1 of the first gate driving panel circuit GPC #1 and the second logic block LOGIC #2 of the second gate driving panel circuit GPC #2.

The second gate low voltage GVSS1 may be applied to the drain node or source node of a first inverter control transistor T4q included in the first logic block LOGIC #1 and to the drain node or source node of a first inverter control transistor T4q included in the second logic block LOGIC #2.

The second gate low voltage connection line LVL2_CP may electrically connect the drain node or source node of the first inverter control transistor T4q included in the first logic block LOGIC #1 to the second gate low voltage line LVL2. Further, the second gate low voltage connection line LVL2_CP may electrically connect the drain node or source node of the first inverter control transistor T4q included in the second logic block LOGIC #2 to the second gate low voltage line LVL2.

Referring to FIG. 19A, the third gate low voltage GVSS2 may be supplied to the first logic block LOGIC #1 of the first gate driving panel circuit GPC #1 and to the second logic block LOGIC #2 of the second gate driving panel circuit GPC #2.

The third gate low voltage GVSS2 may be included in each of the first logic block LOGIC #1 and the second logic block LOGIC #2, and be applied to respective drain nodes or source nodes of holding transistors (Holding TFT) connected to the third gate low voltage node LV3. The holding transistors (Holding TFT) may include a second Q node discharging transistor T3na, a fourth Q node discharging transistor T3nc, a second stabilization transistor T3a, a second QB node discharging transistor T5q, a first QB node discharging transistor T5, and a fourth QB node discharging transistor T5b.

The third gate low voltage connection line LVL3_CP may be included in each of the first logic block LOGIC #1 and the second logic block LOGIC #2, and electrically connect the drain nodes or source nodes of the holding transistors (Holding TFT) connected to the third gate low voltage node LV3 to the third gate low voltage line LVL3.

Further, the third gate low voltage GVSS2 may be applied to the drain nodes or source nodes of the carry pull-down transistors T7cr included in respective carry output buffers CRBUF of the first output buffer block BUF #1 and the second output buffer block BUF #2.

As described above, since the first output buffer block BUF #1 and the second output buffer block BUF #2 have a symmetrical structure about the central area BDA, the gate low voltages (GVSS0, GVSS1, and GVSS2) may be efficiently delivered (supplied).

Hereinafter, the usage and structure of the first, second, and third gate high voltage lines (HVL1, HVL2, and HVL3) will be discussed, and the usage and structure of the first, second, and third gate low voltage lines (LVL1, LVL2, and LVL3) will be discussed.

The first gate high voltage GVDD carried through the first gate high voltage line HVL1 may be a high voltage used to cause the Q node to charge by being supplied to Q node charging blocks of respective input and reset blocks IR of the first logic block LOGIC #1 and the second logic block LOGIC #2. For example, the first gate high voltage GVDD carried through the first gate high voltage line HVL1 may be a high voltage used to cause the Q node to charge by being applied to the drain node or source node of a first Q node charging transistor T1.

Further, the first gate high voltage GVDD carried through the first gate high voltage line HVL1 may be a high voltage used to cause the Q node to charge by being supplied to the first real-time sensing control block RT #1 during a real-time sensing driving period.

The second gate high voltage GVDD_o carried through the second gate high voltage line HVL2 may be a high voltage used to cause the QB node to charge by being supplied to respective inverter blocks IVT of the first logic block LOGIC #1 and the second logic block LOGIC #2.

The third gate high voltage GVDD2 carried through the third gate high voltage line HVL3 may be applied to the drain nodes (or source nodes) and the gate nodes of respective first Q node charging control transistors T11 included in the first logic block LOGIC #1 and the second logic block LOGIC #2, and be applied to a Q node charging control node Nqc through the first Q node charging control transistors T11. The first Q node charging control transistor T11 included in each of the first logic block LOGIC #1 and the second logic block LOGIC #2 may serve to compensate for a negative threshold voltage of the first Q node charging transistor T1.

The first gate low voltage GVSS0 carried through the first gate low voltage line LVL1 may be supplied to the scan output buffer SCBUF and the sensing output buffer SEBUF of the first output buffer block BUF #1, and cause voltage levels of the first scan signal SC1 and the first sensing signal SE1 to have a turn-off voltage level. Through this, driving of the first scan signal line SCL1 and the first sensing signal line SENL1 may be turned off.

The first gate low voltage GVSS0 carried through the first gate low voltage line LVL1 may be supplied to the scan output buffer SCBUF and the sensing output buffer SEBUF of the second output buffer block BUF #2, and cause voltage levels of the second scan signal SC2 and the second sensing signal SE2 to have a turn-off voltage level. Through this, driving of the second scan signal line SCL2 and the second sensing signal line SENL2 may be turned off.

The second gate low voltage GVSS1 carried through the second gate low voltage line LVL2 may be a low voltage applied to the drain node or source node of the first inverter control transistor T4q included in the inverter block IVT of each of the first logic block LOGIC #1 and the second logic block LOGIC #2.

The second gate low voltage GVSS1 may be configured as a separate low voltage separate from the third gate low voltage GVSS2.

The third gate low voltage GVSS2 carried through the third gate low voltage line LVL3 may be a low voltage used to cause the Q node to discharge (or switch off) and the QB node to discharge (or switch off) by being supplied to each of the first logic block LOGIC #1 and the second logic block LOGIC #2.

The third gate low voltage GVSS2 carried through the third gate low voltage line LVL3 may be a power supply voltage supplied to the largest number of transistors.

Each of the first gate high voltage GVDD, the second gate high voltage GVDD_o, the first gate low voltage GVSS0, the second gate low voltage GVSS1, and the third gate low voltage GVSS2 may be desired to have a smaller line resistance because the first gate high voltage GVDD, the second gate high voltage GVDD_o, the first gate low voltage GVSS0, the second gate low voltage GVSS1, and the third gate low voltage GVSS2 directly affect respective output of the first gate driving panel circuit GPC #1 and the second gate driving panel circuit GPC #2.

Accordingly, the first gate high voltage GVDD, the second gate high voltage GVDD_o, the first gate low voltage GVSS0, the second gate low voltage GVSS1, and the third gate low voltage GVSS2 may have a multilayer line structure.

The first Q node charging control transistor T11 connected to the third gate high voltage line HVL3 may not require a relatively high voltage. Further, one or more lines may intersect, and overlap with, the third gate high voltage line HVL3. Considering these issues, the third gate high voltage line HVL3 may have a single-layer line structure.

Figure 19B:
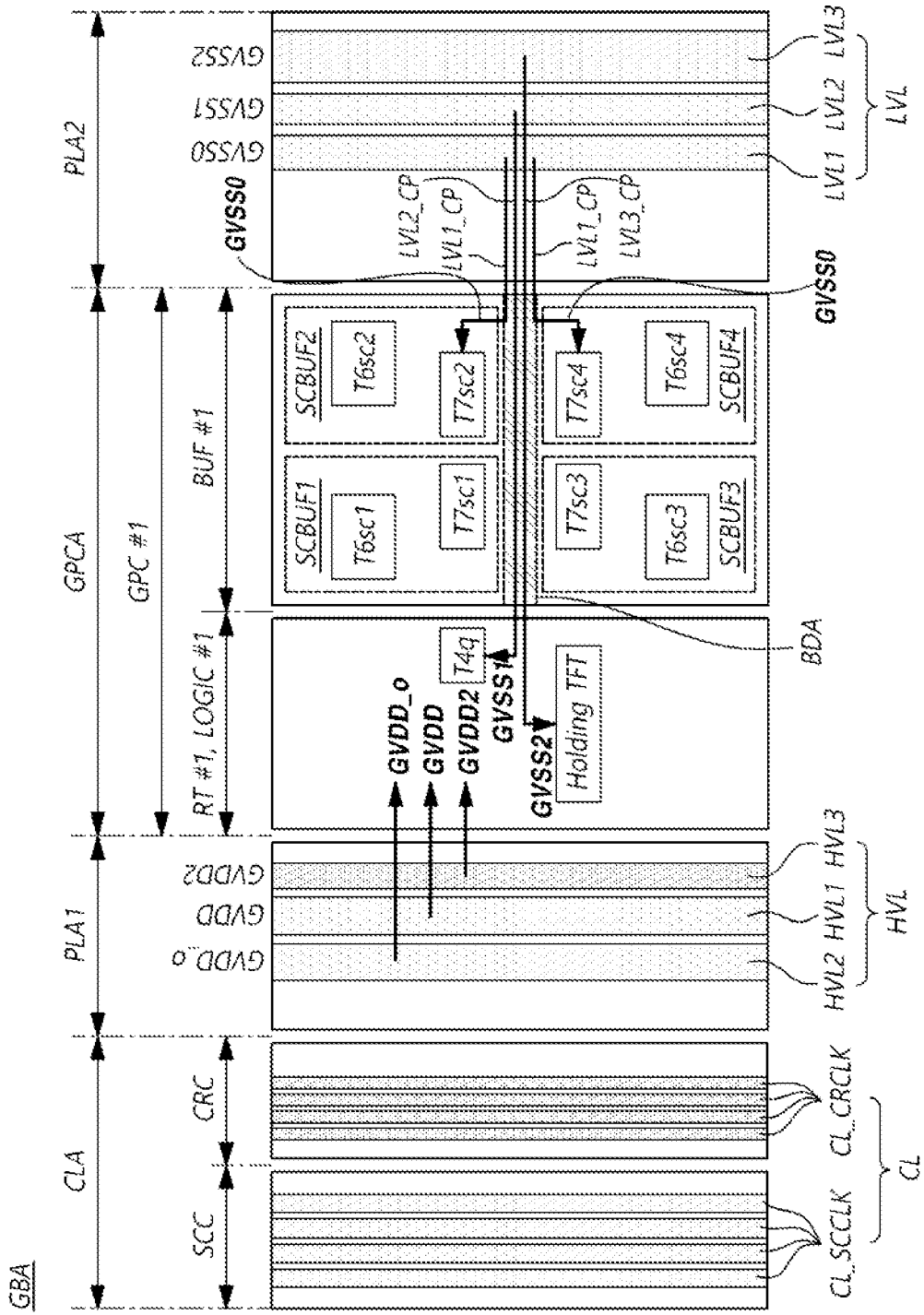
FIG. 19B is an example plan view of the gate bezel area of the display panel in the example where the second type of gate driving panel circuit is applied in the display device according to aspects of the present disclosure.

FIG. 19B is an example plan view of the gate bezel area GBA of the display panel 110 in the example where a first gate driving panel circuit GPC #1 (e.g., the first gate driving panel circuit GPC #1 of FIG. 9B) is configured with the second type in the display device 100 according to aspects of the present disclosure.

Referring to FIG. 19B, a first output buffer block BUF #1, a first logic block LOGIC #1, and a first real-time sensing control block RT #1 may be disposed in a gate driving panel circuit area GPCA.

Referring to FIG. 19B, the first output buffer block BUF #1 may include a first scan output buffer SCBUF1 for outputting a first scan signal SC1, a second scan output buffer SCBUF2 for outputting a second scan signal SC2, a third scan output buffer SCBUF3 for outputting a third scan signal SC3, and a fourth scan output buffer SCBUF4 for outputting a fourth scan signal SC4.

Referring to FIG. 19B, the four scan output buffers (SCBUF1 to SCBUF4) may be configured such that two scan output buffers are placed over the central area BDA (which may be referred to as two upper scan output buffers), and two scan output buffers are placed under the central area BDA (which may be referred to as two lower scan output buffers). For example, the two upper scan output buffers may be the first scan output buffer SCBUF1 and the second scan output buffer SCBUF2, and the two lower scan output buffers may be the third scan output buffer SCBUF3 and the fourth scan output buffer SCBUF4. Accordingly, the first scan output buffer SCBUF1 and the second scan output buffer SCBUF2 may be located in a first direction with respect to the central area BDA, and the third scan output buffer SCBUF3 and the fourth scan output buffer SCBUF4 may be located in a direction opposite to the first direction with respect to the central area BDA.

Referring to FIG. 19B, the first scan output buffer SCBUF1 and the second scan output buffer SCBUF2, which are the two upper scan output buffers, and the third scan output buffer SCBUF3 and the fourth scan output buffers SCBUF4, which are the two lower scan output buffers, may have a symmetrical structure about the central area BDA of the first output buffer block BUF #1.

The locations and shapes of circuit components (T7sc1, T7sc2, T6sc1, T6sc2, and the like) included in each of the two upper scan output buffers and the locations and shapes of circuit components (T7sc3, T7sc4, T6sc3, T6sc4, and the like) included in each of the two lower scan output buffers may be symmetrical to each other about the central area BDA.

Referring to FIG. 19B, the two upper scan output buffers may have a left-right symmetrical structure. The two lower scan output buffers may have a left-right symmetrical structure.

For example, the first scan output buffer SCBUF1 and the second scan output buffer SCBUF2 may be two upper scan output buffers disposed over the central area BDA, and the third scan output buffer SCBUF3 and the fourth scan output buffer SCBUF4 may be two lower scan output buffers disposed under the central area BDA.

For example, the two upper scan output buffers (SCBUF1 and SCBUF2) and the two lower scan output buffers (SCBUF3 and SCBUF4) may have a symmetrical structure about the central area BDA. That is, the locations and shapes of circuit components included in each of the two upper scan output buffers (SCBUF1 and SCBUF2) and the two lower scan outputs (SCBUF3 and SCBUF4) may be symmetrical about the central area BDA.

For example, the two upper scan output buffers (SCBUF1 and SCBUF2) may have a left-right symmetrical structure. The two lower scan output buffers (SCBUF3 and SCBUF4) may have a left-right symmetrical structure.

Referring to FIG. 19B, a clock signal line area CLA may be located on a first side of the gate driving panel circuit area GPCA and may be an area in which a plurality of clock signal lines CL are disposed.

For example, the plurality of clock signal lines CL may include a plurality of scan clock signal lines CL_SCCLK and a plurality of carry clock signal lines CL_CRCLK.

Since each of the plurality of scan clock signal lines CL_SCCLK and the plurality of carry clock signal lines CL_CRCLK is desired to reduce load for gate driving, therefore, these lines may have a multilayer line structure.

The scan clock signal SCCLK may be more sensitive to signal delay or signal waveform changes in terms of driving than the carry clock signal CRCLK. Therefore, to reduce the load of the plurality of scan clock signal lines CL_SCCLK, a line width of each of the plurality of scan clock signal lines CL_SCCLK may be designed to be greater than a line width of each of the plurality of carry clock signal lines CL_CRCLK.

Referring to FIG. 19B, the plurality of scan clock signal lines CL_SCCLK may be located further away from the first gate driving panel circuit GPC #1 than the plurality of carry clock signal lines CL_CRCLK.

Referring to FIG. 19B, a first power line area PLA1 may be located on the first side of the gate driving panel circuit area GPCA and include at least one gate high voltage line HVL disposed in the column direction.

For example, the at least one gate high voltage line HVL may include a first gate high voltage line HVL1 for delivering a first gate high voltage GVDD to the first gate driving panel circuit GPC #1, a second gate high voltage line HVL2 for delivering a second gate high voltage GVDD_o to the first gate driving panel circuit GPC #1, and a third gate high voltage line HVL3 for delivering a third gate high voltage GVDD2 to the first gate driving panel circuit GPC #1.

The first gate high voltage line HVL1 may be a first gate high voltage node HV1 or may be electrically connected to the first gate high voltage node HV1. The second gate high voltage line HVL2 may be a second gate high voltage node HV2 or may be electrically connected to the second gate high voltage node HV2. The third gate high voltage line HVL3 may be a third gate high voltage node HV3 or may be electrically connected to the third gate high voltage node HV3.

The first gate high voltage GVDD, the second gate high voltage GVDD_o, and the third gate high voltage GVDD2 may be supplied to the first logic block LOGIC #1 included in the first gate driving panel circuit GPC #1.

Among the first gate high voltage GVDD, the second gate high voltage GVDD_o, and the third gate high voltage GVDD2, the first gate high voltage GVDD may be supplied to the first real-time sensing control block RT #1 included in the first gate driving panel circuit GPC #1.

Referring to FIG. 19B, a second power line area PLA2 may be located on a second opposing side of the gate driving panel circuit area GPCA and include at least one gate low voltage line LVL disposed in the column direction.

For example, the at least one gate low voltage line LVL may include a first gate low voltage line LVL1 for delivering a first gate low voltage GVSS0 to the first gate driving panel circuit GPC #1, a second gate low voltage line LVL2 for delivering a second gate low voltage GVSS1 to the first gate driving panel circuit GPC #1, and a third gate low voltage line LVL3 for delivering a third gate low voltage GVSS2 to the first gate driving panel circuit GPC #1.

The first gate low voltage line LVL1 may be a first gate low voltage node LV1 or may be electrically connected to the first gate low voltage node LV1. The second gate low voltage line LVL2 may be a second gate low voltage node LV2 or may be electrically connected to the second gate low voltage node LV2. The third gate low voltage line LVL3 may be a third gate low voltage node LV3 or may be electrically connected to the third gate low voltage node LV3.

Referring to FIG. 19B, the first gate low voltage GVSS0 may be supplied to the first to fourth scan output buffers (SCBUF1, SCBUF2, SCBUF3, and SCBUF4) included in the first output buffer block BUF #1 of the first gate driving panel circuit GPC #1.

The first gate low voltage GVSS0 may be applied to drain nodes or source nodes of first to fourth scan pull-down transistors (T7sc1, T7sc2, T7sc3, and T7sc4) respectively included in the first to fourth scan output buffers (SCBUF1, SCBUF2, SCBUF3, and SCBUF4).

To implement this, referring to FIG. 19B, the display panel 110 may further include a plurality of gate low voltage connection lines (LVL1_CP, LVL2_CP, and LVL3_CP) for connecting the gate low voltage lines (LVL1, LVL2, and LVL3) disposed in the second power line area PLA2 to the first gate driving panel circuit GPC #1 disposed in the gate driving panel circuit area GPCA.

Referring to FIG. 19B, the plurality of gate low voltage connection lines (LVL1_CP, LVL2_CP, and LVL3_CP) may run through the central area BDA in the area of the first output buffer block BUF #1.

Referring to FIG. 19B, for electrically connecting the drain nodes or source nodes of first and second scan pull-down transistors (T7sc1 and T7sc2) included in the two upper scan output buffers (SCBUF1 and SCBUF2) to the first gate low voltage line LVL1, a first gate low voltage connection line LVL1_CP may be disposed such that the first gate low voltage connection line LVL1_CP extends in the row direction. For electrically connecting the drain nodes or source nodes of third and fourth scan pull-down transistors (T7sc3 and T7sc4) included in the two lower scan output buffers (SCBUF3 and SCBUF4) to the first gate low voltage line LVL1, a first gate low voltage connection line LVL1_CP may be disposed such that the first gate low voltage connection line LVL1_CP extends in the row direction.

The first gate low voltage connection line LVL1_CP may run through the central area BDA located between the two upper scan output buffers (SCBUF1 and SCBUF2) and the two lower scan output buffers (SCBUF3 and SCBUF4).

Referring to FIG. 19B, the second gate low voltage GVSS1 may be supplied to the first logic block LOGIC #1 of the first gate driving panel circuit GPC #1.

The second gate low voltage GVSS1 may be applied to the drain node or source node of a first inverter control transistor T4$q$ included in the first logic block LOGIC #1.

To implement this, for connecting the drain node or source node of the first inverter control transistor T4$q$ included in the first logic block LOGIC #1 to the second gate low voltage line LVL2, the second gate low voltage connection line LVL2_CP may be disposed such that the second gate low voltage connection line LVL2_CP extends in the row direction.

The second gate low voltage connection line LVL2_CP may run through the central area BDA located between the two upper scan output buffers (SCBUF1 and SCBUF2) and the two lower scan output buffers (SCBUF3 and SCBUF4).

Referring to FIG. 19B, the third gate low voltage GVSS2 may be supplied to the first logic block LOGIC #1 of the first gate driving panel circuit GPC #1.

The third gate low voltage GVSS2 may be applied to the drain nodes or source nodes of holding transistors (Holding TFT) included in the first logic block LOGIC #1 and connected to the third gate low voltage node LV3. The holding transistors (Holding TFT) may include a second Q node discharging transistor T3$na$, a fourth Q node discharging transistor T3$nc$, a second stabilization transistor T3$a$, a second QB node discharging transistor T5$q$, a first QB node discharging transistor T5, and a fourth QB node discharging transistor T5$b$.

Further, the third gate low voltage GVSS2 may be applied to the drain node or source node of a carry pull-down transistor T7$cr$ included in the carry output buffer CRBUF of the first output buffer block BUF #1.

To implement this, for connecting the drain nodes or source nodes of the holding transistors (Holding TFT) included in the first logic block LOGIC #1 and connected to the third gate low voltage node LV3 to the third gate low voltage line LVL3, the third gate low voltage connection line LVL3_CP may be disposed such that the third gate low voltage connection line LVL3_CP extends in the row direction.

The third gate low voltage connection line LVL3_CP may also connect the drain node or source node of the carry pull-down transistor T7cr included in the carry output buffer CRBUF of the first output buffer block BUF #1 to the third gate low voltage line LVL3.

The third gate low voltage connection line LVL3_CP may run through the central area BDA located between the two upper scan output buffers (SCBUF1 and SCBUF2) and the two lower scan output buffers (SCBUF3 and SCBUF4).

As described above, since the two upper scan output buffers (SCBUF1 and SCBUF2) and the two lower scan output buffers (SCBUF3 and SCBUF4) included in the first output buffer block BUF #1 has a symmetrical structure about the central area BDA, therefore, the gate low voltages (GVSS0, GVSS1, and GVSS2) may be efficiently delivered (supplied).

Hereinafter, the usage and structure of the first, second, and third gate high voltage lines (HVL1, HVL2, and HVL3) will be discussed, and the usage and structure of the first, second, and third gate low voltage lines (LVL1, LVL2, and LVL3) will be discussed.

The first gate high voltage GVDD carried through the first gate high voltage line HVL1 may be a high voltage used to cause the Q node to charge by being supplied to a Q node charging block of the input and reset blocks IR. For example, the first gate high voltage GVDD carried through the first gate high voltage line HVL1 may be a high voltage used to cause the Q node to charge by being applied to the drain node or source node of a first Q node charging transistor T1.

Further, the first gate high voltage GVDD carried through the first gate high voltage line HVL1 may be a high voltage used to cause the Q node to charge by being supplied to the real-time sensing control block RT #1 during a real-time sensing driving period.

The second gate high voltage GVDD_o carried through the second gate high voltage line HVL2 may be a high voltage used to cause the QB node to charge by being supplied to the inverter block IVT.

The third gate high voltage GVDD2 carried through the third gate high voltage line HVL3 may be applied to the drain node (or source node) and the gate node of a first Q node charging control transistor T11, and be applied to a Q node charging control node Nqc through the first Q node charging control transistor T11. The first Q node charging control transistor T11 may serve to compensate for a negative threshold voltage of the first Q node charging transistor T1.

The first gate low voltage GVSS0 carried through the first gate low voltage line LVL1 may be supplied to the first to fourth scan output buffers (SCBUF1 to SCBUF4) of the first output buffer block BUF #1. Thereby, the first gate low voltage GVSS0 may cause voltage levels of first to fourth scan signals (SC1 to SC4) to have a turn-off voltage level, and in turn, turn off driving for the first to fourth scan signal lines (SCL1 to SCL4).

The second gate low voltage GVSS1 carried through the second gate low voltage line LVL2 may be a low voltage applied to the drain node or source node of the first inverter control transistor T4q included in the inverter block IVT.

The second gate low voltage GVSS1 may be configured as a separate low voltage separate from the third gate low voltage GVSS2.

The third gate low voltage GVSS2 carried through the third gate low voltage line LVL3 may be a low voltage used to cause the Q node to discharge (or turn off) and the QB node to discharge (or turn off) by being supplied to the first logic block LOGIC #1.

The third gate low voltage GVSS2 carried through the third gate low voltage line LVL3 may be a power supply voltage supplied to the largest number of transistors.

Each of the first gate high voltage GVDD, the second gate high voltage GVDD_o, the first gate low voltage GVSS0, the second gate low voltage GVSS1, and the third gate low voltage GVSS2 may be desired to have a smaller line resistance because the first gate high voltage GVDD, the second gate high voltage GVDD_o, the first gate low voltage GVSS0, the second gate low voltage GVSS1, and the third gate low voltage GVSS2 directly affect the output of the first gate driving panel circuit GPC #1.

Accordingly, the first gate high voltage GVDD, the second gate high voltage GVDD_o, the first gate low voltage GVSS0, the second gate low voltage GVSS1, and the third gate low voltage GVSS2 may have a multilayer line structure.

The first Q node charging control transistor T11 connected to the third gate high voltage line HVL3 may not require a relatively high voltage. Further, one or more lines may intersect, and overlap with, the third gate high voltage line HVL3. Considering these issues, the third gate high voltage line HVL3 may have a single-layer line structure.

The structure in the gate bezel area GBA described with reference to FIG. 19B is for the example where the gate driving panel circuit GPC is configured with the second type. It should be noted here that the structure in the gate bezel area GBA described with reference to FIG. 19B may be equally or substantially equally applied to the example where the gate driving panel circuit GPC is configured with the first type. For example, when the gate driving panel circuit GPC is configured with the first type, an area between the first gate driving panel circuit GPC #1 and the second gate driving panel circuit GPC #2 may be the central area BDA through which the first gate low voltage connection line LVL1_CP, the second gate low voltage connection line LVL2_CP, and the third gate low voltage connection line LVL3_CP run.

Hereinafter, the multilayer line structure of the plurality of clock signal lines CL will be described with reference to FIG. 20A, and then, the multilayer line structure of each of the first gate high voltage line HVL1, the second gate high voltage line HVL2, the first gate low voltage line LVL1, the second gate low voltage line LVL2, and the third gate low voltage line LVL3 will be described with reference to FIG. 20B. Thereafter, the single-layer line structure of the third gate high voltage line HVL3 will be described with reference to FIG. 20C.

Figure 20A:
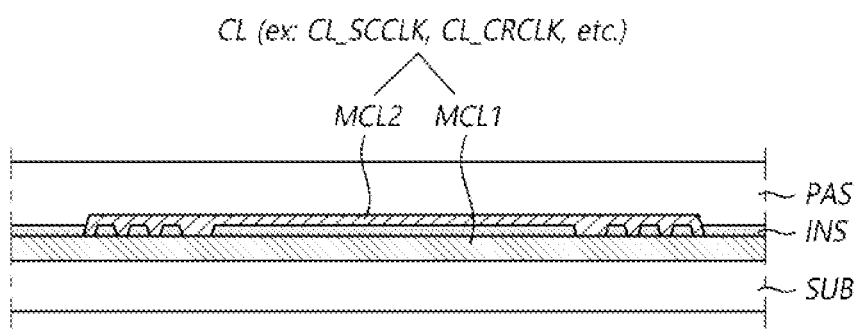
FIG. 20A illustrates an example multilayer line structure of one or more clock signal lines disposed in the gate bezel area of the display panel according to aspects of the present disclosure.

FIG. 20A illustrates an example multilayer line structure of one or more clock signal lines CL disposed in the gate bezel area GBA of the display panel 110 according to aspects of the present disclosure.

Referring to FIG. 20A, a plurality of clock signal lines CL disposed in a clock signal line area CLA may include a carry clock signal line CL_CRCLK and a scan clock signal line CL_SCCLK, and further include a sensing clock signal line. All or one or more of the plurality of clock signal lines CL may be multilayer lines. That is, at least one clock signal line CL may have a multilayer line structure.

Referring to FIG. 20A, the clock signal line(s) CL having such a multilayer line structure may include a first metal clock signal line MCL1 and a second metal clock signal line MCL2, which are electrically connected to each other. The first metal clock signal line MCL1 and the second metal clock signal line MCL2 may be located in different layers and be electrically connected to each other.

The first metal clock signal line MCL1 may be disposed in a first metal layer, which is a metal layer between a substrate SUB and an insulating layer INS on the substrate SUB.

The second metal clock signal line MCL2 may be disposed in a second metal layer, which is a metal layer between the insulating layer INS and a protective layer PAS on the insulating layer INS.

For example, the insulating layer INS may include a buffer layer and a gate insulating layer.

The second metal clock signal line MCL2 may be connected to the first metal clock signal line MCL1 through a contact hole in the insulating layer INS.

For example, a light shield may be located under an active layer (channel) of a driving transistor DRT disposed in the display area DA and may overlap with the channel of the driving transistor DRT. The insulating layer (e.g., the buffer layer) may be disposed between the channel of the driving transistor DRT and the light shield. The light shield may be formed from a first metal (e.g., a light shield metal). That is, the first metal layer may be a metal layer in which the light shield is disposed.

One of the two or more capacitor electrodes constituting a storage capacitor Cst formed in the display area DA may be formed from the first metal (the light shield metal). That is, the first metal layer may be a metal layer in which one of two or more capacitor electrodes constituting the storage capacitor Cst is disposed.

In another example, the source and drain electrode of the transistor may be formed from a first metal (e.g., a source-drain metal). That is, the first metal layer may be a metal layer in which the source and drain electrodes of the transistor are disposed.

For example, a scan signal line SCL and a sensing signal line SENL may be formed from a second metal (e.g., a gate metal). That is, the second metal layer may be a metal layer in which the scan signal line SCL and the sensing signal line SENL are disposed. The second metal layer may be a metal layer in which the other one or another one of two or more capacitor electrodes constituting the storage capacitor Cst formed in the display area DA is disposed.

Figure 20B:
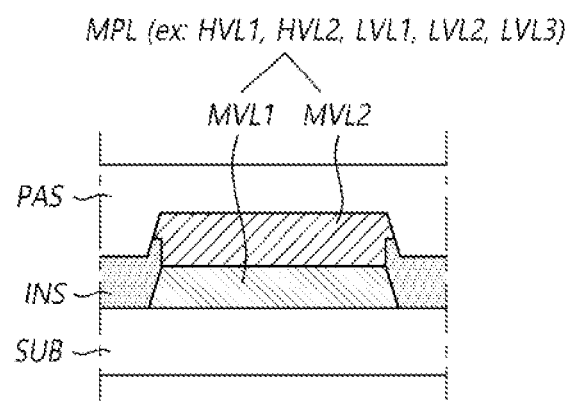
FIG. 20B illustrates an example multilayer line structure of one or more power lines disposed in the gate bezel area of the display panel according to aspects of the present disclosure.

FIG. 20B illustrates an example multilayer line structure of at least one multilayer power line MPL disposed in the gate bezel area GBA of the display panel 110 according to aspects of the present disclosure.

At least one multilayer power line MPL having a multilayer line structure may be disposed in the gate bezel area GBA.

The multilayer power line MPL may include a first metal power line MVL1 and a second metal power line MVL2. The first metal power line MVL1 and the second metal power line MVL2 may be located in different layers and may be electrically connected to each other.

The first metal power line MVL1 may be disposed in a first metal layer between a substrate SUB and an insulating layer INS on the substrate SUB. The second metal power line MVL2 may be disposed in a second metal layer between the insulating layer INS and a protective layer PAS on the insulating layer INS. For example, the insulating layer INS may include a buffer layer and a gate insulating layer.

The second metal power line MVL2 may be connected to the first metal power line MVL1 through a contact hole in the insulating layer INS.

For example, the first metal layer may be a metal layer in which a light shield located under the channel of a driving transistor DRT formed in the display area DA is disposed. The first metal layer may be a metal layer in which one of two or more capacitor electrodes constituting a storage capacitor Cst formed in the display area DA is disposed.

In another example, the first metal layer may be a metal layer constituting the source and drain electrode of the transistor.

For example, the second metal layer may be a metal layer in which a scan signal line SCL and a sensing signal line SENL are disposed. The second metal layer may be a metal layer in which the other one or another one of two or more capacitor electrodes constituting the storage capacitor Cst formed in the display area DA is disposed.

For example, the multilayer power line MPL having the multilayer line structure may include the first gate high voltage line HVL1, the second gate high voltage line HVL2, the first gate low voltage line LVL1, the second gate low voltage line LVL2, and the third gate low voltage line LVL3.

Figure 20C:
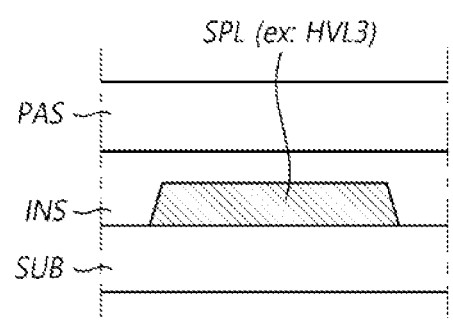
FIG. 20C illustrates an example single-layer line structure of a power line disposed in the gate bezel area of the display panel according to aspects of the present disclosure.

FIG. 20C illustrates an example single-layer line structure of at least one single-layer power line disposed in the gate bezel area GBA of the display panel 110 according to aspects of the present disclosure.

At least one single-layer power line SPL having a single-layer line structure may be disposed in the gate bezel area GBA.

The single-layer power line SPL may be disposed in a first metal layer between a substrate SUB and an insulating layer INS on the substrate SUB. For example, the insulating layer INS may include a buffer layer and a gate insulating layer.

For example, the first metal layer may be a metal layer in which a light shield located under the channel of a driving transistor DRT formed in the display area DA is disposed. The first metal layer may be a metal layer in which one of two or more capacitor electrodes constituting a storage capacitor Cst formed in the display area DA is disposed.

In another example, the first metal layer may be a metal layer constituting the source and drain electrode of the transistor.

For example, the single-layer power line SPL having the single-layer line structure may include the third gate high voltage line HVL3.

Referring to FIGS. 20A, 20B, and 20C, all or one or more of the plurality of clock signal lines CL may be multilayer lines. At least one of the plurality of gate high voltage lines HVL may be a single-layer line, and the remaining gate high voltage lines HVL may be multilayer lines. The plurality of gate low voltage lines LVL may be multilayer lines.

Figure 21:
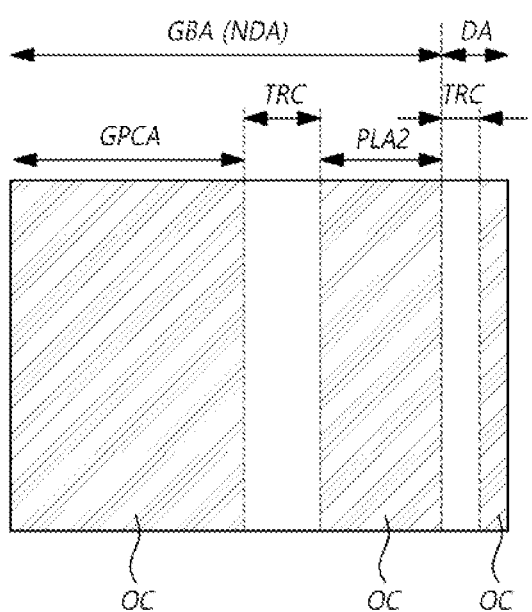
FIGS. 21 and 22 respectively are a plan view and a cross-sectional view for an example area including the gate bezel area in the display panel according to aspects of the present disclosure.

FIG. 21 is a plan view of an example area including the gate bezel area GBA in the display device 100 according to aspects of the present disclosure.

Referring to FIG. 21, the gate bezel area GBA of the non-display area NDA may include a gate driving panel circuit area GPCA and a second power line area PLA2.

Referring to FIG. 21, an overcoat layer OC may be disposed in the gate bezel area GBA of the non-display area NDA. At least one trench TRC in which the overcoat layer OC is removed may present in the gate bezel area GBA.

For example, the at least one trench TRC may be formed in at least one of a first area between the gate driving panel circuit area GPCA and the second power line area PLA2 and a second area between the second power line area PLA2 and the display area DA.

For example, a first trench TRC may be located in the first area between the gate driving panel circuit area GPCA and the second power line area PLA2. That is, the overcoat layer OC may be disposed in each of the gate driving panel circuit area GPCA and the second power line area PLA2, and an area (i.e., the first area) between the gate driving panel circuit area GPCA and the second power line area PLA2, in which the overcoat layer is not disposed, may correspond to the first trench TRC.

For example, a second trench TRC may additionally located in the second area between the second power line area PLA2 and the display area DA. That is, the overcoat layer OC may be disposed in each of the second power line area PLA2 and the display area DA, and an area (i.e., the second area) between the second power line area PLA2 and the display area DA, in which the overcoat layer is not disposed, may correspond to the second trench TRC.

As the display panel 110 has the above-described trench structure, the penetration of moisture $H_2O$ into an emission layer EL may be prevented.

Figure 22:
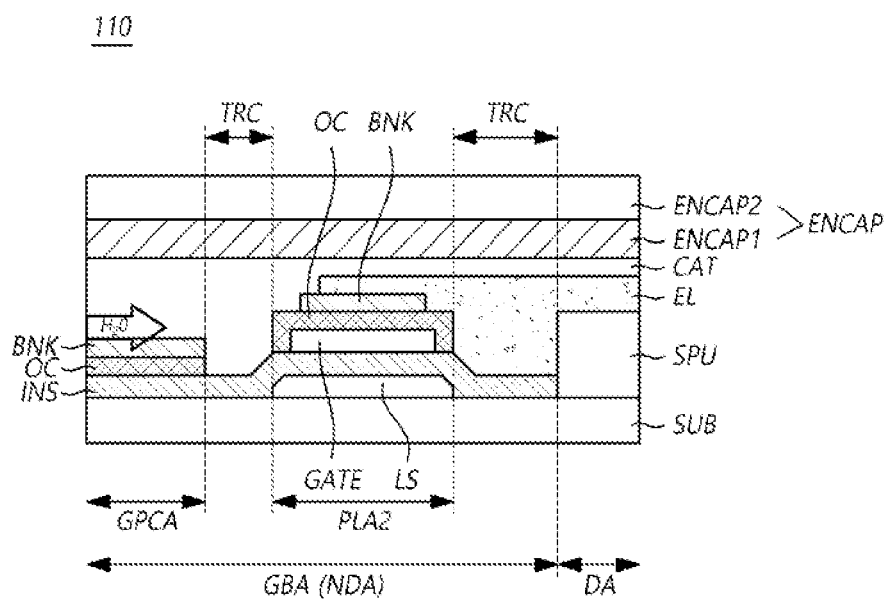

FIG. 22 is a cross-sectional view of an example area including the gate bezel area GBA in the display panel 110 according to aspects of the present disclosure.

Referring to FIG. 22, a light shield LS may be disposed on a substrate SUB in a second power line area PLA2 of the gate bezel area GBA.

In the gate bezel area GBA, an insulating layer INS may be disposed such that the insulating layer INS covers the light shield LS.

In the second power line area PLA2 of the gate bezel area GBA, a gate material layer GATE may be disposed on the insulating layer INS and overlap with the light shield LS.

In the gate driving panel circuit area GPCA of the gate bezel area GBA, an overcoat layer OC may be disposed on the insulating layer INS.

In the second power line area PLA2 of the gate bezel area GBA, the overcoat layer OC may be disposed such that the overcoat layer OC covers the gate material layer GATE on the insulating layer INS.

In a gate driving panel circuit area GPCA and the second power line area PLA2 of the gate bezel area GBA, a bank BNK may be disposed on the overcoat layer OC.

In the gate bezel area GBA, a trench TRC may be formed in an area between the gate driving panel circuit area GPCA and the second power line area PLA2, in which the overcoat layer OC and the bank BNK are not present (or removed).

In the gate bezel area GBA, an additional trench TRC may be formed in an area between the second power line area PLA2 and the display area DA, in which the overcoat layer OC and the bank BNK are not present (or removed).

Meanwhile, in the display area DA, an emission layer EL may be disposed under a cathode electrode CAT, and a subpixel section SPU may be located under the emission layer EL. The subpixel section SPU may include an anode electrode AE, transistors (DRT, SCT, SENT, and the like), and a storage capacitor Cst. The emission layer EL may extend to the gate bezel area GBA of the non-display area NDA.

For example, the emission layer EL may extend from the display area DA to the non-display area NDA and extend to an upper portion of the bank BNK in the second power line area PLA2 via the trench TRC.

In the display area DA, the cathode electrode CAT may be disposed on the emission layer EL. The cathode electrode CAT may extend to the gate bezel area GBA of the non-display area NDA. Accordingly, the cathode electrode CAT may extend from the display area DA to all or a portion of the gate driving panel circuit area GPCA.

The cathode electrode CAT may be disposed in an area in which the trench TRC between the gate driving panel circuit area GPCA and the second power line area PLA2 is present, and disposed in an area in which the trench TRC between the second power line area PLA2 and the display area DA is present.

An encapsulation layer ENCAP may be disposed on the cathode electrode CAT. The encapsulation layer ENCAP may extend from the display area DA to a portion of the non-display area NDA.

The encapsulation layer ENCAP may include a first encapsulation layer ENCAP1 on the cathode electrode CAT and a second encapsulation layer ENCAP2 on the first encapsulation layer ENCAP1. For example, the first encapsulation layer ENCAP1 may include an adhesive and/or a moisture absorbent having an encapsulation function. The first encapsulation layer ENCAP1 may include an organic material. The second encapsulation layer ENCAP2 may include a metal or an inorganic material.

Figure 23:
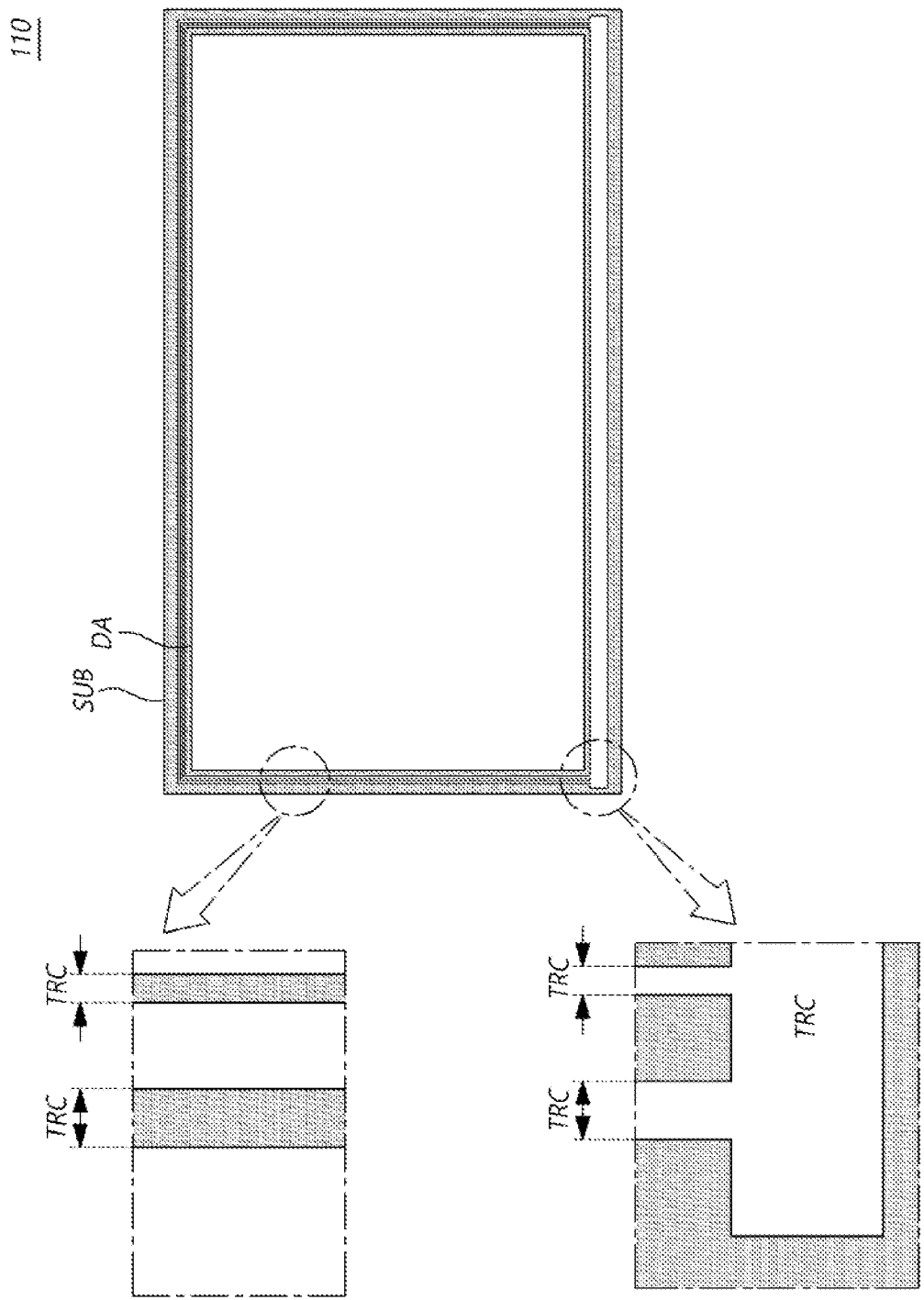
FIG. 23 is an example plan view of the display panel according to aspects of the present disclosure, and illustrates an example trench (or trenches) formed in one or more edges of the display panel.

FIG. 23 is an example plan view of the display panel 110 according to aspects of the present disclosure, and illustrates an example trench (or trenches) formed in one or more edges of the display panel 110 (e.g., upper, lower, left, and/or right edges).

Referring to FIG. 23, a trench TRC may be formed along the entire edge of the display panel 110. That is, the trench TRC may be located in the non-display area NDA such that the trench TRC surrounds the display area DA.

Referring to FIG. 23, for example, two rows of trenches TRC as shown in FIGS. 21 and 22 may be formed in three outer edges among four outer edges of the display panel 110. For example, a width of a single row of trench TRC (e.g., formed in a bottom outer edge of the display panel 110) may be greater than a width of each of the two rows of trenches TRC.

Referring to FIG. 23, for example, a single row of trench TRC may be formed in one of the four outer edges of the display panel 110. The one outer edge in which the single row of trench TRC is formed may be an area in which circuit films CF on which source driver integrated circuits SDIC are mounted are connected.

Figure 24:
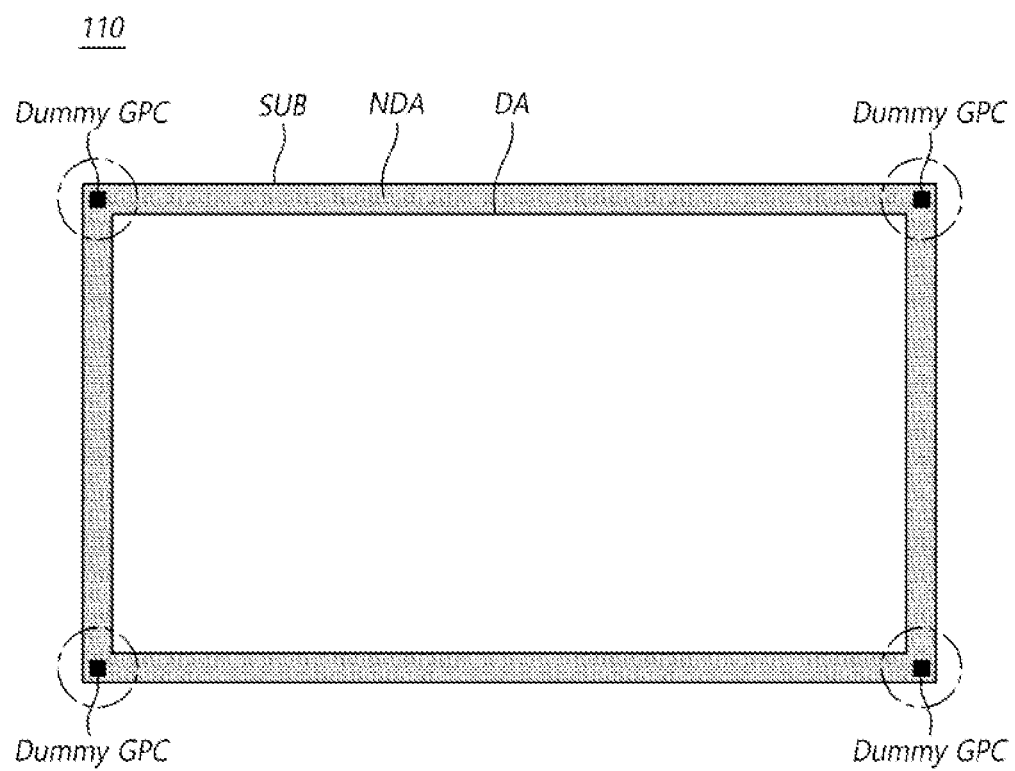
FIG. 24 is an example plan view of the display panel according to aspects of the present disclosure, and illustrates one or more example dummy gate driving panel circuits disposed in one or more corner areas of the display panel.

FIG. 24 is an example plan view of the display panel 110 according to aspects of the present disclosure, and illustrates one or more example dummy gate driving panel circuits (Dummy GPC) disposed in one or more corner areas of the display panel 110 (e.g., upper-left, upper-right, lower-left, and/or lower-rights corners).

Referring to FIG. 24, in one or more aspects, the display panel 110 according to aspects of the present disclosure may include one or more dummy gate driving panel circuits (Dummy GPC) disposed at all, or one or more, of a plurality of corner areas (or corner points) of the non-display area DNA.

The dummy gate driving panel circuit (Dummy GPC) may have basically the same structure as the first or second type of gate driving panel circuit GPC. However, the dummy gate driving panel circuit (Dummy GPC) may not be connected to a gate line GL actually used to drive the display. For example, such a gate line GL may be a scan signal line SCL or a sensing signal line SENL.

Figure 25:
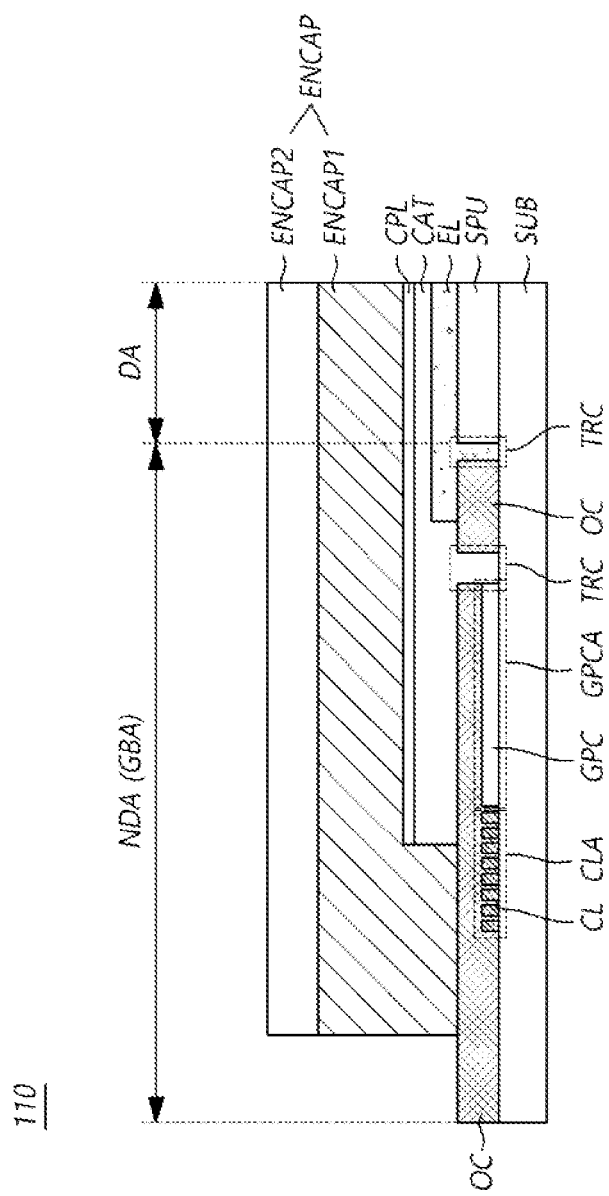
FIG. 25 is an example cross-sectional view of the display panel according to aspects of the present disclosure, and illustrates an area including the gate bezel area and a portion of display area.

FIG. 25 is an example cross-sectional view of the display panel 110 according to aspects of the present disclosure, and illustrates an area including the gate bezel area GBA and a portion of display area DA.

The cross-sectional view of FIG. 25 represents an area including the gate bezel area GBA where a gate driving panel circuit GPC (e.g., the first type of gate driving panel circuit GPC or the second type of gate driving panel circuit GPC discussed above) is disposed and a portion of the display area DA adjacent to the gate bezel area GBA in the non-display area NDA of the display panel 110.

Referring to FIG. 25, in one or more aspects, the display panel 110 according to aspects of the present disclosure may include a substrate SUB, the gate driving panel circuit GPC, a plurality of clock signal lines CL, an overcoat layer OC, a cathode electrode CAT, and the like.

The display area DA and the non-display area NDA may be defined on the substrate SUB.

The gate driving panel circuit GPC may be disposed in a gate driving panel circuit area GPCA included in the gate bezel area GBA of the non-display area NDA of the substrate SUB, and be configured to output a corresponding gate signal to each of a plurality of gate lines GL disposed in the display area DA.

For example, when the first type of gate driving panel circuit GPC is applied, the plurality of gate lines may include a plurality of scan signal lines SCL and a plurality of sensing signal lines SENL. In another example, when the second type of gate driving panel circuit GPC is applied, the plurality of gate lines may include a plurality of scan signal lines SCL.

The plurality of clock signal lines CL may be disposed in a clock signal line area CLA located on a first side of the gate driving panel circuit area GPCA in the non-display area NDA of the substrate SUB. Each of the plurality of clock signal lines CL may deliver a corresponding clock signal to the gate driving panel circuit GPC.

For example, the clock signal line area CLA may be located further away from the display area DA than the gate driving panel circuit area GPCA. For example, the clock signal line area CLA may be located in a further outer edge of the substrate SUB than the gate driving panel circuit area GPCA.

For example, when the first type of gate driving panel circuit GPC is applied, the plurality of clock signal lines CL may include a plurality of carry clock signal lines CL_CRCLK, a plurality of scan clock signal lines CL_SCCLK, and a plurality of sensing clock signal lines CL_SECLK. In another example, when the second type of gate driving panel circuit GPC is applied, the plurality of clock signal lines CL may include a plurality of scan clock signal lines CL_SCCLK and a plurality of carry clock signal lines CL_CRCLK.

The overcoat layer OC may be disposed on the plurality of clock signal lines CL.

The overcoat layer OC may be disposed on the gate driving panel circuit GPC.

The cathode electrode CAT may be disposed in the display area DA and extend to the non-display area NDA.

The cathode electrode CAT may extend to the gate bezel area GBA in the non-display area NDA. For example, the cathode electrode CAT may extend to all or at least a portion of the gate driving panel circuit GPC such that the cathode electrode CAT is located on (or covers) all or at least a portion of the gate driving panel circuit GPC. According to this configuration, the cathode electrode CAT may overlap with all or at least a portion of the gate driving panel circuit GPC.

The cathode electrode CAT may extend to the gate bezel area GBA of the non-display area NDA. For example, the cathode electrode CAT may extend to all, or one or more, of the plurality of clock signal lines CL such that the cathode electrode CAT is located on (or covers) all, or one or more, of the plurality of clock signal lines CL. According to this configuration, the cathode electrode CAT may overlap with all, or one or more, of the plurality of clock signal lines CL.

A first power line area PLA1 may be disposed between the clock signal line area CLA and the gate driving panel circuit area GPCA, and a second power line area PLA2 may be disposed between the gate driving panel circuit area GPCA and the display area DA. It should be noted that, in FIG. 25, the first power line area PLA1 and the second power line area PLA2 are omitted.

Referring to FIG. 25, an emission layer EL located under the cathode electrode CAT may be disposed in the display area DA and, for example, extend to a portion of the non-display area NDA. The emission layer EL may overlap with a portion of the overcoat layer OC.

A subpixel section SPU may be located under the emission layer EL. The subpixel section SPU may include an anode electrode AE, transistors (DRT, SCT, SENT, and the like), and a storage capacitor Cst.

Referring to FIG. 25, one or more trenches TRC, which may be holes formed in the overcoat layer OC or areas in which corresponding portions of the overcoat layer OC are removed, may be present in the non-display area NDA. For example, when a plurality of trenches TRC are present, one of the plurality of trenches TRC may not overlap with the emission layer EL, and the other or another thereof may overlap with the emission layer EL. The emission layer EL may extend to the non-display area NDA and be inserted into the one or more trenches TRC formed in the overcoat layer OC.

Referring to FIG. 25, one or more aspects, the display panel 110 according to aspects of the present disclosure may include a capping layer CPL disposed on the cathode electrode CAT and an encapsulation layer ENCAP disposed on the capping layer CPL.

The encapsulation layer ENCAP may include a first encapsulation layer ENCAP1 and a second encapsulation layer ENCAP2. For example, the first encapsulation layer ENCAP1 may include an adhesive and/or a moisture absorbent having an encapsulation function. The first encapsulation layer ENCAP1 may include an organic material. The second encapsulation layer ENCAP2 may include a metal or an inorganic material. The second encapsulation layer ENCAP2 may be disposed such that the second encapsulation layer ENCAP2 covers the cathode electrode CAT, the capping layer CPL, and the first encapsulation layer ENCAP1.

The encapsulation layer ENCAP may overlap with the plurality of clock signal lines CL and the gate driving panel circuit GPC.

Each of the emission layer EL, the cathode electrode CAT, and the capping layer CPL may have a slightly different size or edge position from each other depending on process errors during the manufacturing process of the display panel 110. For example, the cathode electrode CAT may not overlap with all of the plurality of clock signal lines CL disposed in the clock signal line area CLA. Depending on the process errors, a portion of the cathode electrode CAT may overlap with all or one or more of the plurality of clock signal lines CL disposed in the clock signal line area CLA.

Figure 26:
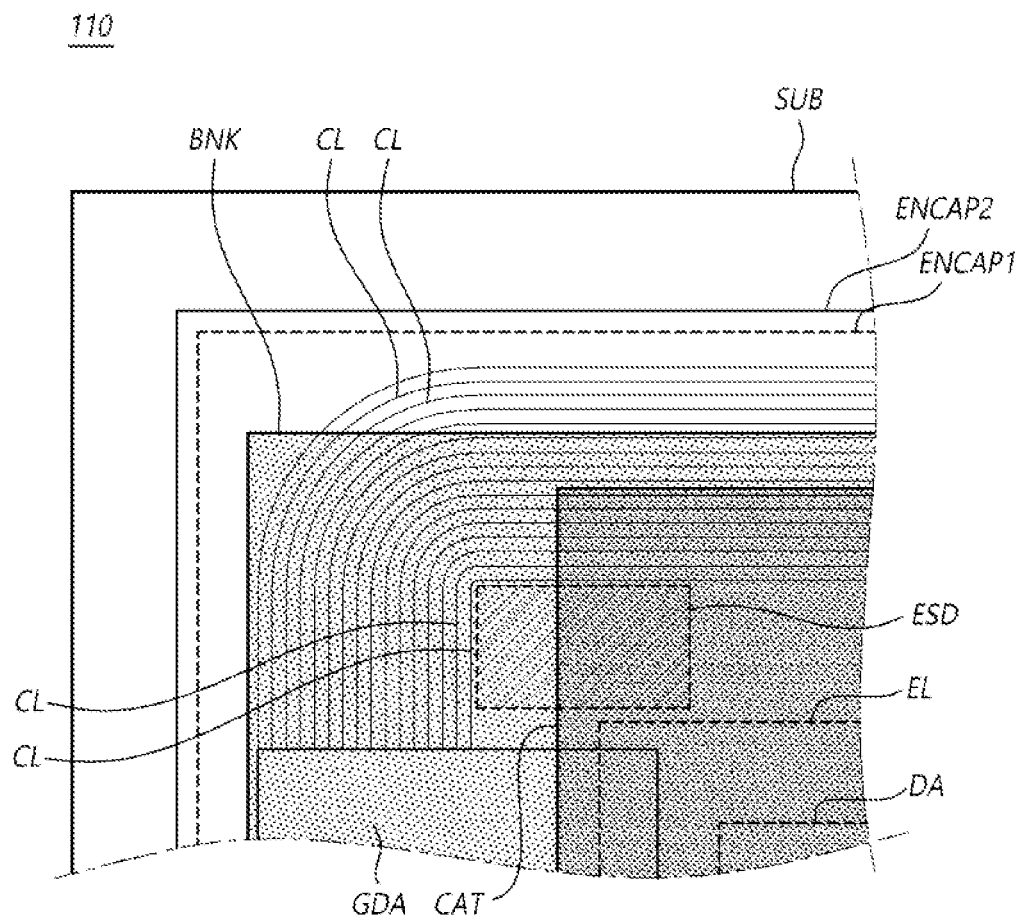
FIG. 26 is a plan view illustrating an example outer corner area of the display panel according to aspects of the present disclosure.

FIG. 26 is a plan view illustrating an example outer corner area of the substrate SUB of the display panel 110 according to aspects of the present disclosure.

Referring to FIG. 26, in one or more aspects, the display panel 110 according to aspects of the present disclosure may include a bank BNK extending from the display area DA to the non-display area NDA, an emission layer EL (e.g., the emission layer EL discussed above with reference to FIG. 25) extending from the display area DA to the non-display area NDA, a cathode electrode CAT (e.g., the cathode electrode CAT discussed above with reference to FIG. 25) extending from the display area DA to the non-display area NDA and located on the emission layer EL, and an electrostatic discharge component ESD disposed in the outer corner area of the non-display area NDA.

Referring to FIG. 26, in one or more aspects, a corner portion of bank BNK, a corner portion of cathode electrode CAT, a corner portion of a first encapsulation layer ENCAP1 (e.g., the first encapsulation layer ENCAP1 discussed above with reference to FIG. 25), and a corner portion of a second encapsulation layer ENCAP2 (e.g., the second encapsulation layer ENCAP2 discussed above with reference to FIG. 25) may be located in the outer corner area of the substrate SUB of the display panel 110.

Referring to FIG. 26, in the outer corner area of the display panel 110, among the bank BNK, the cathode electrode CAT, the first encapsulation layer ENCAP1, and the second encapsulation layer ENCAP2, the bank BNK may extend further outwardly than the cathode electrode CAT, and the first encapsulation layer ENCAP1 and the second encapsulation layer ENCAP2 may extend further outwardly than the bank BNK. The second encapsulation layer ENCAP2 may extend to a location the same as, or similar to, a location to which the first encapsulation layer ENCAP1 extends, or may extend further outwardly than the first encapsulation layer ENCAP1.

Referring to FIG. 26, a portion of a gate driving area GDA may be disposed in the outer corner area of the substrate SUB of the display panel 110.

Referring to FIG. 26, the gate driving area GDA may include the gate driving panel circuit area GPCA in which the gate driving panel circuit GPC is disposed. The gate driving area GDA may further include the clock signal line area CLA, the first power line area PLA1, and the second power line area PLA2.

Referring to FIG. 26, the gate driving area GDA may overlap with the bank BNK, the first encapsulation layer ENCAP1, and the second encapsulation layer ENCAP2. All or a portion of the gate driving area GDA may overlap with the cathode electrode CAT.

Referring to FIG. 26, the electrostatic discharge component ESD may be disposed in the outer corner area of the substrate SUB of the display panel 110. For example, the electrostatic discharge component ESD may include an electrostatic discharge circuit or an electrostatic discharge pattern.

A location at which the electrostatic discharge component ESD is disposed is not limited thereto. For example, one or more additional electrostatic discharge components ESD may be disposed in one or more other locations of the display device 100, in addition to the outer corner area shown in FIG. 26, or one or more other portions of the electrostatic discharge component ESD may be disposed in one or more other locations of the display device 100.

Referring to FIG. 26, the electrostatic discharge component ESD may overlap with the bank BNK. All or a portion of the electrostatic discharge component ESD may overlap with the cathode electrode CAT. The electrostatic discharge component ESD may overlap with the first encapsulation layer ENCAP1 and the second encapsulation layer ENCAP2, For example, the bank BNK may be disposed on the entire top surface, or over all, of the electrostatic discharge component ESD. The cathode electrode CAT may be disposed on the top surface of, or over, a portion of the electrostatic discharge component ESD.

Referring to FIG. 26, the plurality of clock signal lines CL may be disposed along an outer corner of the substrate SUB.

Referring to FIG. 26, the plurality of clock signal lines CL may overlap with the bank BNK, the first encapsulation layer ENCAP1, and the second encapsulation layer ENCAP2. All, or one or more, of the plurality of clock signal lines CL may overlap with the cathode electrode CAT. All, or one or more, of the plurality of clock signal lines CL may not overlap with the electrostatic discharge component ESD.

Referring to FIG. 26, the emission layer EL may be disposed to extend from the display area DA to the non-display area NDA. For example, the emission layer EL may be one of components for composing one of an OLED, a quantum dot organic light emitting diode (QD-OLED), and a LED chip.

Referring to FIG. 26, a portion of the gate driving area GDA may overlap with the emission layer EL. The electrostatic discharge component ESD may not overlap with the emission layer EL. In one or more aspects, the electrostatic discharge component ESD may overlap with all or a portion of the emission layer EL.

Figure 27:
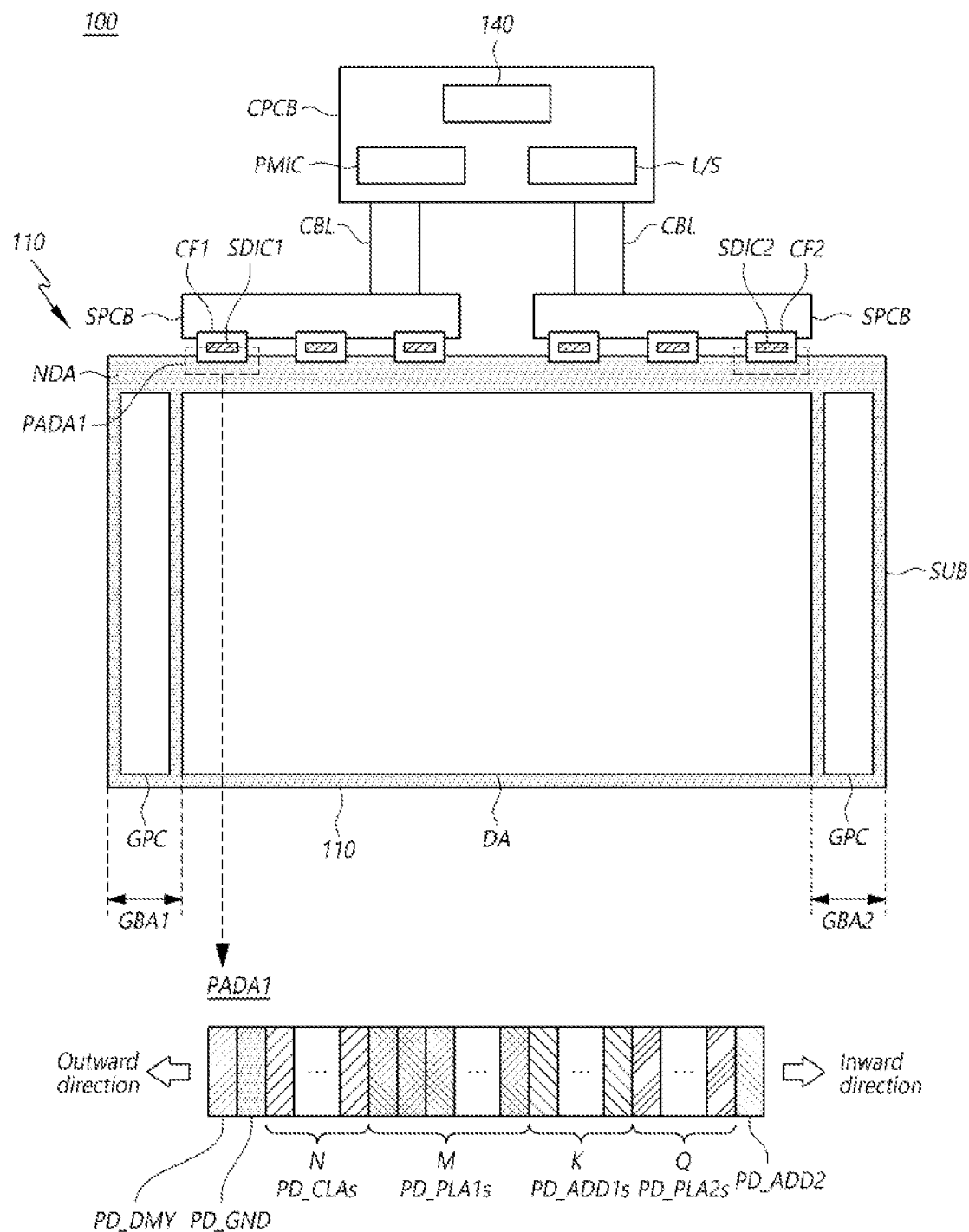
FIG. 27 illustrates an example pad arrangement in a first pad area of the display panel according to aspects of the present disclosure.

FIG. 27 illustrates an example pad arrangement in a first pad area PADA1 of the display panel 110 according to aspects of the present disclosure. The system of the display device 100 shown in FIG. 27 may be the same as the system of the display device 100 shown in FIG. 8.

Referring to FIG. 27, in one or more aspects, the display device 100 according to aspects of the present disclosure may include the display panel 110 including a substrate SUB, at least one source printed circuit board SPCB, a control printed circuit board CPCB, a plurality of circuit films CF connected between the substrate SUB and the source printed circuit board SPCB, and a connection cable CBL for connecting the source printed circuit board SPCB and the control printed circuit board CPCB.

A controller 140, a power management integrated circuit PMIC, and a level shifter (L/S) may be disposed on the control printed circuit board CPCB. A source driver integrated circuit SDIC may be mounted on each of the plurality of circuit films CF.

The substrate SUB of the display panel 110 may include a display area DA in which an image may be displayed and a non-display area NDA different from the display area DA.

The non-display area NDA may include a first gate bezel area GBA1 located on a first side of the display area DA and a second gate bezel area GBA2 located on a second opposing side of the display area DA.

The non-display area NDA may include a plurality of pad areas. The plurality of pad areas included in the non-display area NDA may include a first pad area PADA1 adjacent to the first gate bezel area GBA1 and a second pad area PADA2 adjacent to the second gate bezel area GBA2.

The plurality of circuit films CF may be connected to the plurality of pad areas included in the non-display area NDA of the substrate SUB.

The plurality of circuit films CF may include a first circuit film CF1 connected to the first pad area PADA1 and a second circuit film CF2 connected to the second pad area PADA2.

The first circuit film CF1 may be an outmost circuit film CF in a first direction among the plurality of circuit films (CF), and connect the first pad area PADA1 of the substrate SUB to a corresponding source printed circuit board SPCB.

The second circuit film CF2 may be an outmost circuit film CF in a second opposing direction among the plurality of circuit films CF, and connect the second pad area PADA2 of the substrate SUB to a corresponding source printed circuit board SPCB.

The source printed circuit board SPCB to which the first circuit film CF1 is connected and the source printed circuit board SPCB to which the second circuit film CF2 is connected may be the same or different.

For example, a first source driver integrated circuit SDIC1 may be disposed on the first circuit film CF1, and a second source driver integrated circuit SDIC2 may be disposed on the second circuit film CF2.

Referring to FIG. 27, a pad arrangement in the first pad area PADA1 and a pad arrangement in the second pad area PADA2 may be opposite to each other. Considering such an arrangement, discussions will be provided for a pad arrangement in the first pad area PADA1 as a representative example.

Referring to FIG. 27, the pad arrangement in the first pad area PADA1 may be related to a line arrangement in the first gate bezel area GBA1.

Referring to FIG. 27, a plurality of pads disposed in the first pad area PADA1 may include N clock pads PD_CLA electrically connected to a plurality of clock signal lines CL disposed in a clock signal line area CLA of the first gate bezel area GBA1, M first line pads PD_PLA1 electrically connected to a plurality of first lines disposed in a first power line area PLA1 of the first gate bezel area GBA1, and Q second line pads PD_PLA2 electrically connected to a plurality of second lines disposed in a second power line area PLA2 of the first gate bezel area GBA1. Here, N may be a natural number of 2 or more, M may be a natural number of 1 or more, and Q may be a natural number of 1 or more.

Referring to FIG. 27, the plurality of pads disposed in the first pad area PADA1 may further include K first additional pads PD_ADD1 disposed between the M first line pads PD_PLA1 and the Q second line pads PD_PLA2. Here, K may be a natural number of 1 or more.

The plurality of pads disposed in the first pad area PADA1 may further include at least one second additional pad PD_ADD2 disposed further inwardly than the Q second line pads PD_PLA2.

The plurality of pads disposed in the first pad area PADA1 may further include a ground pad PD_GND disposed further outwardly than the N clock pads PD_CLA.

The plurality of pads disposed in the first pad area PADA1 may further include a dummy pad PD_DMY disposed further outwardly than the ground pad PD_GND.

Figure 28:
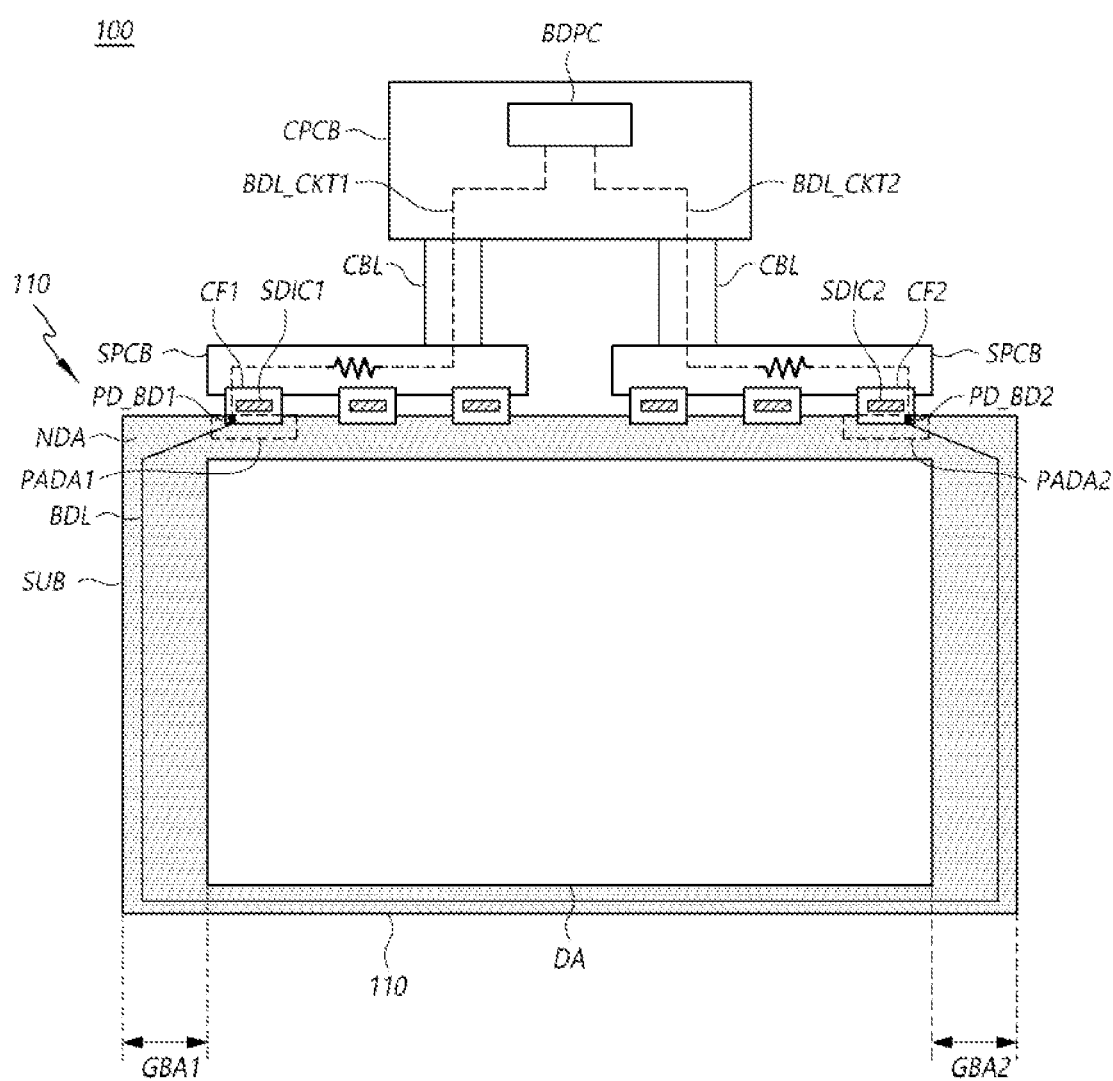
FIG. 28 illustrates an example defect detection and protection system included in the display device according to aspects of the present disclosure.

FIG. 28 illustrates an example defect detection and protection system included in the display device 100 according to aspects of the present disclosure.

Referring to FIG. 28, the defect detection and protection system included in the display device 100 may detect a possibility that a defect accident may occur and prevent such a defect accident in the display panel 110. For example, in the present disclosure, defect detection and protection may be burning detection and protection of the display panel or components included therein.

Referring to FIGS. 27 and 28, in one or more aspects, the defect detection and protection system included in the display device 100 according to aspects of the present disclosure may include a defect detection line BDL disposed in the non-display area NDA of the substrate SUB, a first defect detection pad PD_BD1 disposed in the first pad area PADA1 of the substrate SUB and connected to the defect detection line BDL, a defect detection and protection circuit BDPC disposed on the control printed circuit board CPCB, and a first defect detection circuit wiring unit BDL_CKT1 for connecting the first defect detection pad PD_BD1 on the substrate SUB and the defect detection and protection circuit BDPC in the control printed circuit board CPCB.

The first defect detection circuit wiring unit BDL_CKT1 may electrically connect the first defect detection pad PD_BD1 in the first pad area PADA1 and the defect detection and protection circuit BDPC.

The first defect detection circuit wiring unit BDL_CKT1 may be disposed along the first circuit film CF1, the source printed circuit board SPCB, the connection cable CBL, and the control printed circuit board CPCB.

Referring to FIG. 28, in one or more aspects, the defect detection and protection system included in the display device 100 according to aspects of the present disclosure may further include a second defect detection pad PD_BD2 disposed in the second pad area PADA2 of the substrate SUB and connected to the defect detection line BDL, and a second defect detection circuit wiring unit BDL_CKT2 for connecting the second defect detection pad PD_BD2 on the substrate SUB and the defect detection and protection circuit BDPC on the control printed circuit board CPCB.

The second defect detection circuit wiring unit BDL_CKT2 may electrically connect the second defect detection pad PD_BD2 in the second pad area PADA2 and the defect detection and protection circuit BDPC.

The second defect detection circuit wiring unit BDL_CKT2 may be disposed along the second circuit film CF2, the source printed circuit board SPCB, the connection cable CBL, and the control printed circuit board CPCB.

Referring to FIG. 28, the first defect detection pad PD_BD1 may be connected to a first end among both ends of the defect detection line BDL, and the second defect detection pad PD_BD2 may be connected to a second end among both ends of the defect detection line BDL.

Referring to FIG. 28, the defect detection line BDL may be disposed such that the defect detection line BDL surrounds three sides, except for one side, among four sides of the display area DA, and electrically interconnect the first defect detection pad PD_BD1 and the second defect detection pad PD_BD2.

The first defect detection pad PD_BD1 and the second defect detection pad PD_BD2 may be located in an outer edge on the one side of the display area DA.

The defect detection and protection circuit BDPC may be configured to protect the display panel 110 by detecting an abnormality in the defect detection line BDL. To implement this, the defect detection and protection circuit BDPC may supply an inspection voltage to the defect detection line BDL through the first defect detection circuit wiring unit BDL_CKT1, and detect a state of a current flowing in the defect detection line BDL through the first defect detection circuit wiring unit BDL_CKT1.

When an abnormality in the defect detection line BDL does not occur, a normal current may flow in the defect detection line BDL. However, when an abnormality in the defect detection line BDL occurs, an abnormal current may flow in the defect detection line BDL.

The normal current may be a current corresponding to the inspection voltage.

A total resistance of the first defect detection circuit wiring unit BDL_CKT1, the first defect detection pad PD_BD1, the defect detection line BDL, the second defect detection pad PD_BD2, and the second defect detection circuit wiring unit BDL_CKT2 may have a predetermined value.

When the defect detection line BDL is in a normal state, a current flowing through the defect detection line BDL may correspond to a value resulting from dividing the inspection voltage by the total resistance, and have a constant value in a predetermined normal range.

When the defect detection line BDL is in an abnormal state, a current flowing through the defect detection line BDL may have a value out of a predetermined normal range. For example, in this situation, the current flowing through the defect detection line BDL may have a large current value exceeding an upper limit of the predetermined normal range. For another example, the current flowing through the defect detection line BDL may have a current value less than a lower limit of the predetermined normal range.

The abnormality (or the abnormal state) of the defect detection line BDL may mean that the defect detection line BDL is shorted to a peripheral line or a peripheral electrode. Further, the abnormality (or the abnormal state) of the defect detection line BDL may mean that a crack has occurred in the defect detection line BDL.

The defect detection and protection circuit BDPC may be configured to detect the state of current flowing in the defect detection line BDL through the first defect detection circuit wiring unit BDL_CKT1 and cause a predefined warning process to be performed when an abnormal current state is detected. For example, the predefined warning process may be one or more process of displaying a warning message on the screen, outputting a warning message as a sound, and/or generating a warning sound.

For example, the defect detection and protection circuit BDPC may be configured in a separate circuitry from the power management integrated circuit PMIC and the controller 140. In another example, the power management integrated circuit PMIC or controller 140 may be a circuitry including the defect detection and protection circuit BDPC.

Figure 29:
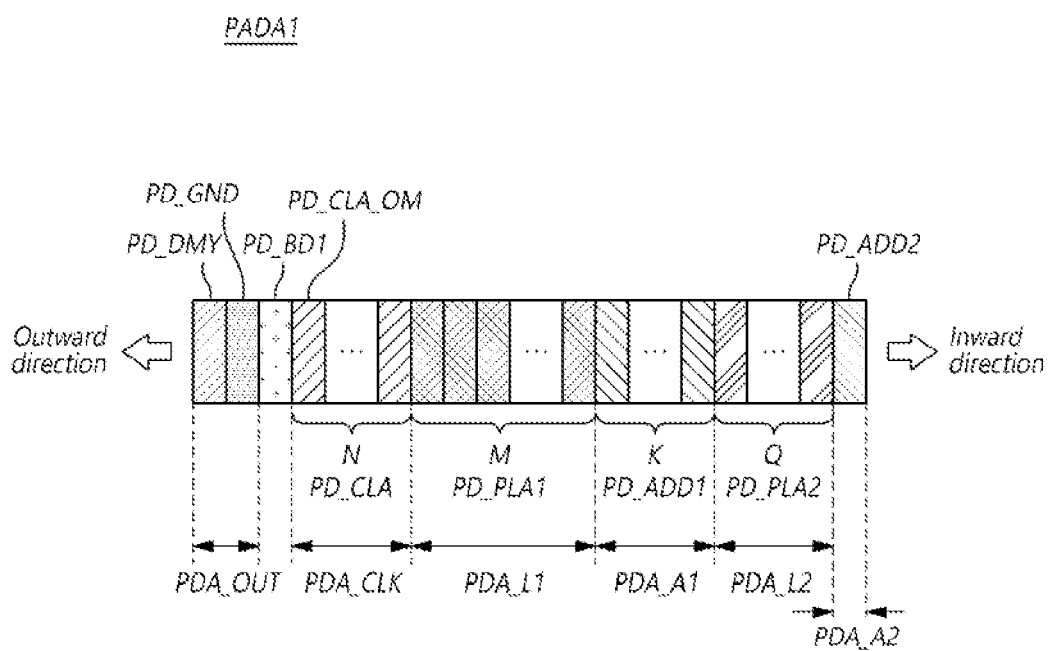
FIGS. 29 and 30 illustrate an example pad arrangement in the first pad area and an example corresponding configuration of first gate bezel area in an example where the display device or the display panel has a defect detection and protection function.
Figure 30:
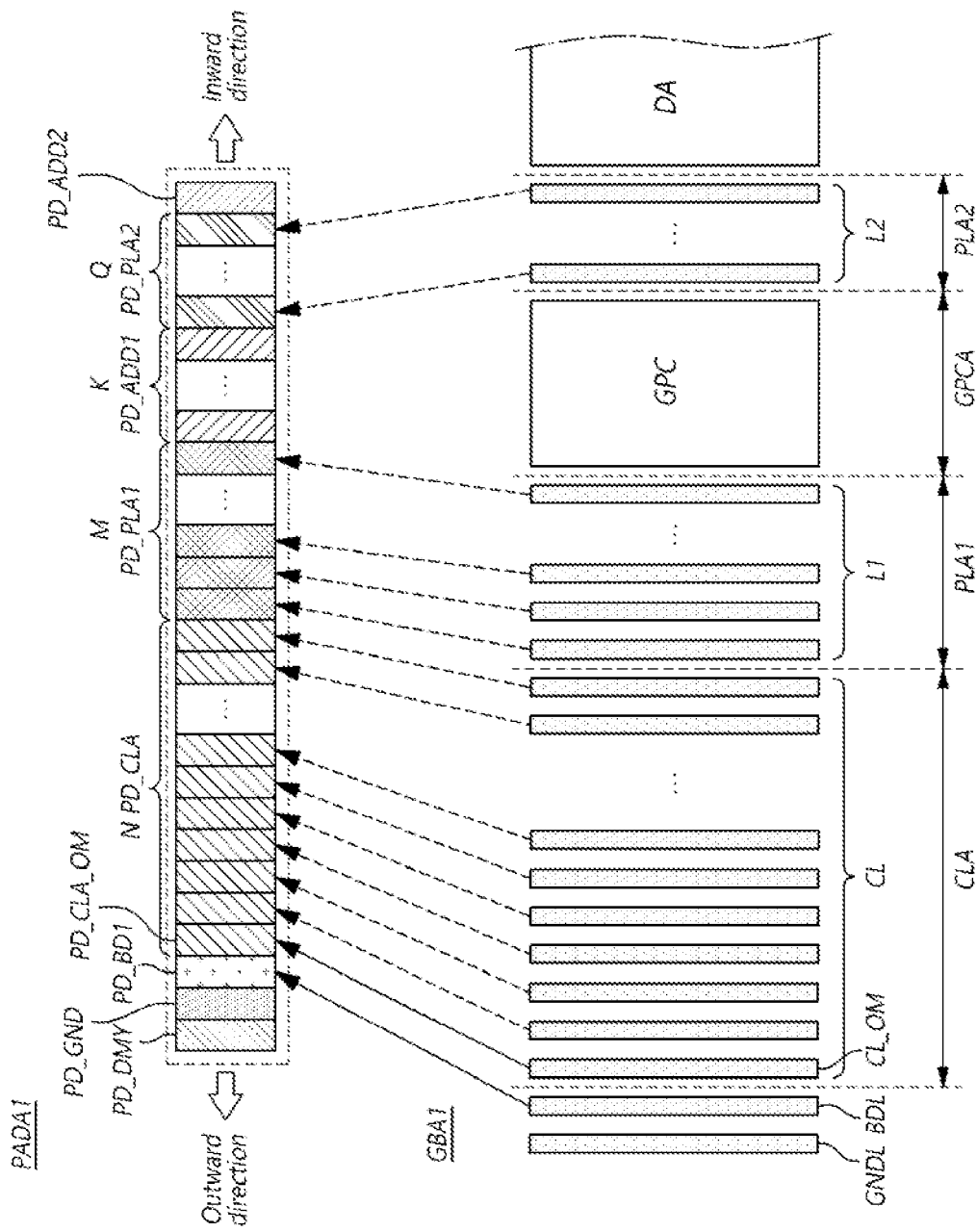

FIGS. 29 and 30 illustrate an example pad arrangement in the first pad area PADA1 and an example corresponding configuration of the first gate bezel area GBA1 in an example where the display device 100 or the display panel 110 has a defect detection and protection function. In this regard, discussions that follow will be provided with reference to FIG. 28, as well as FIGS. 29 and 30.

Referring to FIGS. 29 and 30, in one or more aspects, when the display device 100 according to aspects of the present disclosure has a defect detection and protection function, the non-display area NDA included in the substrate SUB may include the first gate bezel area GBA1 located on the first side of the display area DA, and the first pad area PADA1 adjacent to the first gate bezel area GBA1.

Referring to FIGS. 29 and 30, lines disposed in the first gate bezel area GBA1 and pads disposed in the first pad area PADA1 may be related to each other.

Referring to FIG. 30, the first gate bezel area GBA1 may include a gate driving panel circuit area GPCA, a clock signal line area CLA, a first power line area PLA1, and a second power line area PLA2.

A gate driving panel circuit GPC (e.g., the first type of gate driving panel circuit GPC or the second type of the gate driving panel circuit GPC discussed above) for outputting a corresponding gate signal to each of a plurality of gate lines GL may be disposed in the gate driving panel circuit area GPCA. For example, when the first type of gate driving panel circuit GPC is applied, the plurality of gate lines may include a scan signal lines SCL and a sensing signal lines SENL. In another example, when the second type of gate driving panel circuit GPC is applied, the plurality of gate lines may include one or more scan signal lines SCL.

A plurality of clock signal lines CL may be disposed in the clock signal line area CLA for delivering a plurality of clock signals to the gate driving panel circuit GPC. The clock signal line area CLA may be located further outwardly than the gate driving panel circuit area GPCA in the first gate bezel area GBA1.

A plurality of first lines L1 may be disposed in the first power line area PLAL. The plurality of first lines L1 may include at least one gate high voltage line HVL for delivering at least one gate high voltage to the gate driving panel circuit GPC.

A plurality of second lines L2 may be disposed in the second power line area PLA2. The plurality of second lines L2 may be disposed in the second power line area PLA2 included in the first gate bezel area GBA1, and include at least one gate low voltage line LVL for delivering at least one gate low voltage to the gate driving panel circuit GPC.

The clock signal line area CLA and the first power line area PLA1 may be located on a first side of the gate driving panel circuit area GPCA. The first power line area PLA1 may be located between the clock signal line area CLA and the gate driving panel circuit area GPCA.

The second power line area PLA2 may be located on a second opposing side of the gate driving panel circuit area GPCA. The second power line area PLA2 may be located between the gate driving panel circuit area GPCA and the display area DA.

In the first gate bezel area GBA1, the first power line area PLA1 and the second power line area PLA2 may be separated by the gate driving panel circuit area GPCA.

Referring to FIGS. 29 and 30, the defect detection line BDL disposed in the non-display area NDA of the substrate SUB may be located further outwardly than an outmost clock signal line CL_OM among the plurality of clock signal lines CL.

Referring to FIGS. 29 and 30, the first pad area PADA1 may include a clock pad area PDA_CLK, a first line pad area PDA_L1, and a second line pad area PDA_L2.

The N clock pads PD_CLA electrically connected to the plurality of clock signal lines CL may be disposed in the clock pad area PDA_CLK in the first pad area PADA1. Here, N may be a natural number of 2 or more.

The first defect detection pad PD_BD1 may be disposed in the first pad area PADA1. The first defect detection pad PD_BD1 may be disposed further outwardly than the outmost clock pad PD_CLA_OM among the plurality of clock pads PD_CLA.

The first defect detection pad PD_BD1 may be electrically connected to a first end of both ends of the defect detection line BDL.

Referring to FIGS. 29 and 30, a plurality of first line pads PD_PLA1 may be disposed in the first line pad area PDA_L1 in the first pad area PADA1. A plurality of second line pads PD_PLA2 may be disposed in the second line pad area PDA_L2 in the first pad area PADA1.

The plurality of first line pads PD_PLA1 may be disposed further inwardly than the plurality of clock pads PD_CLA in the first pad area PADA1, and be electrically connected to the plurality of first lines L1 disposed in the first power line area PLAL.

The plurality of second line pads PD_PLA2 may be disposed further inwardly than the plurality of first line pads PD_PLA1 in the first pad area PADA1, and be electrically connected to the plurality of second lines L2 disposed in the second power line area PLA2.

Referring to FIGS. 29 and 30, the first pad area PADA1 may further include a first additional pad area PDA_A1 between the first line pad area PDA_L1 and the second line pad area PDA_L2. For example, the K first additional pads PD_ADD1 may be disposed in the first additional pad area PDA_A1. Here, K may be a natural number of 1 or more.

Referring to FIGS. 29 and 30, the first pad area PADA1 may further include a second additional pad area PDA_A2 located further inwardly than the second line pad area PDA_L2. The at least one second additional pad PD_ADD2 may be disposed in the second additional pad area PDA_A2.

Referring to FIGS. 29 and 30, the first pad area PADA1 may further include an outer pad area PDA_OUT located further outwardly than the clock pad area PDA_CLK, and including at least one outer pad.

The outer pad disposed in the outer pad area PDA_OUT may include the ground pad PD_GND.

The outer pad disposed in the outer pad area PDA_OUT may further include the dummy pad PD_DMY disposed further outwardly than the ground pad PD_GND.

The first defect detection pad PD_BD1 may be disposed between the outer pad area PDA_OUT and the clock pad area PDA_CLK.

Referring to FIGS. 29 and 30, the display panel 110 may further include a ground line GNDL disposed in the first gate bezel area GBA1 and disposed further outwardly than the defect detection line BDL.

Figure 31:
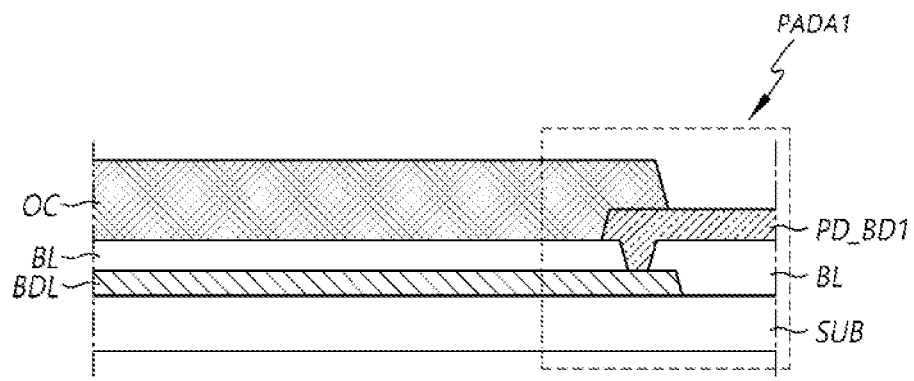
FIG. 31 is an example cross-sectional view of an area including a point at which a first defect detection pad and a defect detection line are connected in the display panel according to aspects of the present disclosure.

FIG. 31 is an example cross-sectional view of an area including a point at which the first defect detection pad PD_BD1 and the defect detection line BDL are connected in the display panel 110 according to aspects of the present disclosure.

Referring to FIG. 31, the defect detection line BDL may be disposed in a first metal layer on the substrate SUB, and the first defect detection pad PD_BD1 may be disposed in a second metal layer.

The first metal layer may be a metal layer between the substrate SUB and a buffer layer BL. For example, the first metal layer may be a metal layer in which a light shield disposed under the channel of a driving transistor DRT is disposed.

The second metal layer may be a metal layer on the buffer layer BL. For example, the second metal layer may be a metal layer in which a gate line GL such as a scan signal line SCL is disposed.

Referring to FIG. 31, the first defect detection pad PD_BD1 may be electrically connected to a first end of the defect detection line BDL through a contact hole in the buffer layer BL corresponding to an insulating layer on the first metal layer.

Referring to FIG. 31, an overcoat layer OC may be disposed such that the overcoat layer OC covers a portion of the first defect detection pad PD_BD1.

There may be a slight difference between a pad arrangement when the gate driving panel circuit GPC is configured with the first type and a pad arrangement when the gate driving panel circuit GPC is configured with the second type. Hereinafter, a pad arrangement when the gate driving panel circuit GPC is configured with the first type and a pad arrangement when the gate driving panel circuit GPC is configured with the second type will be described.

Figure 32:
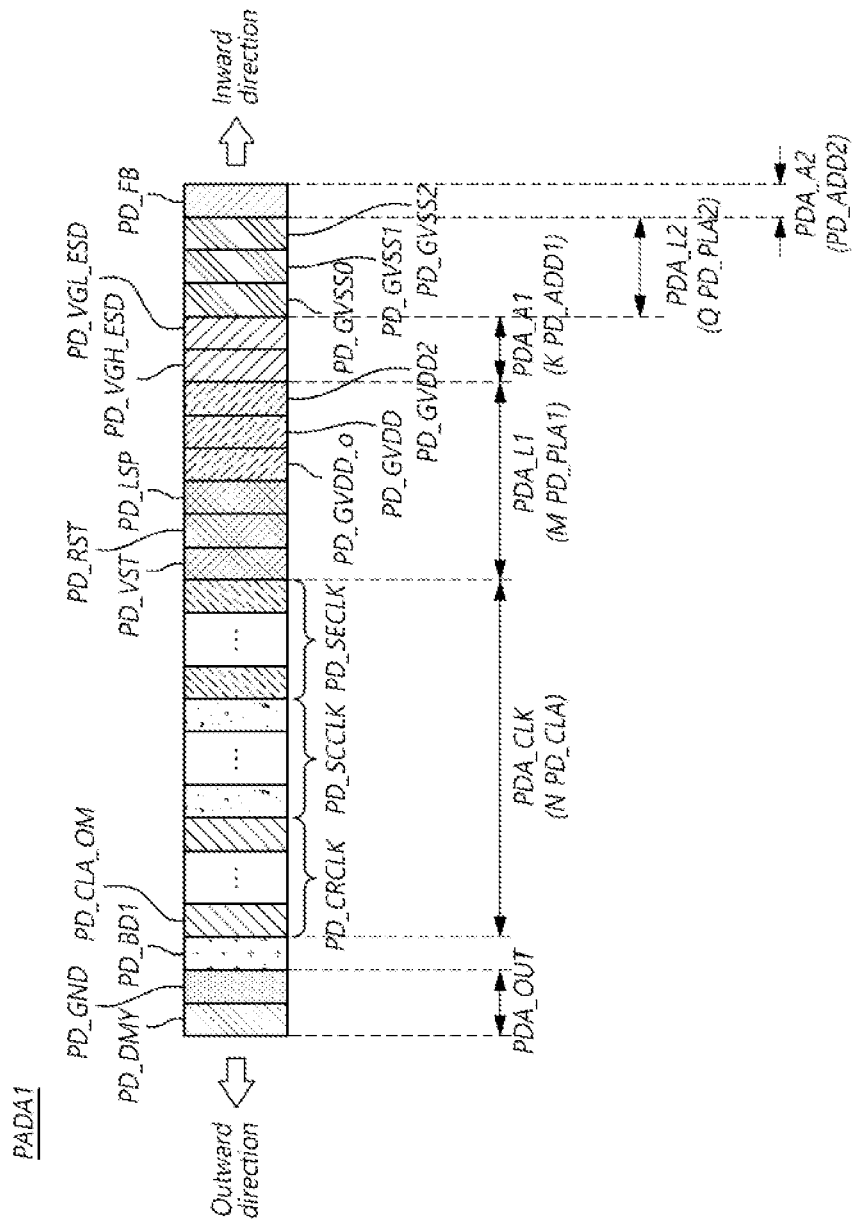
FIG. 32 illustrates an example pad arrangement located in the first pad area and including the first defect detection pad in the example where the first type of gate driving panel circuit is applied in the display device according to aspects of the present disclosure.

FIG. 32 illustrates an example pad arrangement located in the first pad area PADA1 and including the first defect detection pad PD_BD1 in the example where the first type of gate driving panel circuit GPC is applied in the display device 100 according to aspects of the present disclosure.

Referring to FIG. 32, the first pad area PADA1 may include an outer pad area PDA_OUT, a clock pad area PDA_CLK, a first line pad area PDA_L1, a first additional pad area PDA_A1, a second line pad area PDA_L2, and a second additional pad area PDA_A2.

The first pad area PADA1 may correspond to the first gate bezel area GBA1. Accordingly, the first gate bezel area GBA1 is briefly described again.

The first gate bezel area GBA1 may be an area for supplying various power sources or signals to the gate driving panel circuit area GPCA, and include the clock signal line area CLA, the first power line area PLA1, and the second power line area PLA2.

When the first type of gate driving panel circuit GPC is applied, the clock signal line area CLA in the first gate bezel area GBA1 may include a carry clock signal line area CRC, a scan clock signal line area SCC, and a sensing clock signal line area SEC.

The plurality of clock signal lines CL may include a plurality of carry clock signal lines CL_CRCLK disposed in the carry clock signal line area CRC, a plurality of scan clock signal lines CL_SCCLK disposed in the scan clock signal line area SCC. and a plurality of sensing clock signal lines CL_SECLK disposed in the sensing clock signal line area SEC.

The scan clock signal line area SCC may be located between the carry clock signal line area CRC and the sensing clock signal line area SEC, and the carry clock signal line area CRC may be located further away from the display area DA or the gate driving panel circuit area GPCA than the sensing clock signal line area SEC.

The clock pad area PDA_CLK in the first pad area PADA1 may correspond to the clock signal line area CLA in the first gate bezel area GBA1.

A plurality of clock pads PD_CLA disposed in the clock pad area PDA_CLK in the first pad area PADA1 may include a plurality of carry clock pads PD_CRCLK electrically connected to the plurality of carry clock signal lines CL_CRCLK, a plurality of scan clock pads PD_SCCLK electrically connected to the plurality of scan clock signal lines CL_SCCLK, and a plurality of sensing clock pads PD_SECLK electrically connected to the plurality of sensing clock signal lines CL_SECLK.

The plurality of scan clock pads PD_SCCLK may be located between the plurality of carry clock pads PD_CRCLK and the plurality of sensing clock pads PD_SECLK, and the plurality of carry clock pads PD_CRCLK may be located further outwardly than the plurality of sensing clock pads PD_SECLK.

Referring to FIG. 32, the first line pad area PDA_L1 in the first pad area PADA1 may correspond to the first power line area PLA1 in the first gate bezel area GBA1.

The plurality of first line pads PD_PLA1 disposed in the first line pad area PDA_L1 may be disposed further inwardly than the plurality of clock pads PD_CLA in the first pad area PADA1.

The plurality of first line pads PD_PLA1 may be electrically connected to the plurality of first lines L1 disposed in the first power line area PLA1 in the first gate bezel area GBA1.

The plurality of first lines L1 disposed in the first power line area PLA1 of the first gate bezel area GBA1 may include a first gate high voltage line HVL1 for delivering a first gate high voltage GVDD to the gate driving panel circuit GPC, a second gate high voltage line HVL2 for delivering a second gate high voltage GVDD_o to the gate driving panel circuit (GPC), and a third gate high voltage line HVL3 for delivering a third gate high voltage GVDD2 to the gate driving panel circuit GPC.

Accordingly, the plurality of first line pads PD_PLA1 may include first to third gate high voltage pads (PD_GVDD, PD_GVDD_o, and PD_GVDD2) electrically connected to the first to third gate high voltage lines (HVL1, HVL2, and HVL3).

The plurality of first lines L1 disposed in the first power line area PLA1 of the first gate bezel area GBA1 may further include a start signal line CSL1 for delivering a start signal VST to the gate driving panel circuit GPC, a reset signal line CSL4 for delivering a reset signal RST to the gate driving panel circuit GPC, and a line selection signal line CSL5 for delivering a line selection signal LSP to the gate driving panel circuit GPC.

Accordingly, the plurality of first line pads PD_PLA1 may include a start signal pad PD_VST electrically connected to the start signal line CSL1, a reset signal pad PD_RST electrically connected to the reset signal line CSL4, and a line selection signal pad PD_LSP electrically connected to the line selection signal line CSL5.

In the first power line area PLA1 of the first gate bezel area GBA1, the number or arrangement order of the first gate high voltage line HVL1, the second gate high voltage line HVL2, and the third gate high voltage line HVL3, the start signal line CSL1, the reset signal line CSL4, and the line selection signal line CSL5 may be variously changed according to design requirements.

In the first line pad area PDA_L1 of the first pad area PADA1, the number or arrangement order of the first gate high voltage pad PD_GVDD, the second gate high voltage pad PD_GVDD_o, and the third gate high voltage pad PD_GVDD2, the start signal pad PD_VST, the reset signal pad PD_RST, and the line selection signal pad PD_LSP may be variously changed according to design requirements.

Referring to FIG. 32, the second line pad area PDA_L2 in the first pad area PADA1 may correspond to the second power line area PLA2 in the first gate bezel area GBA1.

The plurality of second line pads PD_PLA2 disposed in the first line pad area PDA_L2 may be disposed further inwardly than the plurality of first line pads PD_PLA1 in the first pad area PADA1.

The plurality of second line pads PD_PLA2 may be electrically connected to the plurality of second lines L2 disposed in the second power line area PLA2 of the first gate bezel area GBA1.

The plurality of second lines L2 disposed in the second power line area PLA2 of the first gate bezel area GBA1 may include a first gate low voltage line LVL1, a second gate low voltage line LVL2, and a third gate low voltage line LVL3 in the first gate bezel area GBA1.

Accordingly, the plurality of second line pads PD_PLA2 may include first to third gate low voltage pads (PD_GVSS0, PD_GVSS1, and PD_GVSS2) electrically connected to the first to third gate low voltage lines (LVL1, LVL2, and LVL3).

In the second power line area PLA2 of the first gate bezel area GBA1, the number or arrangement order of the first gate low voltage line LVL1, the second gate low voltage line LVL2, and the third gate low voltage line LVL3 may be variously changed according to design requirements.

In the second line pad area PDA_L2 of the first pad area PADA1, the number or arrangement order of the first to third gate low voltage pads (PD_GVSS0, PD_GVSS1, and PD_GVSS2) may be variously changed according to design requirements.

Referring to FIG. 32, K first additional pads PD_ADD1 disposed in a first additional pad area PDA_A1 in the first pad area PADA1 may include an electrostatic discharge operation high voltage pad PD_VGH_ESD to which a high level voltage supplied to an electrostatic discharge component ESD is applied, and an electrostatic discharge operation low voltage pad PD_VGL_ESD to which a low level voltage supplied to the electrostatic discharge component ESD is applied.

Referring to FIG. 32, a second additional pad PD_ADD2 disposed in a second additional pad area PDA_A2 in the first pad area PADA1 may include a feedback pad PD_FB electrically connected to a feedback line disposed on the display panel 110.

Referring to FIG. 32, a dummy pad PD_DMY and a ground pad PD_GND may be disposed in an outer pad area PDA_OUT in the first pad area PADA1.

Referring to FIG. 32, in the first pad area PADA1, the first defect detection pad PD_BD1 may be located between the outer pad area PDA_OUT and the clock pad area PDA_CLK.

When the first type of gate driving panel circuit GPC is applied, an outmost clock pad PD_CLA_OM located directly next to the first defect detection pad PD_BD1 may be an outmost carry clock pad PD_CRCLK among the plurality of carry clock pads PD_CRCLK.

Figure 33:
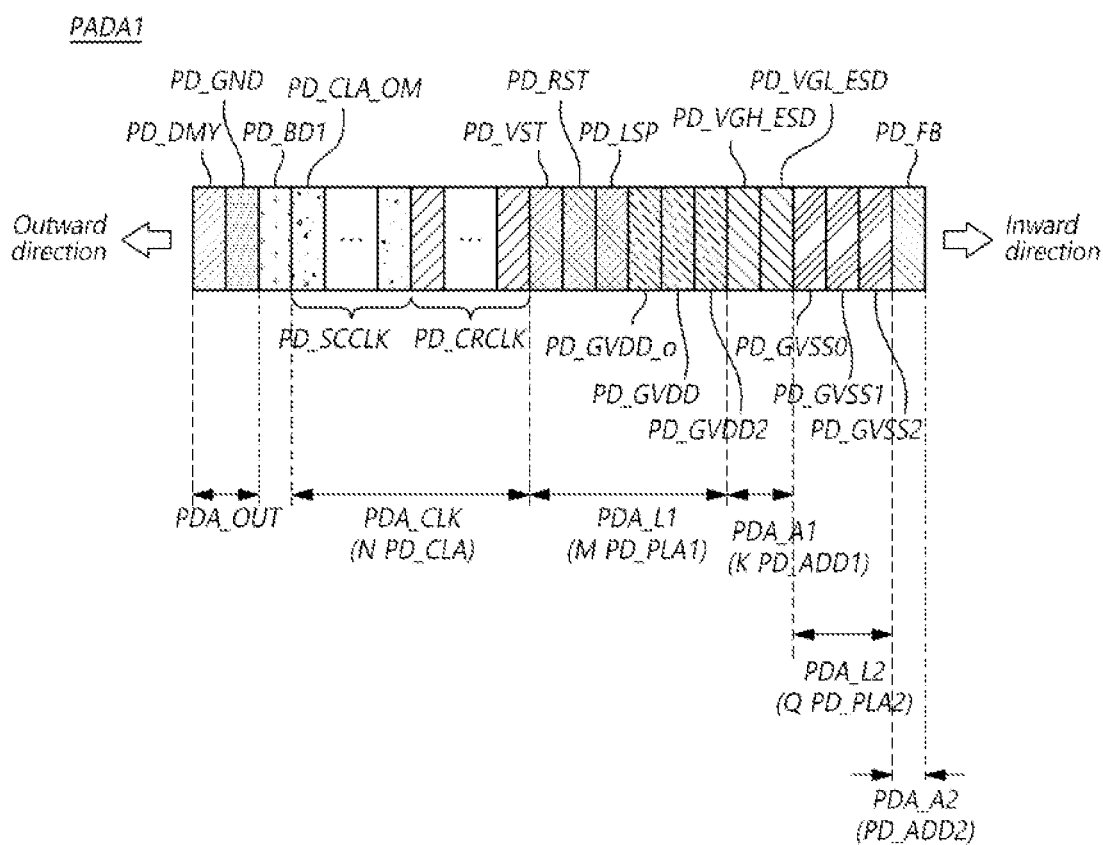
FIG. 33 illustrates an example pad arrangement located in the first pad area and including the first defect detection pad in the example where the second type of gate driving panel circuit is applied in the display device according to aspects of the present disclosure.

FIG. 33 illustrates an example pad arrangement located in the first pad area PADA1 and including the first defect detection pad PD_BD1 in the example where the second type of gate driving panel circuit GPC is applied in the display device 100 according to aspects of the present disclosure.

Referring to FIG. 33, when the gate driving panel circuit GPC is configured with the second type, the first pad area PADA1 may include an outer pad area PDA_OUT, a clock pad area PDA_CLK, a first line pad area PDA_L1, a first additional pad area PDA_A1, a second line pad area PDA_L2, and a second additional pad area PDA_A2.

The remaining areas (PDA_OUT, PDA_L1, PDA_A1, PDA_L2, and PDA_A2) except for the clock pad area PDA_CLK among the areas in the first pad area PADA1 of FIG. 33 may be the same as the remaining areas (PDA_OUT, PDA_L1, PDA_A1, PDA_L2, and PDA_A2) except for the clock pad area PDA_CLK among the areas in the first pad area PADA1 of FIG. 32. Considering such a similarity, discussions will provided by focusing on the clock pad area PDA_CLK in the first pad area PADA1.

When the second type of gate driving panel circuit GPC is applied, the clock signal line area CLA in the first gate bezel area GBA1 may include a scan clock signal line area SCC, and a carry clock signal line area CRC.

The plurality of clock signal lines CL may include a plurality of scan clock signal lines CL_SCCLK disposed in the scan clock signal line area SCC and a plurality of carry clock signal lines CL_CRCLK disposed in the carry clock signal line area CRC.

The carry clock signal line area CRC may be located closer to the gate driving panel circuit area GPCA than the scan clock signal line area SCC.

Referring to FIG. 33, the clock pad area PDA_CLK in the first pad area PADA1 may correspond to the clock signal line area CLA in the first gate bezel area GBA1. A plurality of clock pads PD_CLA disposed in the clock pad area PDA_CLK in the first pad area PADA1 may include a plurality of scan clock pads PD_SCCLK electrically connected to the plurality of scan clock signal lines CL_SCCLK and a plurality of carry clock pads PD_CRCLK electrically connected to the plurality of carry clock signal lines CL_CRCLK.

The plurality of scan clock pads PD_SCCLK may be located further outwardly than the plurality of carry clock pads PD_CRCLK.

When the second type of gate driving panel circuit GPC is applied, an outmost clock pad PD_CLA_OM located directly next to the first defect detection pad PD_BD1 may be an outmost scan clock pad PD_SCCLK among the plurality of scan clock pads PD_SCCLK.

The aspects of the touch display device 100 according to aspects of the present disclosure described above may be briefly discussed as follows.

According to the aspects described herein, a display device may be provided that includes a substrate, a gate driving panel circuit, a plurality of clock signal lines, a defect detection line, a plurality of clock pads, and a first defect detection pad.

The substrate may include a display area in which images may be displayed and a non-display area different from the display area. The non-display area may include a first gate bezel area located on a first side of the display area and a first pad area adjacent to the first gate bezel area.

The gate driving panel circuit may be disposed on the substrate, and for example, disposed in a gate driving panel circuit area included in the first gate bezel area.

The plurality of clock signal lines may be disposed on the substrate. For example, the plurality of clock signal lines may be disposed in a clock signal line area located further outwardly than the gate driving panel circuit area in the first gate bezel area, and may deliver a plurality of clock signals to the gate driving panel circuit.

The defect detection line may be disposed in the non-display area of the substrate, and for example, be disposed further outwardly than an outmost clock signal line among the plurality of clock signal lines.

The plurality of clock pads may be disposed in the first pad area of the substrate and may be electrically connected to the plurality of clock signal lines.

The first defect detection pad may be disposed in the first pad area of the substrate. For example, the first defect detection pad may be disposed further outwardly than an outmost clock pad among the plurality of clock pads, and be electrically connected to a first end of both ends of the defect detection line.

The defect detection line may be disposed in a first metal layer on a substrate SUB.

The first defect detection pad may be disposed in a second metal layer on the first metal layer. The first defect detection pad may be electrically connected to a first end of the defect detection line through a contact hole of an insulating layer on the first metal layer.

The display device may further include a source printed circuit board, a control printed circuit board, a connection cable for connecting the source printed circuit board to the control printed circuit board, a first circuit film for connecting the first pad area of the substrate to the source printed circuit board, a first source driver integrated circuit disposed on the first circuit film, a defect detection and protection circuit disposed on the control printed circuit board, and a first defect detection circuit wiring unit for electrically connecting the first defect detection pad in the first pad area to the defect detection and protection circuit.

The first defect detection circuit wiring unit may be disposed along the first circuit film, the source printed circuit board, the connection cable, and the control printed circuit board.

The defect detection and protection circuit may be configured to detect the state of current flowing in the defect detection line through the first defect detection circuit wiring unit and cause a predefined warning process to be performed when an abnormal current state is detected.

The non-display area may include a second gate bezel area located on a second side of the display area and a second opposing pad area adjacent to the second gate bezel area.

The display device may further include a second circuit film for connecting the second pad area of the substrate to the source printed circuit board or another source printed circuit board, a second source driver integrated circuit disposed on the second circuit film, and a second defect detection pad disposed in the second pad area of the substrate and electrically connected to a second end among both ends of the defect detection line.

The defect detection line may be disposed such that the defect detection line surrounds three sides except for one side among four sides of the display area, and may electrically interconnect a first defect detection pad and a second defect detection pad. The first defect detection pad and the second defect detection pad may be located in an outer edge on the one side of the display area.

The display device may further include a ground pad disposed in the first pad area and disposed further outwardly than the plurality of clock pads, and a dummy pad disposed in the first pad area and disposed further outwardly than the ground pad.

The display device may further include a ground line disposed in the first gate bezel area and disposed further outwardly than the defect detection line. For example, the ground line may not be electrically connected to the ground pad in the pad area.

The display device may further include a plurality of first lines disposed in a first power line area included in the first gate bezel area and a plurality of second lines disposed in a second power line area included in the first gate bezel area.

The plurality of first lines may include at least one gate high voltage line for delivering at least one gate high voltage to the gate driving panel circuit.

The plurality of second lines may be disposed in a second power line area included in the first gate bezel area, and include at least one gate low voltage line for delivering at least one gate low voltage to the gate driving panel circuit.

The clock signal line area and the first power line area may be located on a first side of the gate driving panel circuit area, the first power line area may be located between the clock signal line area and the gate driving panel circuit area, the second power line area may be located on a second opposing side of the gate driving panel circuit area, and the second power line area may be located between the gate driving panel circuit area and the display area.

In the first gate bezel area, the first power line area and the second power line area may be separated by the gate driving panel circuit area.

The display device may further include a plurality of first line pads disposed further inwardly than the plurality of clock pads in the first pad area, and electrically connected to the plurality of first lines disposed in the first power line area.

The display device may further include a plurality of second line pads disposed further inwardly than the plurality of first line pads in the first pad area, and electrically connected to the plurality of second lines disposed in the second power line area.

The plurality of first line pads may include at least one gate high voltage pad electrically connected to the at least one gate high voltage line.

The plurality of second line pads may include at least one gate low voltage pad electrically connected to the at least one gate low voltage line.

The plurality of first lines may further include a start signal line for delivering a start signal to the gate driving panel circuit, a reset signal line for delivering a reset signal to the gate driving panel circuit, and a line selection signal line for delivering a line selection signal to the gate driving panel circuit.

The plurality of first line pads may further include a start signal pad electrically connected to the start signal line, a reset signal pad electrically connected to the reset signal line, and a line selection signal pad electrically connected to the line selection signal line.

A plurality of gate high voltage lines may be disposed in the first power line area, and a plurality of gate low voltage lines may be disposed in the second power line area. Each of all or one or more of the plurality of clock signal lines may be a multilayer line. Each of one or more of the plurality of gate high voltage lines may be a single-layer line, and each of the remaining gate high voltage lines may be a multilayer line. Each of the plurality of gate low voltage lines may be a multilayer line.

The display device may further include an overcoat layer disposed in the non-display area and disposed on the gate driving panel circuit, and at least one trench may be formed in the overcoat layer in the gate bezel area.

The trench may be formed in at least one of a first area, in which the overcoat layer is removed, between the gate driving panel circuit area and the second power line area and a second area, in which the overcoat layer OC is removed, between the second power line area and the display area.

The display device may further include a bank extending from the display area to the non-display area, an emission layer extending from the display area to the non-display area, a cathode electrode extending from the display area to the non-display area and located on the emission layer, and an electrostatic discharge component disposed in an outer corner area of the non-display area.

The electrostatic discharge component may not overlap with the emission layer, a portion of the electrostatic discharge component may overlap with the cathode electrode, and the electrostatic discharge component may overlap with the bank.

The plurality of clock signal lines may be disposed along one or more outer corners of the substrate, all or one or more of the plurality of clock signal lines do not overlap with the electrostatic discharge component, and all or one or more of the plurality of clock signal lines may overlap with the cathode electrode.

The clock signal line area in the first gate bezel area may include a carry clock signal line area, a scan clock signal line area, and a sensing clock signal line area.

The plurality of clock signal lines may include a plurality of carry clock signal lines disposed in the carry clock signal line area, a plurality of scan clock signal lines disposed in the scan clock signal line area, and a plurality of sensing clock signal lines disposed in the sensing clock signal line area.

The scan clock signal line area may be located between the carry clock signal line area and the sensing clock signal line area, and the carry clock signal line area may be located further away from the display area or the gate driving panel circuit area than the sensing clock signal line area.

The plurality of clock pads may include a plurality of carry clock pads electrically connected to the plurality of carry clock signal lines, a plurality of scan clock pads electrically connected to the plurality of scan clock signal lines, and a plurality of sensing clock pads electrically connected to the plurality of sensing clock signal lines.

The plurality of scan clock pads may be located between the plurality of carry clock pads and the plurality of sensing clock pads, and the plurality of carry clock pads may be located further outwardly than the plurality of sensing clock pads.

The clock signal line area in the first gate bezel area may include a carry clock signal line area and a scan clock signal line area.

The plurality of clock signal lines may include a plurality of scan clock signal lines disposed in the scan clock signal line area and a plurality of carry clock signal lines disposed in the carry clock signal line area. The carry clock signal line area may be located closer to the gate driving panel circuit area than the scan clock signal line area.

The plurality of clock pads disposed in the clock pad area may include a plurality of scan clock pads electrically connected to the plurality of scan clock signal lines and a plurality of carry clock pads electrically connected to the plurality of carry clock signal lines. The plurality of scan clock pads may be located further outwardly than the plurality of carry clock pads.

According to the aspects described herein, a display panel may be provided that includes a substrate including a display area in which images may be displayed, and a non-display area that is different from the display area and includes a first gate bezel area located on a first side of the display area and a first pad area adjacent to the first gate bezel area, a gate driving panel circuit disposed in a gate driving panel circuit area included in the first gate bezel area, a defect detection line located further outwardly than the gate driving panel circuit area in the first gate bezel area, and a first defect detection pad disposed in the first pad area and electrically connected to a first end of both ends of the defect detection line.

According to the aspects described herein, a display panel may be provided in which a gate driving panel circuit is disposed using the GIP technique, and a display device including the display panel may be provided.

According to the aspects described herein, a display panel and a display device may be provided to detect a defect accident that may occur in the display panel and prevent such a defect accident in the display panel.

According to the aspects described herein, a display panel and a display device may be provided that have a pad structure including a defect detection pad and configured to be suitable for a structure in which a gate driving panel circuit is disposed on a substrate of the display panel.

According to the aspects described herein, a display panel and a display device may be provided that have a wiring structure for stably supplying various types of signals or power to a gate driving panel circuit disposed in the display panel.

According to the aspects described herein, since the display panel and the display device are designed to include a gate driving panel circuit disposed on a substrate of the display panel and formed during the manufacturing process of the display panel or the display device, advantage of enabling process optimization of the display panel and the display device may be provided.

The aspects of the present disclosure described above have been described for illustrative purposes and those skilled in the art will appreciate that various modifications, additions and substitutions are possible, without departing from the scope and spirit of the disclosure as disclosed in the accompanying claims. Although the exemplary aspects have been described for illustrative purposes, a person skilled in the art will appreciate that various modifications and applications are possible without departing from the essential characteristics of the present disclosure. For example, the specific components of the exemplary aspects may be variously modified.

What is claimed is:

1. A display device comprising:
   a substrate comprising a display area in which images are displayed, and a non-display area that is different from the display area and comprises a first gate bezel area located on a first side of the display area and a first pad area adjacent to the first gate bezel area;
   a gate driving panel circuit disposed in a gate driving panel circuit area included in the first gate bezel area;
   a defect detection line disposed in the non-display area and configured to identify a line defect within the display device; and
   a first defect detection pad disposed in the first pad area and electrically connected to a first end among both ends of the defect detection line.

2. The display device of claim 1, wherein the defect detection line is disposed in a first metal layer on the substrate, and
   wherein the first defect detection pad is disposed in a second metal layer on the substrate, and is electrically connected to the first end of the defect detection line through a contact hole of an insulating layer on the first metal layer.

3. The display device of claim 1, further comprising:
   a source printed circuit board;
   a control printed circuit board;
   a connection cable for connecting the source printed circuit board to the control printed circuit board;
   a first circuit film for connecting the first pad area of the substrate to the source printed circuit board;
   a first source driver integrated circuit disposed on the first circuit film;
   a defect detection and protection circuit disposed on the control printed circuit board, and
   a first defect detection circuit for electrically connecting the first defect detection pad in the first pad area to the defect detection and protection circuit,
   wherein the first defect detection circuit is disposed along the first circuit film, the source printed circuit board, the connection cable, and the control printed circuit board.

4. The display device of claim 3, wherein the defect detection and protection circuit is configured to detect current flowing in the defect detection line through the first defect detection circuit and initiate a warning process when an abnormal current is detected.

5. The display device of claim 3, wherein the non-display area further comprises a second gate bezel area located on a second side of the display area and a second pad area adjacent to the second gate bezel area,
   wherein the display device further comprises:
      a second circuit film for connecting the second pad area of the substrate to the source printed circuit board or another source printed circuit board;
      a second source driver integrated circuit disposed on the second circuit film; and
      a second defect detection pad disposed in the second pad area of the substrate and electrically connected to a second end among the both ends of the defect detection line, and
   wherein the defect detection line is disposed such that the defect detection line surrounds three sides except for one side among four sides of the display area, and electrically interconnects the first defect detection pad and the second defect detection pad, the first defect detection pad and the second defect detection pad being located in an outer edge on one side of the display area.

6. The display device of claim 1, further comprising:
   a ground pad disposed in the first pad area and disposed further outwardly than a plurality of clock pads; and
   a dummy pad disposed in the first pad area and disposed further outwardly than the ground pad.

7. The display device of claim 1, further comprising: a ground line disposed in the first gate bezel area and disposed further outwardly than the defect detection line.

8. The display device of claim 1, further comprising:
   a plurality of first lines disposed in a first power line area included in the first gate bezel area; and
   a plurality of second lines disposed in a second power line area included in the first gate bezel area,
   wherein the plurality of first lines comprises at least one gate high voltage line for delivering at least one gate high voltage to the gate driving panel circuit, and
   wherein the plurality of second lines comprises at least one gate low voltage line for delivering at least one gate low voltage to the gate driving panel circuit.

9. The display device of claim 8, further comprising:
   a plurality of clock signal lines disposed in a clock signal line area located further outwardly than the gate driving panel circuit area, and delivering a plurality of clock signals to the gate driving panel circuit; and
   a plurality of clock pads disposed in the first pad area and electrically connected to the plurality of clock signal lines, wherein the clock signal line area and the first power line area are located on the first side of the gate driving panel circuit area, and
   wherein the first power line area is located between the clock signal line area and the gate driving panel circuit area, the second power line area is located on a second side of the gate driving panel circuit area opposing to the first side, and the second power line area is located between the gate driving panel circuit area and the display area.

10. The display device of claim 9, wherein in the first gate bezel area, the first power line area and the second power line area are separated by the gate driving panel circuit area.

11. The display device of claim 9, further comprising:
    a plurality of first line pads disposed further inwardly than the plurality of clock pads in the first pad area, and electrically connected to the plurality of first lines disposed in the first power line area; and
    a plurality of second line pads disposed further inwardly than the plurality of first line pads in the first pad area, and electrically connected to the plurality of second lines disposed in the second power line area,
    wherein the plurality of first line pads comprises at least one gate high voltage pad electrically connected to the at least one gate high voltage line, and the plurality of second line pads comprises at least one gate low voltage pad electrically connected to the at least one gate low voltage line.

12. The display device of claim 11, wherein the plurality of first lines further comprise:
    a start signal line for delivering a start signal to the gate driving panel circuit;
    a reset signal line for delivering a reset signal to the gate driving panel circuit; and
    a line selection signal line for delivering a line selection signal to the gate driving panel circuit, and wherein the plurality of first line pads further comprise:
a start signal pad electrically connected to the start signal line;
a reset signal pad electrically connected to the reset signal line; and
a line selection signal pad electrically connected to the line selection signal line.

13. The display device of claim 8, wherein a plurality of gate high voltage lines are disposed in the first power line area, and a plurality of gate low voltage lines are disposed in the second power line area, and
wherein:
one or more of plurality of clock signal lines includes a multilayer line;
one or more of the plurality of gate high voltage lines includes a single-layer line, and each of the remaining one or more gate high voltage lines includes a multilayer line; and
each gate low voltage line of the plurality of gate low voltage lines includes a multilayer line.

14. The display device of claim 8, further comprising:
an overcoat layer disposed in the non-display area and disposed on the gate driving panel circuit; and
at least one trench formed in the overcoat layer in first gate bezel area.

15. The display device of claim 1, further comprising:
a bank extending from the display area to the non-display area;
an emission layer extending from the display area to the non-display area;
a cathode electrode extending from the display area to the non-display area and located on the emission layer; and
an electrostatic discharge component disposed in an outer corner area of the non-display area,
wherein:
the electrostatic discharge component does not overlap with the emission layer;
a portion of the electrostatic discharge component overlaps with the cathode electrode; and
the electrostatic discharge component overlaps with the bank.

16. The display device of claim 15, wherein:
a plurality of clock signal lines are disposed along one or more outer corners of the substrate;
one or more of the plurality of clock signal lines do not overlap with the electrostatic discharge component; and
one or more of the plurality of clock signal lines overlap with the cathode electrode.

17. The display device of claim 1, wherein a clock signal line area in the first gate bezel area comprises a plurality of clock signal lines, a carry clock signal line area, a scan clock signal line area, and a sensing clock signal line area,
wherein the plurality of clock signal lines comprise:
a plurality of carry clock signal lines disposed in the carry clock signal line area;
a plurality of scan clock signal lines disposed in the scan clock signal line area, and
a plurality of sensing clock signal lines disposed in the sensing clock signal line area, and wherein the scan clock signal line area is located between the carry clock signal line area and the sensing clock signal line area, and the carry clock signal line area is located further away from the display area or the gate driving panel circuit area than the sensing clock signal line area.

18. The display device of claim 17, wherein the clock signal line area includes a plurality of clock pads, and the plurality of clock pads comprise:
a plurality of carry clock pads electrically connected to the plurality of carry clock signal lines;
a plurality of scan clock pads electrically connected to the plurality of scan clock signal lines; and
a plurality of sensing clock pads electrically connected to the plurality of sensing clock signal lines, and
wherein the plurality of scan clock pads is located between the plurality of carry clock pads and the plurality of sensing clock pads, and the plurality of carry clock pads is located further outwardly than the plurality of sensing clock pads.

19. The display device of claim 1, wherein a clock signal line area in the first gate bezel area comprises a plurality of clock signal lines, a carry clock signal line area, and a scan clock signal line area,
wherein the plurality of clock signal lines comprise:
a plurality of scan clock signal lines disposed in the scan clock signal line area; and
a plurality of carry clock signal lines disposed in the carry clock signal line area, and
wherein the carry clock signal line area is located closer to the gate driving panel circuit area than the scan clock signal line area.

20. The display device of claim 19, further comprising a plurality of clock pads, wherein the plurality of clock pads comprise:
a plurality of scan clock pads electrically connected to the plurality of scan clock signal lines; and
a plurality of carry clock pads electrically connected to the plurality of carry clock signal lines, and
wherein the plurality of scan clock pads are located further outwardly than the plurality of carry clock pads.

21. The display device of claim 1, wherein the defect detection line is configured to border at least two sides of the display area and detect an electrical short or an electrical discontinuity along the at least two sides of the display area.

22. A display panel comprising:
a substrate comprising a display area in which images are displayed, and a non-display area that is different from the display area and comprises a first gate bezel area located on a first side of the display area and a first pad area adjacent to the first gate bezel area;
a gate driving panel circuit disposed in a gate driving panel circuit area included in the first gate bezel area;
a defect detection line located outside of the gate driving panel circuit area in the first gate bezel area with respect to a center point of the substrated; and
a first defect detection pad disposed in the first pad area and electrically connected to a first end among both ends of the defect detection line.

* * * * *